United States Patent
Fukushima et al.

(10) Patent No.: US 8,895,675 B2
(45) Date of Patent: Nov. 25, 2014

(54) BLOCK COPOLYMER

(75) Inventors: Daisuke Fukushima, Tsukuba (JP); Hideyuki Higashimura, Tsukuba (JP); Akihiko Okada, Tsukuba (JP); Kazuei Ohuchi, Tsukuba (JP); Makoto Anryu, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 970 days.

(21) Appl. No.: 12/159,143

(22) PCT Filed: Dec. 25, 2006

(86) PCT No.: PCT/JP2006/326325
§ 371 (c)(1),
(2), (4) Date: Jun. 25, 2008

(87) PCT Pub. No.: WO2007/074920
PCT Pub. Date: Jul. 5, 2007

(65) Prior Publication Data
US 2010/0219399 A1    Sep. 2, 2010

(30) Foreign Application Priority Data
Dec. 28, 2005 (JP) .................................. 2005-377034

(51) Int. Cl.
    *C08G 79/02*     (2006.01)
    (Continued)

(52) U.S. Cl.
    CPC ................ *C08L 53/00* (2013.01); *C08G 61/00* (2013.01); *C08G 61/10* (2013.01);
    (Continued)

(58) Field of Classification Search
    USPC ...................... 525/389, 88; 524/610; 427/256; 257/E51.027
    See application file for complete search history.

(56) References Cited

U.S. PATENT DOCUMENTS

| 6,355,773 | B1 | 3/2002 | Weinfurtner et al. |
| 2002/0173617 | A1 | 11/2002 | Yasuda et al. |

(Continued)

FOREIGN PATENT DOCUMENTS

| CN | 1599964 A | 3/2005 |
| GB | 2448098 A | 1/2008 |

(Continued)

OTHER PUBLICATIONS

Shizuo Tokito et al., "Polymer EL Element of Polyfluorene Derivative," Monthly Display, Sep. 2000, pp. 26-32.

(Continued)

*Primary Examiner* — Duc Truong
(74) *Attorney, Agent, or Firm* — Sughrue Mion, PLLC

(57) ABSTRACT

A block copolymer comprising two or more of blocks of the following formula (1), wherein at least two of a plurality of m's present in the copolymer represent a number of 5 or more, Ar's in adjacent two blocks in the copolymer are mutually different, and the copolymer has two Ar's when composed of 2 blocks of the formula (1), has two or more Ar's when composed of 3 blocks of the formula (1) and has four or more Ar's when composed of 4 or more blocks of the formula (1):

$$-(Ar)_m- \qquad (1)$$

(in the formula (1), Ar represents a conjugative divalent group and represents the same divalent group in an identical block, and m represents a number of 1 or more showing the number average polymerization degree of Ar present in one block).

37 Claims, 1 Drawing Sheet

(51) Int. Cl.
  *C08G 79/08* (2006.01)
  *C08L 53/00* (2006.01)
  *C08G 61/00* (2006.01)
  *C08G 61/10* (2006.01)
  *C08G 61/12* (2006.01)
  *C09K 11/06* (2006.01)
  *H01L 51/00* (2006.01)
  *H05B 33/14* (2006.01)
  *C08L 85/02* (2006.01)
  *C08L 85/04* (2006.01)
  *C08F 283/00* (2006.01)

(52) U.S. Cl.
  CPC ............ *C08G 61/12* (2013.01); *C08G 61/124* (2013.01); *C08G 61/125* (2013.01); *C08G 61/126* (2013.01); *C09K 11/06* (2013.01); *H01L 51/0035* (2013.01); *H01L 51/0036* (2013.01); *H01L 51/0039* (2013.01); *H01L 51/0043* (2013.01); *H05B 33/14* (2013.01); *C09K 2211/14* (2013.01); *H01L 51/0026* (2013.01); *H01L 51/0037* (2013.01); *H01L 2251/308* (2013.01)
  USPC ............ 525/389; 525/88; 524/610; 427/256; 257/E51.027

(56) References Cited

U.S. PATENT DOCUMENTS

| | | |
|---|---|---|
| 2003/0045642 A1 | 3/2003 | Wu et al. |
| 2004/0100804 A1 | 5/2004 | Noguchi et al. |
| 2005/0165214 A1 | 7/2005 | Nobuta et al. |
| 2006/0229427 A1 | 10/2006 | Becker et al. |
| 2009/0223374 A1 | 9/2009 | Morin et al. |
| 2010/0133476 A1 | 6/2010 | Tanaka |

FOREIGN PATENT DOCUMENTS

| | | |
|---|---|---|
| JP | 5-158091 A | 6/1993 |
| JP | 2001-151868 A | 6/2001 |
| JP | 2005-209576 A | 8/2005 |
| WO | 94/15368 A1 | 7/1994 |
| WO | 01/81294 A1 | 11/2001 |
| WO | 02/088223 A1 | 11/2002 |
| WO | 03/007395 A1 | 1/2003 |

OTHER PUBLICATIONS

M.C. Iovu et al., "Experimental Evidence for the Quasi-"Living" Nature of the Grignard . . . Poly(3-alkylthiophenes)," Macromolecules, vol. 38, 2005, pp. 8649-8656.

X. Linda Chen and Samson A. Jenekhe, "Block Conjugated Copolymers: Toward Quantum-Well Nanostructures . . . Optical Phenomena," Macromolecules, vol. 29, 1996, pp. 6189-6192.

Chinese Office Action in Chinese Patent Application No. 200680053458.7 dated Oct. 8, 2010.

Chinese Office Action in Chinese Patent Application No. 200680053458.7 dated Aug. 29, 2011.

Chinese Office Action in Chinese Patent Application No. 200680053458.7 dated May 4, 2012.

Great Britain Examination Report to Great Britain Patent Application No. GB0813590.7 dated Sep. 29, 2010.

Office Action dated Sep. 4, 2012 in Taiwanese Patent Application No. 095148699 with English translation.

Notice of Reasons for Rejection mailed Nov. 13, 2012 in Japanese Patent Application No. 2006-351845 with English translation.

Notice of Reasons for Rejection mailed Feb. 5, 2013 in Japanese Patent Application No. 2006-351845 with English translation.

Office Action issued Apr. 15, 2013 in Korean Patent Application No. 10-2008-7018433 to Sumitomo Chemical Co., Ltd., with English translation.

Reexamination Notification issued Jul. 3, 2013 in corresponding Chinese Patent Application No. 200680053458.7 with English translation.

BLOCK COPOLYMER

TECHNICAL FIELD

The present invention relates to a block copolymer.

BACKGROUND ART

High molecular weight light emitting materials and charge transporting materials soluble in solvents are capable of forming an organic layer of a light emitting device by an application method, thus, are variously investigated. As polymer compounds which can be used as light emitting materials or charge transporting materials in electron devices such as polymer light emitting devices (polymer LED) and the like, for example, random copolymers such as a kind of polyfluorenes are known (Japanese Patent Application Laid-Open (JP-A) No. 2001-151868, Monthly Display, 2000, November, pp. 26 to 32).

However, device performances of devices using the above-described random copolymers as light emitting materials, charge transporting materials, and the like are not necessarily of satisfactory level yet for practical purposes.

DISCLOSURE OF THE INVENTION

An object of the present invention is to provide a copolymer which can give an electron device excellent in device performances when used as a material of the electron device.

That is, the present invention provides a block copolymer comprising or consisting essentially of two or more of blocks of the following formula (1), wherein at least two of a plurality of m's present in the copolymer represent a number of 5 or more, Ar's in adjacent two blocks in the copolymer are mutually different, and the copolymer has two Ar's when composed of 2 blocks of the formula (1), has two or more Arts when composed of 3 blocks of the formula (1) and has four or more Ar's when composed of 4 or more blocks of the formula (1):

(1)

(in the formula (1), Ar represents a conjugative divalent group and represents the same divalent group in an identical block, and m represents a number of 1 or more showing the number average polymerization degree of Ar present in one block).

MODE FOR CARRYING OUT THE INVENTION

Figure 1:
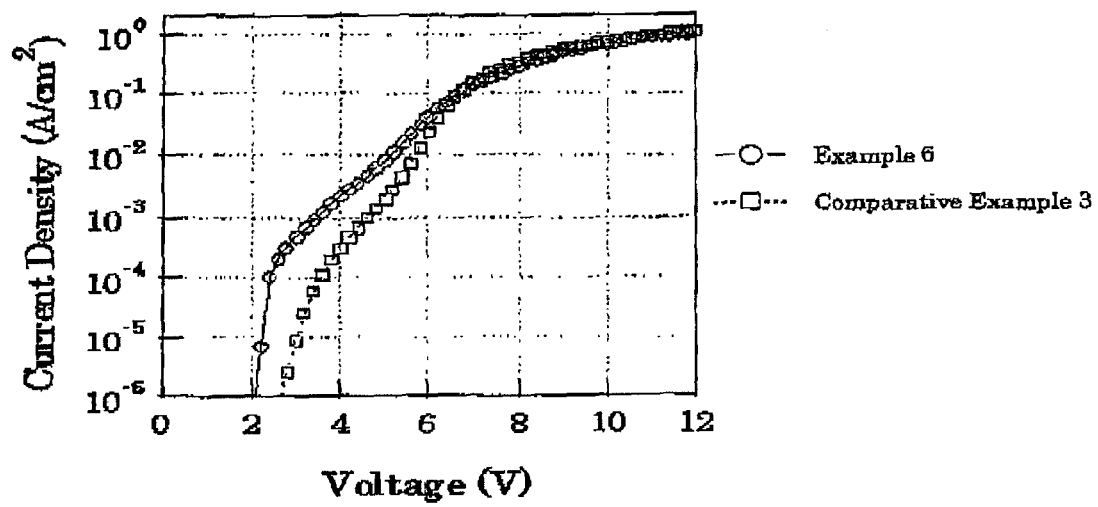
FIG. 1 shows voltage-current properties of a copolymer in Example 6 of the present invention and a copolymer in Comparative Example 3 in respective devices.

The block copolymer of the present invention comprises two or more of blocks of the above-described formula (1).

In the formula (1), Ar's represent each independently a conjugative divalent group. Ar represents a constitutional unit in one block.

The conjugative divalent group is a divalent group in which electrons of bonding in the molecule are delocalized, and specifically preferable are groups of the following formula (2):

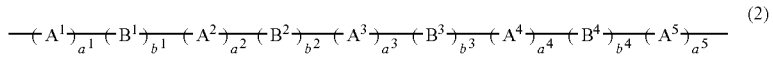
(2)

(in the formula (2), $A^1$, $A^2$, $A^3$, $A^4$ and $A^5$ represent each independently an optionally substituted arylene group or divalent heterocyclic group. $B^1$, $B^2$, $B^3$ and $B^4$ represent each independently $-BR^1-$, $-NR^2-$, $-SiR^3R^4-$, $-PR^5-$, $-C\equiv C-$, $-CR^b=N-$ or an optionally substituted vinylene group. $R^1$, $R^2$, $R^3$, $R^4$, $R^5$ and $R^b$ represent each independently a hydrogen atom or substituent. $a^1$, $a^2$, $a^3$, $a^4$ and $a^5$ represent each independently an integer of 0 to 3, satisfying $1=a^1+a^2+a^3+a^4+a^5=15$. $b^1$, $b^2$, $b^3$ and $b^4$ represent each independently 0 or 1).

In the formula (2), $A^1$, $A^2$, $A^3$ and $A^4$ represent each independently an optionally substituted arylene group or divalent heterocyclic group.

Here, the arylene group is a group generated by removal of two hydrogen atoms connected to a ring of an aromatic hydrocarbon. The arylene group has a carbon number of usually about 6 to 60, preferably 6 to 48, more preferably 6 to 30, further preferably 6 to 25, and particularly preferably 6 to 20. This carbon number does not include the carbon number of the substituent.

Specific examples of the arylene group include those of the following formulae (A-1) to (A-49), and preferable are arylene groups of the formulae (A-1) to (A-12) and (A-19) to (A-49), more preferable are arylene groups of the formulae (A-1) to (A-4) and (A-19) to (A-49), still preferable are arylene groups of the formulae (A-1) to (A-4) and (A-22) to (A-49), further preferable are arylene groups of the formulae (A-1) to (A-3) and (A-22) to (A-30), further still preferable are arylene groups of the formulae (A-1) to (A-3) and (A-22), and particularly preferable are arylene groups of the formulae (A-1) and (A-22). In the following descriptions, connecting bonds in aromatic hydrocarbon rings can take any position.

(A-1)

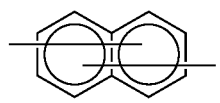
(A-2)

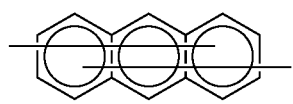
(A-3)

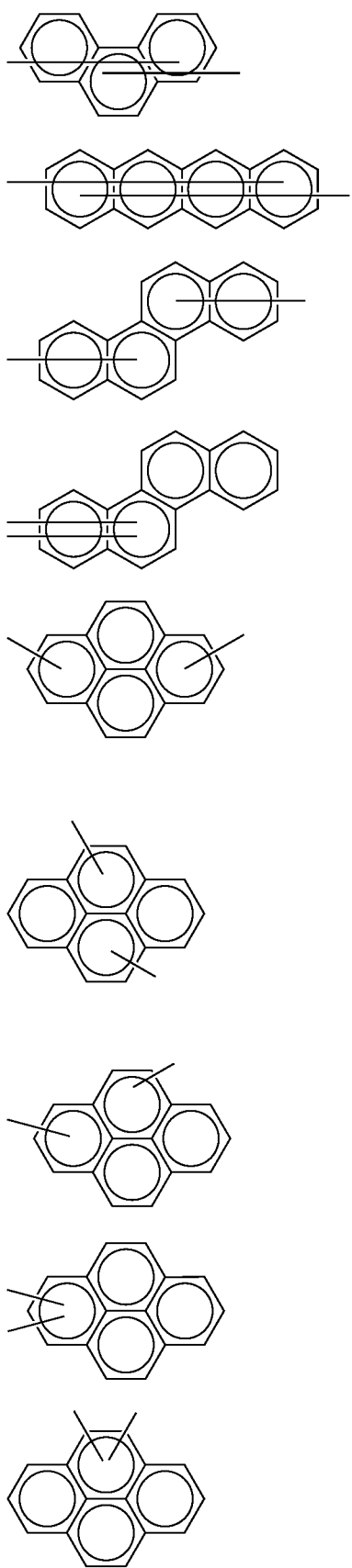
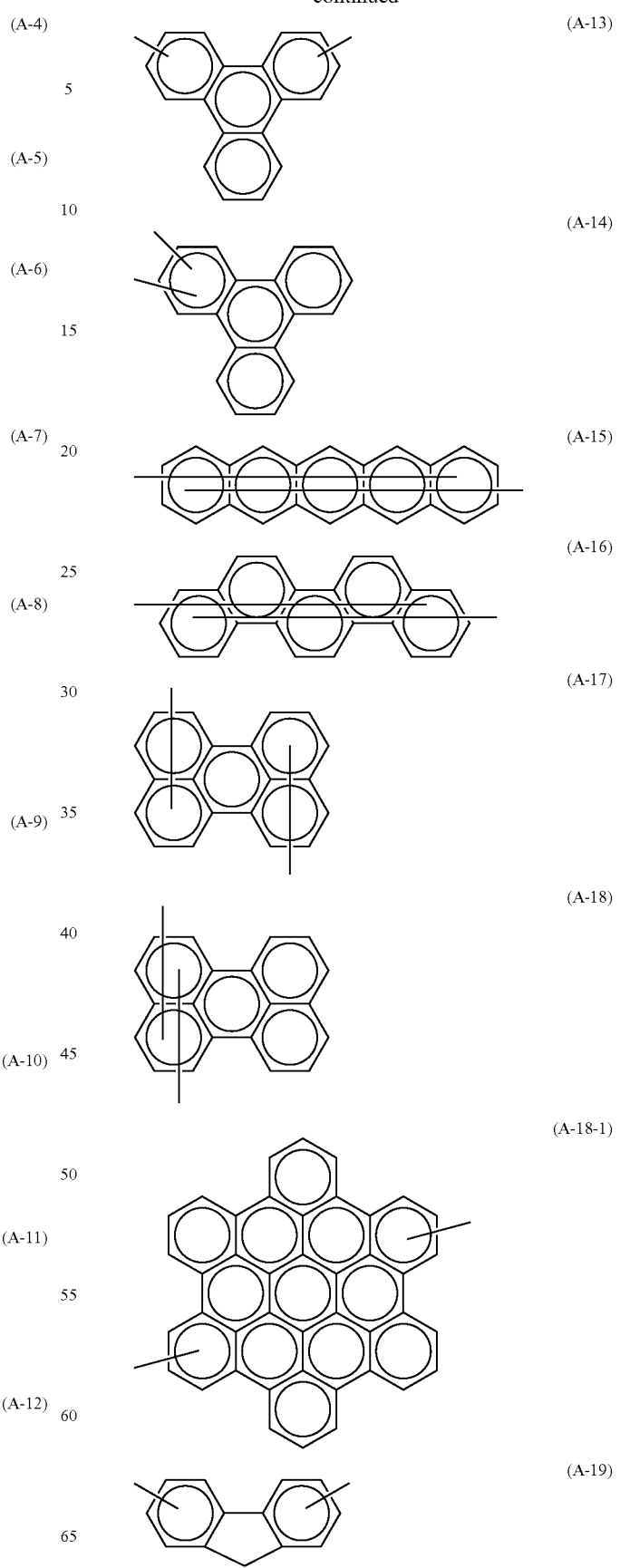

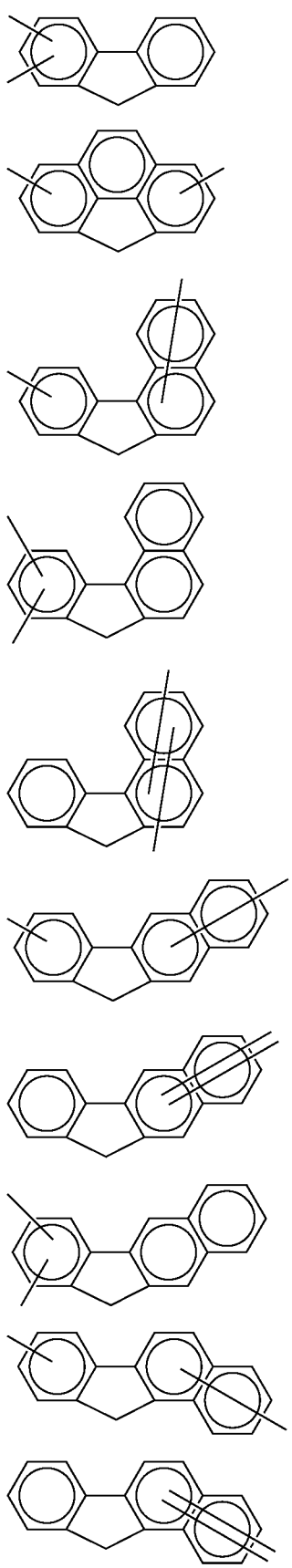
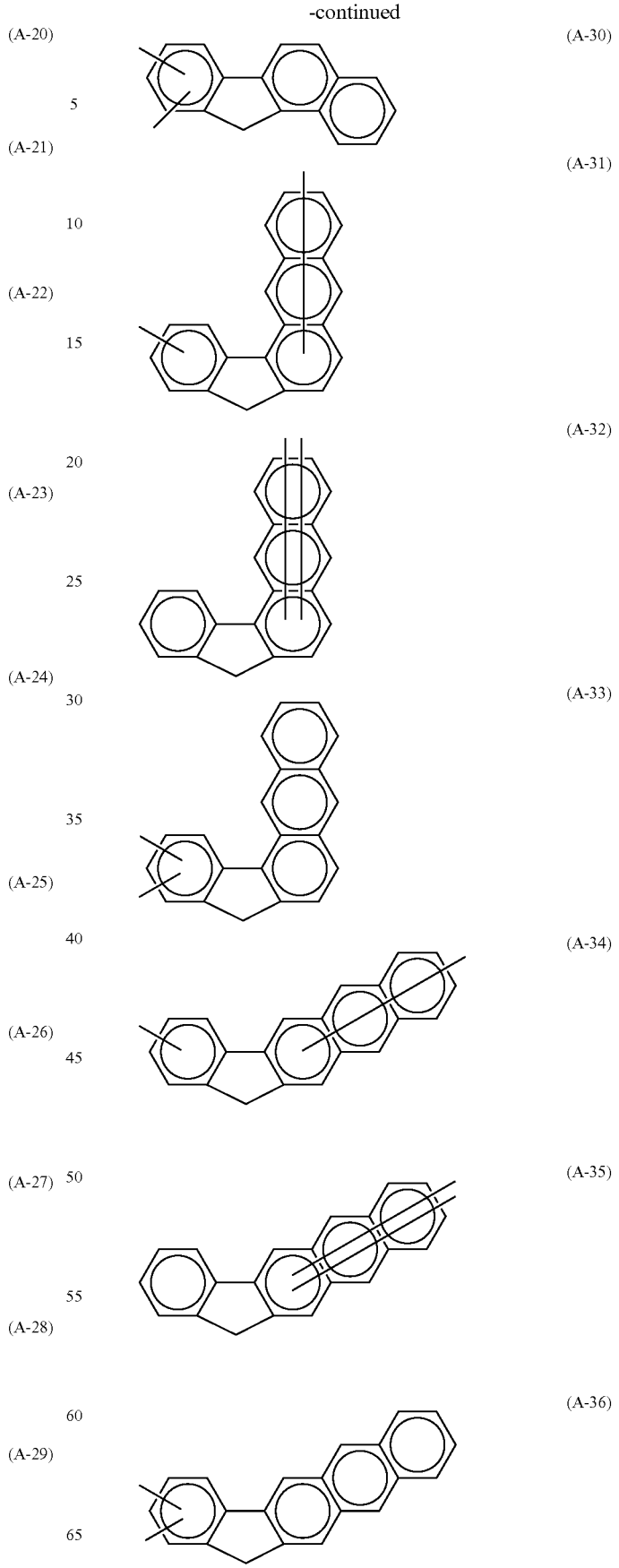

(A-37)
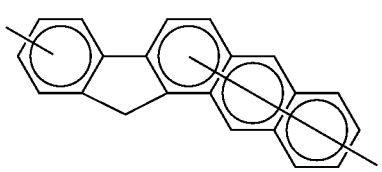

(A-38)
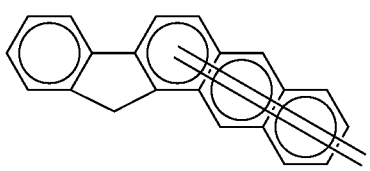

(A-39)
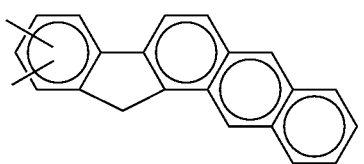

(A-40)
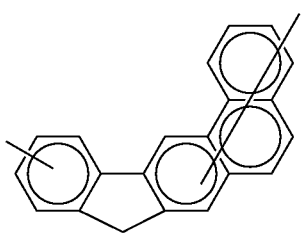

(A-41)
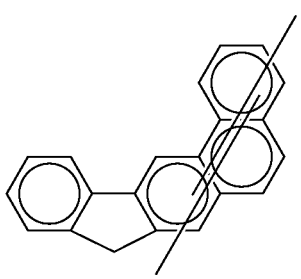

(A-42)
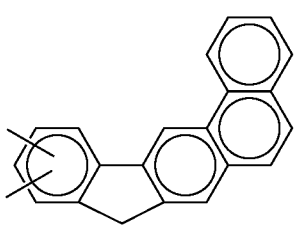

(A-43)
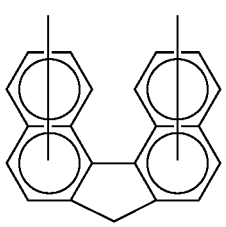

(A-44)
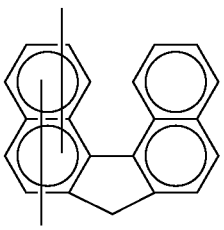

(A-45)
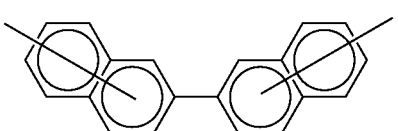

(A-46)
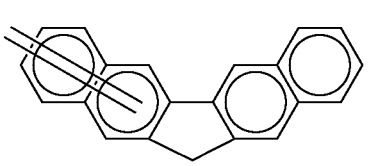

(A-47)
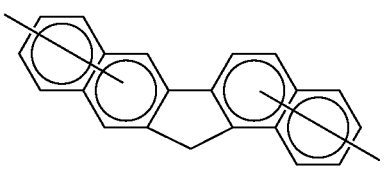

(A-48)
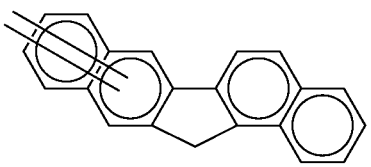

(A-49)
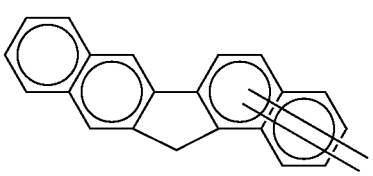

The divalent heterocyclic group is a group generated by removal of two hydrogen atoms connected to an aromatic ring of an aromatic compound having a heterocyclic ring. The divalent heterocyclic group has a carbon number of usually about 2 to 60, preferably 3 to 48, more preferably 5 to 30, further preferably 6 to 25, and particularly preferably 10 to 20. This carbon number does not include the carbon number of the substituent. Specific examples of the divalent heterocyclic group include heterocyclic groups of the following formulae (B-1) to (B-49), and preferable are heterocyclic groups of the formulae (B-4) to (B-49), more preferable are heterocyclic groups of the formulae (B-8) to (B-49), still preferable are heterocyclic groups of the formulae (B-11) to (B-49), further preferable are heterocyclic groups of the formulae (B-11) to (B-37), further still preferable are heterocyclic groups of the formulae (B-11) to (B-29), and particularly preferable are heterocyclic groups of the formulae (B-14) to (B-25). In the following descriptions, connecting bonds in aromatic rings can take any hydrocarbon position.

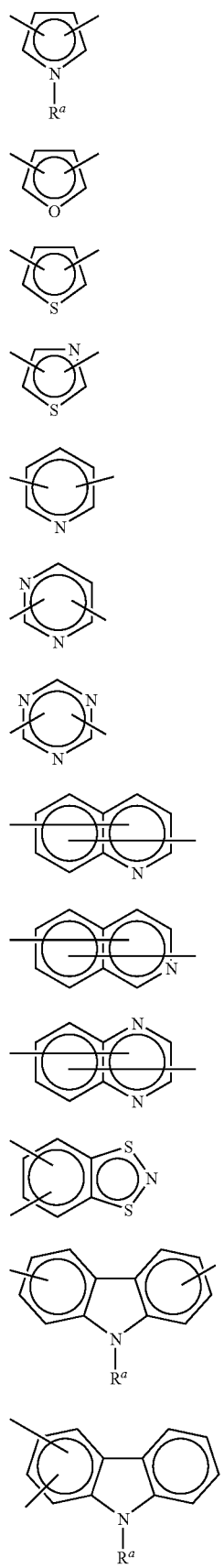
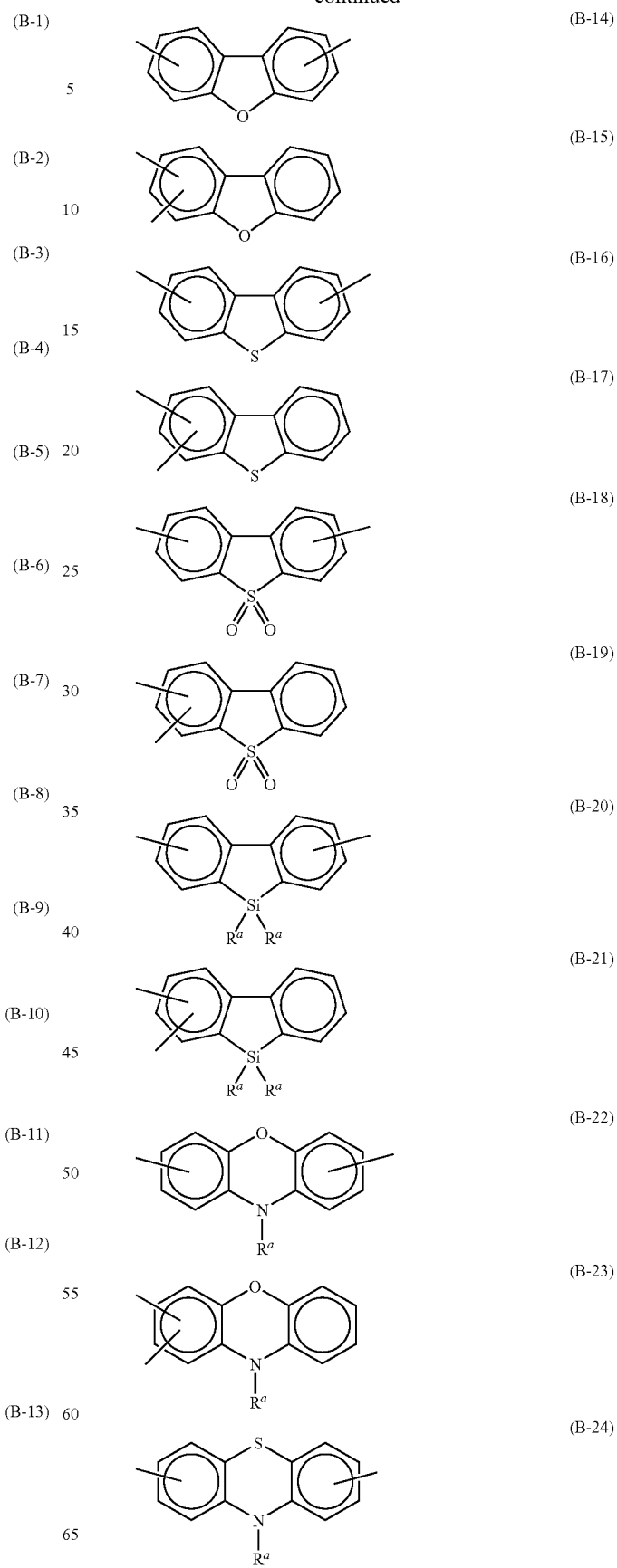

(B-25) 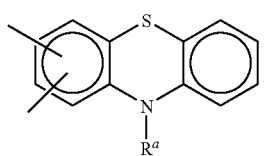
(B-26) 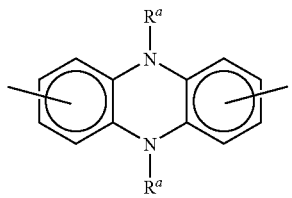
(B-27) 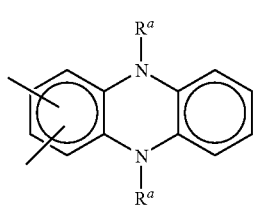
(B-27-1) 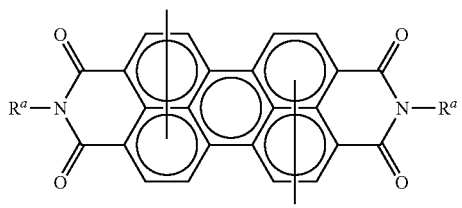
(B-28) 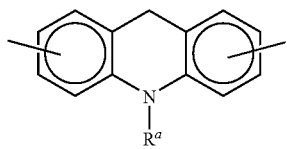
(B-29) 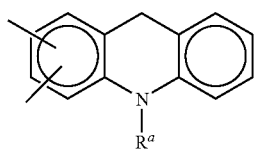
(B-30) 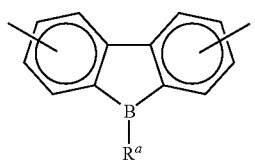
(B-31) 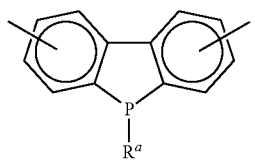
(B-32) 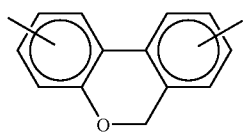
(B-33) 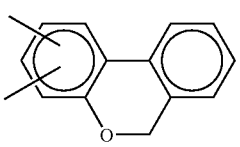
(B-34) 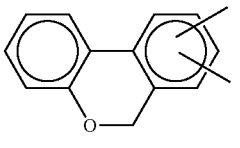
(B-35) 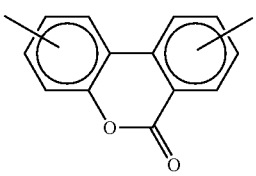
(B-36) 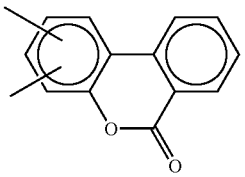
(B-37) 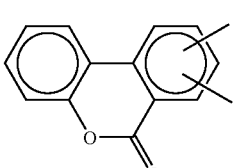
(B-38) 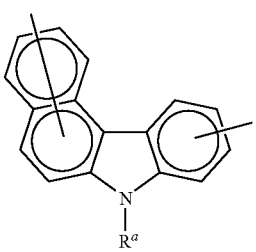
(B-39) 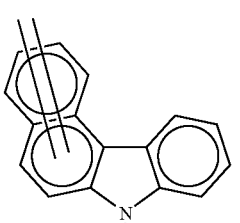
(B-40) 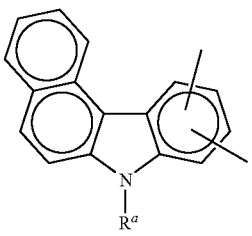

(B-41) 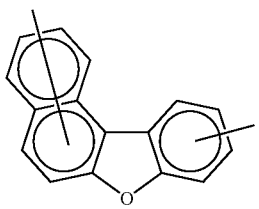

(B-42) 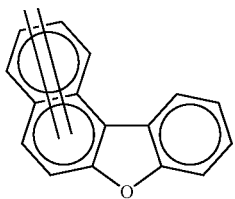

(B-43) 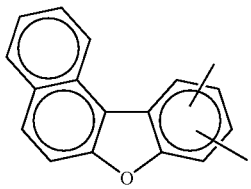

(B-44) 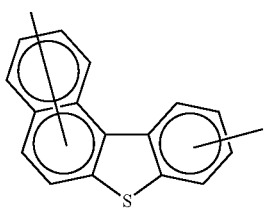

(B-45) 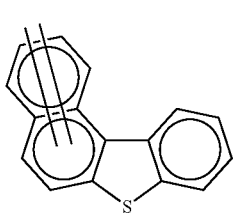

(B-46) 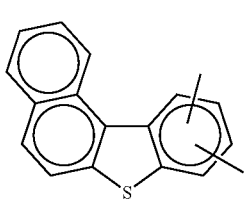

(B-47) 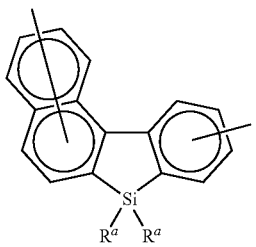

(B-48) 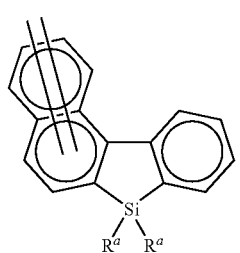

(B-49) 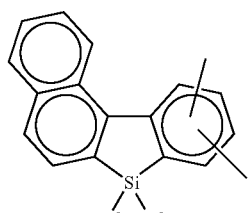

In the above-described formulae, $R^a$ represents a hydrogen atom or substituent, and from the standpoints of stability of a copolymer, easiness of synthesis thereof, and the like, preferable are a hydrogen atom, alkyl groups, aryl groups, arylalkyl groups and monovalent heterocyclic groups, more preferable are alkyl groups, aryl groups, arylalkyl groups and monovalent heterocyclic groups, and further preferable are alkyl groups and aryl groups.

Here, the alkyl group may be any of linear, branched or cyclic, the carbon number thereof is usually about 1 to 20, preferably 1 to 15, more preferably 1 to 10, and specific examples thereof include a methyl group, ethyl group, propyl group, i-propyl group, butyl group, i-butyl group, t-butyl group, pentyl group, isoamyl group, hexyl group, cyclohexyl group, heptyl group, octyl group, 2-ethylhexyl group, nonyl group, decyl group, 3,7-dimethyloctyl group, lauryl group, 1-adamantyl group, 2-adamantyl group, trifluoromethyl group, pentafluoroethyl group, perfluorobutyl group, perfluorohexyl group, perfluorooctyl group and the like, and from the standpoints of device properties, easiness of synthesis and the like, preferable are a methyl group, ethyl group, propyl group, i-propyl group, butyl group, i-butyl group, t-butyl group, pentyl group, isoamyl group, hexyl group, octyl group, 2-ethylhexyl group, decyl group and 3,7-dimethyloctyl group. When there are a plurality of $R^a$'s, two alkyl groups may be mutually connected to form a ring.

The aryl group is an atomic group obtained by removing one hydrogen atom from an aromatic hydrocarbon, and includes also those having a condensed ring, and those in which independent two or more benzene rings or condensed rings are connected directly or via a group such as vinylene and the like. The aryl group has a total carbon number of usually about 6 to 60, preferably 7 to 48. As specific examples thereof, exemplified are a phenyl group, 1-naphthyl group, 2-naphthyl group, 1-anthracenyl group, 2-anthracenyl group, 9-anthracenyl group, pentafluorophenyl group and the like, these may further have a substituent such as an alkyl group, alkoxy group, alkyloxycarbonyl group, substituted amino group and the like. Preferable from the standpoints of solubility thereof in organic solvents, device properties, easiness of synthesis and the like are phenyl groups having as a substituent at least one of alkyl groups having 1 to 12 carbon atoms and/or alkoxy groups having 1 to 12 carbon atoms and/or alkyloxycarbonyl groups, and specific examples thereof include a 3-methylphenyl group, 4-methylphenyl group, 3,5-dimethylphenyl group, 4-propylphenyl group, mesityl group, 4-i-propylphenyl group, 4-butylphenyl group, 4-i-butylphenyl group, 4-t-butylphenyl group, 4-pentylphenyl group, 4-isoamylphenyl group, 4-hexylphenyl group, 2,6-dimethyl-4-t-butylphenyl group, 4-heptylphenyl group, 4-octylphenyl group, 4-nonylphenyl group, 4-decylphenyl group, 4-dodecylphenyl group, 3-methyloxyphenyl group, 4-methyloxyphenyl group, 3,5-dimethyloxyphenyl group, 4-propyloxyphenyl group, 4-i-propyloxyphenyl group, 4-butyloxyphenyl group, 4-i-butyloxyphenyl group, 4-t-butyloxyphenyl group, 4-hexyloxyphenyl group, 3,5-dihexyloxyphenyl group, 4-heptyloxyphenyl group, 4-octyloxyphenyl group, 4-nonyloxyphenyl group, 4-(methoxymethoxy)phenyl group, 3-(methoxymethoxy)phenyl group, 4-(2-ethoxy-ethoxy)phenyl group, 3-(2-ethoxy-ethoxy)phenyl group, 3,5-bis(2-ethoxy-ethoxy)phenyl group, 3-methoxycarbonylphenyl group, 4-methoxycarbonylphenyl group, 3,5-dimethoxycarbonylphenyl group, 3-ethoxycarbonylphenyl group, 4-ethoxycarbonylphenyl group, 3-ethyloxycarbonyl-4-methoxyphenyl group, 3-ethyloxycarbonyl-4-ethoxyphenyl group, 3-ethyloxycarbonyl-4-hexyloxyphenyl group and the like.

The arylalkyl group has a carbon number of usually about 7 to 60, preferably 7 to 48, and as specific examples thereof, exemplified are phenyl $C_1$ to $C_{12}$ alkyl groups, $C_1$ to $C_{12}$ alkoxyphenyl-$C_1$ to $C_{12}$ alkyl groups, $C_1$ to $C_{12}$ alkylphenyl-$C_1$ to $C_{12}$ alkyl groups, 1-naphthyl-$C_1$ to $C_{12}$ alkyl groups, 2-naphthyl-$C_1$ to $C_{12}$ alkyl groups and the like, and preferable from the standpoints of solubility in organic solvents, device properties, easiness of synthesis and the like are $C_1$ to $C_{12}$ alkoxyphenyl-$C_1$ to $C_{12}$ alkyl groups and $C_1$ to $C_{12}$ alkylphenyl-$C_1$ to $C_{12}$ alkyl groups.

The monovalent heterocyclic group is an atomic group remaining after removing one hydrogen atom from a heterocyclic compound, and the carbon number is usually about 4 to 60, preferably 4 to 20. The carbon number of the heterocyclic group does not include the carbon number of substituents. Here, the heterocyclic compound refers to organic compounds having a cyclic structure in which elements constituting the ring include not only a carbon atom, but also a hetero atom such as oxygen, sulfur, nitrogen, phosphorus, boron and the like contained in the ring. Specifically, exemplified are a thienyl group, $C_1$ to $C_{12}$ alkylthienyl groups, pyrrolyl group, furyl group, pyridyl group, $C_1$ to $C_{12}$ alkylpyridyl groups, piperidyl, quinolyl group, isoquinolyl group and the like, and preferable are a thienyl group, $C_1$ to $C_{12}$ alkylthienyl groups, pyridyl group and $C_1$ to $C_{12}$ alkylpyridyl groups.

When $A^1$, $A^2$, $A^3$ and $A^4$ have a substituent in the formula (2), it is preferable from the standpoints of solubility in organic solvents, device properties, easiness of synthesis and the like that the substituent is selected from an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group, substituted phosphino group, sulfonic group and cyano group. The substituent is more preferably selected from an alkyl group, alkoxy group, aryl group, aryloxy group, arylalkyl group, arylalkoxy group, substituted amino group, substituted silyl group, acyl group, substituted carboxyl group and cyano group, even preferably selected from an alkyl group, alkoxy group, aryl group, aryloxy group, arylalkyl group, arylalkoxy group and substituted carboxyl group, further preferably selected from an alkyl group, alkoxy group and aryl group, and the substituent is particularly preferably an alkyl group.

The above-described alkyl group, alkoxy group, alkylthio group, aryl group, aryloxy group, arylthio group, arylalkyl group, arylalkoxy group, arylalkylthio group, arylalkenyl group, arylalkynyl group, substituted amino group, substituted silyl group, acyl group, acyloxy group, imine residue, amide group, acid imide group, monovalent heterocyclic group, substituted carboxyl group and substituted phosphino group may be each independently substituted by the above-described alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group, substituted phosphino group, sulfonic group and cyano group.

Here, the alkyl group may be any of linear, branched or cyclic, the carbon number thereof is usually about 1 to 20, preferably 1 to 15, more preferably 1 to 10, and specific examples thereof include a methyl group, ethyl group, propyl group, i-propyl group, butyl group, i-butyl group, t-butyl group, pentyl group, isoamyl group, hexyl group, cyclohexyl group, heptyl group, octyl group, 2-ethylhexyl group, nonyl group, decyl group, 3,7-dimethyloctyl group, lauryl group, 1-adamantyl group, 2-adamantyl group, trifluoromethyl group, pentafluoroethyl group, perfluorobutyl group, perfluorohexyl group, perfluorooctyl group and the like, and from the standpoints of device properties, easiness of synthesis and the like, preferable are a methyl group, ethyl group, propyl group, i-propyl group, butyl group, 1-butyl group, t-butyl group, pentyl group, isoamyl group, hexyl group, octyl group, 2-ethylhexyl group, decyl group and 3,7-dimethyloctyl group. When there are a plurality of alkyl groups, two alkyl groups may be mutually connected to form a ring.

The alkoxy group may be any of linear, branched or cyclic, the carbon number thereof is usually about 1 to 20, preferably 1 to 15, and specific examples thereof include a methoxy group, ethoxy group, propyloxy group, i-propyloxy group, butoxy group, 1-butoxy group, t-butoxy group, pentyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group, trifluoromethoxy group, pentafluoroethoxy group, perfluorobutoxy group, perfluorohexyl group, perfluorooctyl group, methoxymethyloxy group, 2-methoxyethyloxy group, 2-ethoxyethyloxy group and the like, and from the standpoints of solubility in organic solvents, device properties, easiness of synthesis and the like, preferable are a pentyloxy group, hexyloxy group, octyloxy group, 2-ethylhexyloxy group, decyloxy group and 3,7-dimethyloctyloxy group.

The alkylthio group may be any of linear, branched or cyclic, the carbon number thereof is usually about 1 to 20, preferably 3 to 20, and specific examples thereof include a methylthio group, ethylthio group, propylthio group, i-propylthio group, butylthio group, 1-butylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group, trifluoromethylthio group and the like, and from the standpoints of solubility in organic solvents, device properties, easiness of synthesis and the like, preferable are a pentylthio group, hexylthio group, octylthio group, 2-ethylhexylthio group, decylthio group and 3,7-dimethyloctylthio group.

The aryl group is an atomic group obtained by removing one hydrogen atom from an aromatic hydrocarbon, and includes also those having a condensed ring, and those in which independent two or more benzene rings or condensed rings are connected directly or via a group such as vinylene and the like. The aryl group has a total carbon number of usually about 6 to 60, preferably 7 to 48. As specific examples thereof, exemplified are a phenyl group, 1-naphthyl group, 2-naphthyl group, 1-anthracenyl group, 2-anthracenyl group, 9-anthracenyl group, pentafluorophenyl group and the like, these may further have a substituent such as an alkyl group, alkoxy group, alkyloxycarbonyl group and the like. Preferable from the standpoints of solubility thereof in organic solvents, device properties, easiness of synthesis and the like are phenyl groups having as a substituent at least one of alkyl groups having 1 to 12 carbon atoms and/or alkoxy groups having 1 to 12 carbon atoms and/or alkyloxycarbonyl groups, and specific examples thereof include a 3-methylphenyl group, 4-methylphenyl group, 3,5-dimethylphenyl group, 4-propylphenyl group, mesityl group, 4-i-propylphenyl group, 4-butylphenyl group, 4-i-butylphenyl group, 4-t-butylphenyl group, 4-pentylphenyl group, 4-isoamylphenyl group, 4-hexylphenyl group, 2,6-dimethyl-4-t-butylphenyl group, 4-heptylphenyl group, 4-octylphenyl group, 4-nonylphenyl group, 4-decylphenyl group, 4-dodecylphenyl group, 3-methyloxyphenyl group, 4-methyloxyphenyl group, 3,5-dimethyloxyphenyl group, 4-propyloxyphenyl group, 4-i-propyloxyphenyl group, 4-butyloxyphenyl group, 4-i-butyloxyphenyl group, 4-t-butyloxyphenyl group, 4-hexyloxyphenyl group, 3,5-dihexyloxyphenyl group, 4-heptyloxyphenyl group, 4-octyloxyphenyl group, 4-nonyloxyphenyl group, 4-(methoxymethoxy)phenyl group, 3-(methoxymethoxy)phenyl group, 4-(2-ethoxy-ethoxy)phenyl group, 3-(2-ethoxy-ethoxy)phenyl group, 3,5-bis(2-ethoxy-ethoxy)phenyl group, 3-methoxycarbonylphenyl group, 4-methoxycarbonylphenyl group, 3,5-dimethoxycarbonylphenyl group, 3-ethoxycarbonylphenyl group, 4-ethoxycarbonylphenyl group, 3-ethyloxycarbonyl-4-methoxyphenyl group, 3-ethyloxycarbonyl-4-ethoxyphenyl group, 3-ethyloxycarbonyl-4-hexyloxyphenyl group and the like.

The aryloxy group has a carbon number of usually about 6 to 60, preferably 7 to 48, and as specific examples thereof, exemplified are a phenoxy group, $C_1$ to $C_{12}$ alkoxyphenoxy groups ($C_1$ to $C_{12}$ means a carbon number of 1 to 12, being applicable also in the following descriptions), $C_1$ to $C_{12}$ alkylphenoxy groups, 1-naphthyloxy group, 2-naphthyloxy group, pentafluorophenyloxy group and the like, and preferable from the standpoints of solubility in organic solvents, device properties, easiness of synthesis and the like are $C_1$ to $C_{12}$ alkoxyphenoxy groups and $C_1$ to $C_{12}$ alkylphenoxy groups. As the $C_1$ to $C_{12}$ alkoxy, specifically exemplified are methoxy, ethoxy, propyloxy, i-propyloxy, butoxy, i-butoxy, t-butoxy, pentyloxy, hexyloxy, cyclohexyloxy, heptyloxy, octyloxy, 2-ethylhexyloxy, nonyloxy, decyloxy, 3,7-dimethyloctyloxy, lauryloxy and the like.

As the $C_1$ to $C_{12}$ alkylphenoxy group, specifically exemplified are a methylphenoxy group, ethylphenoxy group, dimethylphenoxy group, propylphenoxy group, 1,3,5-trimethylphenoxy group, methylethylphenoxy group, i-propylphenoxy group, butylphenoxy group, i-butylphenoxy group, t-butylphenoxy group, pentylphenoxy group, isoamylphenoxy group, hexylphenoxy group, heptylphenoxy group, octylphenoxy group, nonylphenoxy group, decylphenoxy group, dodecylphenoxy group and the like.

The arylthio group has a carbon number of usually about 3 to 60, and as specific examples thereof, exemplified are a phenylthio group, $C_1$ to $C_{12}$ alkoxyphenylthio groups, $C_1$ to $C_{12}$ alkylphenylthio groups; 1-naphthylthio group, 2-naphthylthio group, pentafluorophenylthio group and the like, and preferable from the standpoints of solubility in organic solvents, device properties, easiness of synthesis and the like are $C_1$ to $C_{12}$ alkoxyphenylthio groups and $C_1$ to $C_{12}$ alkylphenylthio groups.

The arylalkyl group has a carbon number of usually about 7 to 60, preferably 7 to 48, and as specific examples thereof, exemplified are phenyl $C_1$ to $C_{12}$ alkyl groups, $C_1$ to $C_{12}$ alkoxyphenyl-$C_1$ to $C_{12}$ alkyl groups, $C_1$ to $C_{12}$ alkylphenyl-$C_1$ to $C_{12}$ alkyl groups, 1-naphthyl-$C_1$ to $C_{12}$ alkyl groups, 2-naphthyl-$C_1$ to $C_{12}$ alkyl groups and the like, and preferable from the standpoints of solubility in organic solvents, device properties, easiness of synthesis and the like are $C_1$ to $C_{12}$ alkoxyphenyl-$C_1$ to $C_{12}$ alkyl groups and $C_1$ to $C_{12}$ alkylphenyl-$C_1$ to $C_{12}$ alkyl groups.

The arylalkoxy group has a carbon number of usually about 7 to 60, preferably a carbon number of 7 to 48, and as specific examples thereof, exemplified are phenyl-$C_1$ to $C_{12}$ alkoxy groups such as a phenylmethoxy group, phenylethoxy group, phenylbutoxy group, phenylpentyloxy group, phenylhexyloxy group, phenylheptyloxy group, phenyloctyloxy group and the like, $C_1$ to $C_{12}$ alkoxyphenyl-$C_1$ to $C_{12}$ alkoxy groups, $C_1$, to $C_{12}$ alkylphenyl-$C_1$ to $C_{12}$ alkoxy groups, 1-naphthyl-$C_1$ to $C_{12}$ alkoxy groups, 2-naphthyl-$C_1$ to $C_{12}$ alkoxy groups and the like, and preferable from the standpoints of solubility in organic solvents, device properties, easiness of synthesis and the like are $C_1$ to $C_{12}$ alkoxyphenyl-$C_1$ to $C_{12}$ alkoxy groups and $C_1$ to $C_{12}$ alkylphenyl-$C_1$ to $C_{12}$ alkoxy groups.

The arylalkylthio group has a carbon number of usually about 7 to 60, preferably a carbon number of 7 to 48, and as specific examples thereof, exemplified are phenyl-$C_1$ to $C_{12}$ alkylthio groups, $C_1$ to $C_{12}$ alkoxyphenyl-$C_1$ to $C_{12}$ alkylthio groups, $C_2$ to $C_{12}$ alkylphenyl-$C_1$ to $C_{12}$ alkylthio groups, 1-naphthyl-$C_1$ to $C_{12}$ alkylthio groups, 2-naphthyl-$C_1$ to $C_{12}$ alkylthio groups and the like, and preferable from the standpoints of solubility in organic solvents, device properties, easiness of synthesis and the like are $C_1$ to $C_{12}$ alkoxyphenyl-$C_1$ to $C_{12}$ alkylthio groups and $C_1$ to $C_{12}$ alkylphenyl-$C_1$ to $C_{12}$ alkylthio groups.

The arylalkenyl group has a carbon number of usually about 8 to 60, and as specific examples thereof, exemplified are phenyl-$C_2$ to $C_{12}$ alkenyl groups, $C_1$ to $C_{12}$ alkoxyphenyl-$C_2$ to $C_{12}$ alkenyl groups, $C_1$ to $C_{12}$ alkylphenyl-$C_2$ to $C_{12}$ alkenyl groups, 1-naphthyl-$C_2$ to $C_{12}$ alkenyl groups, 2-naphthyl-$C_2$ to $C_{12}$ alkenyl groups and the like, and preferable from the standpoints of solubility in organic solvents, device properties, easiness of synthesis and the like are $C_1$ to $C_{12}$ alkoxyphenyl-$C_2$ to $C_{12}$ alkenyl groups and $C_2$ to $C_{12}$ alkylphenyl-$C_1$ to $C_{12}$ alkenyl groups.

The arylalkynyl group has a carbon number of usually about 8 to 60, and as specific examples thereof, exemplified are phenyl-$C_2$ to $C_{12}$ alkynyl groups, $C_1$ to $C_{12}$ alkoxyphenyl-$C_2$ to $C_{12}$ alkynyl groups, $C_2$ to $C_{12}$ alkylphenyl-$C_2$ to $C_{12}$ alkynyl groups, 1-naphthyl-$C_2$ to $C_{12}$ alkynyl groups, 2-naphthyl-$C_2$ to $C_{12}$ alkynyl groups and the like, and preferable from the standpoints of solubility in organic solvents, device properties, easiness of synthesis and the like are $C_1$ to $C_{12}$ alkoxyphenyl-$C_2$ to $C_{12}$ alkynyl groups and $C_1$ to $C_{12}$ alkylphenyl-$C_2$ to $C_{12}$ alkynyl groups.

As the substituted amino group, amino groups substituted by one or two groups selected from alkyl groups, aryl groups, arylalkyl groups or monovalent heterocyclic groups are mentioned, and the alkyl group, aryl group, arylalkyl group or monovalent heterocyclic group optionally has a substituent. The carbon number of the substituted amino group is usually about 1 to 60, preferably 2 to 48 not including the carbon number of the substituent.

Specifically exemplified are a methylamino group, dimethylamino group, ethylamino group, diethylamino group, propylamino group, dipropylamino group, i-propylamino group, diisopropylamino group, butylamino group, i-butylamino group, t-butylamino group, pentylamino group, hexylamino group, cyclohexylamino group, heptylamino group, octylamino group, 2-ethylhexylamino group, nonylamino group, decylamino group, 3,7-dimethyloctylamino group, laurylamino group, cyclopentylamino group, dicyclopentylamino group, cyclohexylamino group, dicyclohexylamino group, pyrrolidyl group, piperidyl group, ditrifluoromethylamino group, phenylamino group, diphenylamino group, $C_1$ to $C_{12}$ alkoxyphenylamino groups, di($C_1$ to $C_{12}$ alkoxyphenyl)amino groups, di($C_1$ to $C_{12}$ alkylphenyl)amino groups, 1-naphthylamino group, 2-naphthylamino group, pentafluorophenylamino group, pyridylamino group, pyridazinylamino group, pyrimidylamino group, pyrazylamino group, triazylamino group, phenyl $C_1$ to $C_{12}$ alkylamino groups, $C_1$ to $C_{12}$ alkoxyphenyl-$C_1$ to $C_{12}$ alkylamino groups, $C_1$ to $C_{12}$ alkylphenyl-$C_1$ to $C_{12}$ alkylamino groups, di($C_1$ to $C_{12}$ alkoxyphenyl-$C_1$ to $C_{12}$ alkyl)amino groups, di($C_1$ to $C_{12}$ alkylphenyl-$C_1$ to $C_{12}$ alkyl)amino groups, 1-naphthyl-$C_1$ to $C_{12}$ alkylamino groups, 2-naphthyl-$C_1$ to $C_{12}$ alkylamino groups and the like.

As the substituted silyl group, silyl groups substituted by one, two or three groups selected from alkyl groups, aryl groups, arylalkyl groups or monovalent heterocyclic groups are mentioned.

The carbon number of the substituted silyl group is usually about 1 to 60, preferably 3 to 48. The alkyl group, aryl group, arylalkyl group or monovalent heterocyclic group optionally has a substituent.

Specifically exemplified are a trimethylsilyl group, triethylsilyl group, tripropylsilyl group, tri-i-propylsilyl group, dimethyl-i-propylsilyl group, diethyl-i-propylsilyl group, t-butylsilyldimethylsilyl group, pentyldimethylsilyl group, hexyldimethylsilyl group, heptyldimethylsilyl group, octyldimethylsilyl group, 2-ethylhexyl-dimethylsilyl group, nonyldimethylsilyl group, decyldimethylsilyl group, 3,7-dimethyloctyl-dimethylsilyl group, lauryldimethylsilyl group, phenyl-$C_1$ to $C_{12}$ alkylsilyl groups, $C_1$ to $C_{12}$ alkoxyphenyl-$C_1$ to $C_{12}$ alkylsilyl groups, $C_1$ to $C_{12}$ alkylphenyl-$C_1$ to $C_{12}$ alkylsilyl groups, 1-naphthyl-$C_1$ to $C_{12}$ alkylsilyl groups, 2-naphthyl-$C_1$ to $C_{12}$ alkylsilyl groups, phenyl-$C_1$ to $C_{12}$ alkyldimethylsilyl groups, triphenylsilyl group, tri-p-xylylsilyl group, tribenzylsilyl group, diphenylmethylsilyl group, t-butyldiphenylsilyl group, dimethylphenylsilyl group and the like.

As the halogen atom, a fluorine atom, chlorine atom, bromine atom and iodine atom are exemplified.

The acyl group has a carbon number of usually about 2 to 20, preferably a carbon number of 2 to 18, and as specific examples thereof, exemplified are an acetyl group, propionyl group, butyryl group, isobutyryl group, pivaloyl group, benzoyl group, trifluoroacetyl group, pentafluorobenzoyl group and the like.

The acyloxy group has a carbon number of usually about 2 to 20, preferably a carbon number of 2 to 18, and as specific examples thereof, exemplified are an acetoxy group, propionyloxy group, butyryloxy group, isobutyryloxy group, pivaloyloxy group, benzoyloxy group, trifluoroacetyloxy group, pentafluorobenzoyloxy group and the like.

The imine residue has a carbon number of about 2 to 20, preferably a carbon number of 2 to 18, and as specific examples thereof, groups of the following structural formulae and the like are exemplified.

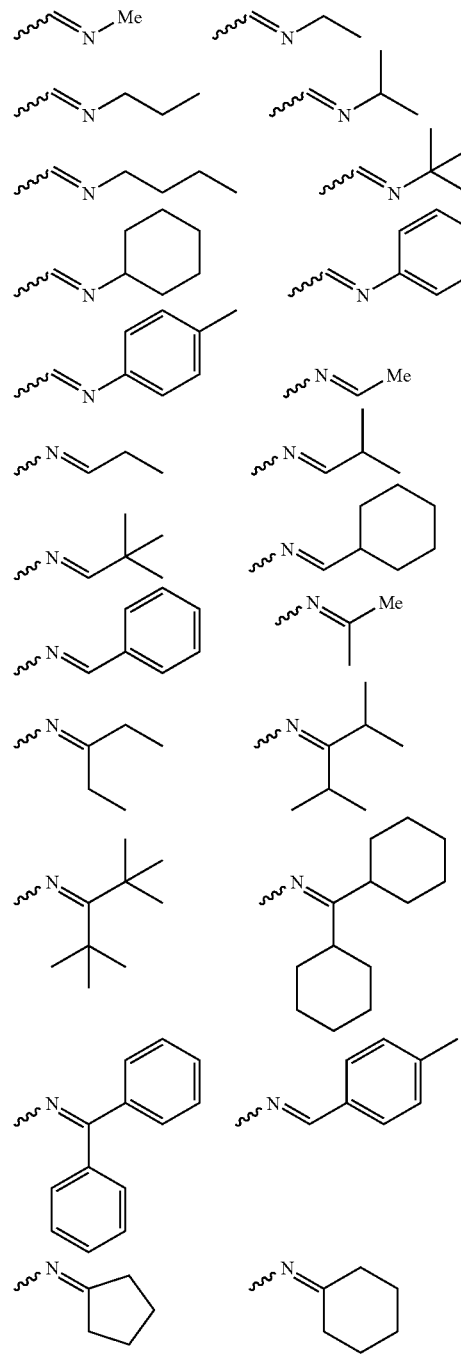

The amide group has a carbon number of usually about 2 to 20, preferably a carbon number of 2 to 18, and as specific examples thereof, exemplified are a formamide group, acetamide group, propioamide group, butyroamide group, benzamide group, trifluoroacetamide group, pentafluorobenzamide group, diformamide group, diacetamide group, dipropioamide group, dibutyroamide group, dibenzamide group, ditrifluoroacetamide group, dipentafluorobenzamide group and the like.

As the acid imide group, residues obtained by removing from an acid imide a hydrogen atom connected to its nitrogen atom are mentioned, and the carbon number thereof is about 4 to 20, and specifically, the following groups and the like are exemplified.

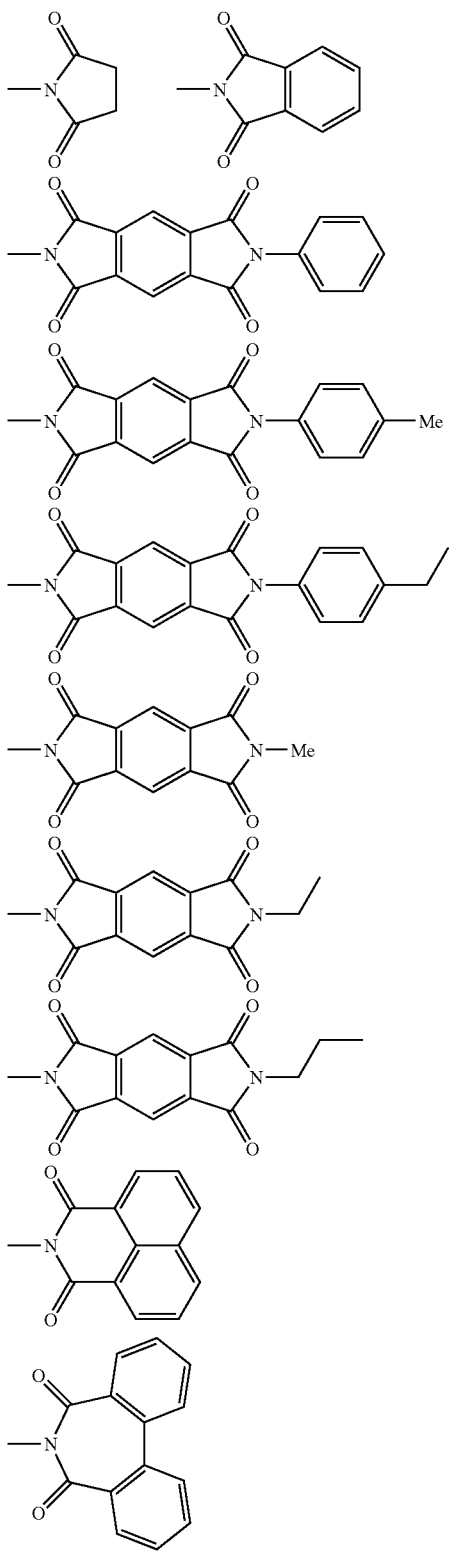

The monovalent heterocyclic group is an atomic group remaining after removing one hydrogen atom from a heterocyclic compound, and the carbon number is usually about 4 to 60, preferably 4 to 20. The carbon number of the heterocyclic group does not include the carbon number of substituents. Here, the heterocyclic compound refers to organic compounds having a cyclic structure in which elements constituting the ring include not only a carbon atom, but also a hetero atom such as oxygen, sulfur, nitrogen, phosphorus, boron and the like contained in the ring. Specifically, exemplified are a thienyl group, $C_1$ to $C_{12}$ alkylthienyl groups, pyrrolyl group, furyl group, pyridyl group, $C_1$ to $C_{12}$ alkylpyridyl groups, piperidyl group, quinolyl group, isoquinolyl group and the like, and preferable are a thienyl group, $C_1$ to $C_{12}$ alkylthienyl groups, pyridyl group and $C_1$ to $C_{12}$ alkylpyridyl groups.

As the substituted carboxyl group, carboxyl groups substituted by an alkyl group, aryl group, arylalkyl group or monovalent heterocyclic group are mentioned, and the carbon number thereof is usually about 2 to 60, preferably 2 to 48, and specific examples thereof include a methoxycarbonyl, group, ethoxycarbonyl group, propoxycarbonyl group, i-propoxycarbonyl group, butoxycarbonyl group, i-butoxycarbonyl group, t-butoxycarbonyl group, pentyloxycarbonyl group, hexyloxycarbonyl group, cyclohexyloxycarbonyl group, heptyloxycarbonyl group, octyloxycarbonyl group, 2-ethylhexyloxycarbonyl group, nonyloxycarbonyl group, decyloxycarbonyl, group, 3,7-dimethyloctyloxycarbonyl group, dodecyloxycarbonyl group, trifluoromethoxycarbonyl group, pentafluoroethoxycarbonyl group, perfluorobutoxycarbonyl group, perfluorohexyloxycarbonyl group, perfluorooctyloxycarbonyl group, phenoxycarbonyl group, naphthoxycarbonyl group, pyridyloxycarbonyl group and the like.

As the substituted phosphino group, phosphino groups substituted by an alkyl group, aryl group, arylalkyl group or monovalent heterocyclic group are mentioned, and the carbon number thereof is usually about 2 to 60, preferably 9 to 48, and specific examples thereof include a dimethylphosphino group, diethylphosphino group, dibutylphosphino group, bis(t-butyl)phosphino group, dicyclohexylphosphino group, diphenylphosphino group, bis(1-naphthyl)phosphino group, bis(2-methylphenyl)phosphino group, bis(4-methylphenyl)phosphino group, bis(2-methoxyphenyl)phosphino group, bis(4-methoxyphenyl)phosphino group, bis(4-fluorophenyl)phosphino group, dibenzylphosphino group and the like.

In the above-described formula (2), $B^1$, $B^2$, $B^3$ and $B^4$ represent each independently —$BR^1$—, —$NR^2$—, —$SiR^3R^4$—, —$PR^5$—, —C≡C—, —$CR^b$=N— or vinylene group optionally having a substituent. $R^1$, $R^2$, $R^3$, $R^4$, $R^5$ and $R^b$ represent a hydrogen atom or substituent, $B^1$, $B^2$, $B^3$ and $B^4$ in the formula (2) are preferably selected from —$NR^2$—, —$SiR^3R^4$—, —$CR^b$=N— and vinylene group optionally having a substituent, more preferably selected from —$NR^2$— and vinylene group optionally having a substituent, and further preferable is —$NR^2$—.

$R^1$, $R^2$, $R^3$, $R^4$ and $R^5$ represent, from the standpoints of stability of a copolymer, easiness of synthesis and the like, preferably a hydrogen atom, alkyl group, aryl group, arylalkyl group or monovalent heterocyclic group, more preferably an alkyl group, aryl group, arylalkyl group or monovalent heterocyclic group, further preferably an alkyl group or aryl group. As specific examples of the alkyl group, aryl group, arylalkyl group and monovalent heterocyclic group, the same specific examples as those of an alkyl group, aryl group, arylalkyl group and monovalent heterocyclic group when $A^1$, $A^2$, $A^3$ and $A^4$ in the formula (2) have a substituent are mentioned.

—$CR^b$=N— represented by $B^1$, $B^2$, $B^3$ and $B^4$ in the formula (2) is specifically represented by the following formula (3) or (4).

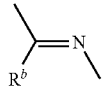
(3)

(in the formula (3), $R^b$'s represent each independently a hydrogen atom or substituent).

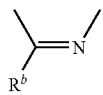
(4)

(in the formula (4), $R^b$'s represent each independently a hydrogen atom or substituent).

From the standpoints of solubility in organic solvents, device properties, easiness of synthesis and the like, $R^b$ in the formula (3) and the formula (4) is preferably selected from an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group and cyano group. $R^b$ is selected more preferably from an alkyl group, alkoxy group, aryl group, aryloxy group, arylalkyl group, arylalkoxy group, substituted amino group, substituted silyl group, acyl group, substituted carboxyl group and cyano group, still preferably from an alkyl group, alkoxy group, aryl group, aryloxy group, arylalkyl group, arylalkoxy group and substituted carboxyl group, further preferably from an alkyl group, alkoxy group and aryl group, and particularly preferably from an alkyl group and aryl group. As specific examples of the alkyl group, alkoxy group, alkylthio group, aryl group, aryloxy group, arylthio group, arylalkyl group, arylalkoxy group, arylalkylthio group, arylalkenyl group, arylalkynyl group, substituted amino group, substituted silyl group, halogen atom, acyl group, acyloxy group, imine residue, amide group, acid imide group, monovalent heterocyclic group and substituted carboxyl group, the same specific examples of an alkyl group, alkoxy group, alkylthio group, aryl group, aryloxy group, arylthio group, arylalkyl group, arylalkoxy group, arylalkylthio group, arylalkenyl group, arylalkynyl group, substituted amino group, substituted silyl group, halogen atom, acyl group, acyloxy group, imine residue, amide group, acid imide group, monovalent heterocyclic group and substituted carboxyl group when $A^1$, $A^2$, $A^3$ and $A^4$ in the formula (2) have a substituent are mentioned.

Specific examples of the vinylene group optionally having a substituent include vinylene groups of the following formulae (3') and (4').

(3')

(in the formula (3'), $R^b$'s represent each independently a hydrogen atom or substituent).

(4')

(in the formula (4'), $R^b$'s represent each independently a hydrogen atom or substituent).

Preferable examples of $R^b$ in the formula (3') and the formula (4') are the same as preferable examples of $R^b$ in the formula (3).

In the formula (2), $a^1$, $a^2$, $a^3$, $a^4$ and $a^5$ represent each independently an integer of 0 to 3, satisfying $1=a^1+a^2+a^3+a^4+a^5$=$a^1$, $a^2$, $a^3$, $a^4$ and $a^5$ are integers satisfying preferably $1=a^1+a^2+a^3+a^4+a^5=10$, more preferably $1=a^1+a^2+a^3+a^4+a^5=7$, still preferably $1=a^1+a^2+a^3+a^4+a^5=5$, further preferably $1=a^1+a^2+a^3+a^4+a^5=4$, and particularly further preferably $1=a^1+a^2+a^3+a^4+a^5=3$.

In the formula (2), $b^1$, $b^2$, $b^3$ and $b^4$ represent each independently 0 or 1. $b^1$, $b^2$, $b^3$ and $b^4$ are integers satisfying preferably $0=b^1+b^2+b^3+b^4=3$, more preferably $0=b^1+b^2+b^3+b^4=2$.

From the standpoints of device properties and the like, preferable is a case in which $a^1=1$ and $a^2=a^3=a^4=a^5=b^1=b^2=b^3=b^4=0$, a case in which $a^1=a^3=b^1=b^2=1$ and $1=a^2=2$ and $a^4=a^5=b^1=b^2=0$, or a case in which $a^1=a^2=1$ and $b^1=1$ and $a^3=a^4=a^5=b^2=b^3==b^4=0$, in the formula (2).

Specific examples of the group of the formula (2) are, from the standpoints of device properties and the like, preferably groups of the following formulae (C-1) to (C-22), (D-1) to (D-24), (E-1) to (E-26), (F-1) to (F-13), (G-1) to (G-14), (H-1) to (H-12) or (J-1) to (J-22), more preferably groups of the following formulae (C-1) to (C-22), (D-1) to (D-24), (E-1) to (E-26), (F-1) to (F-13), (G-1) to (G-14) or (J-1) to (J-22), still preferably groups of the following formulae (C-1) to (C-22), (D-1) to (D-24), (E-1) to (E-26), (F-1) to (F-13), (G-1) to (G-14) or (J-20) to (J-22), further preferably groups of the following formulae (C-1) to (C-22), (D-1) to (D-2), (D-4) to (D-24), (E-1) to (E-16), (E-19) to (E-26), (F-9) to (F-13), (G-1) to (G-14) or (J-20) to (J-22), further still preferably groups of the following formulae (C-1) to (C-22), (D-9) to (D-24), (B-1) to (E-16), (E-19) to (E-26), (F-9) to (F-13), (G-1) to (G-14) or (J-20) to (J-22), and particularly preferably groups of the following formulae (C-1), (C-11) to (C-22), (D-9) to (D-24), (E-1) to (E-16), (E-19) to (E-26), (F-9) to (F-13), (G-1) to (G-14) or (J-20) to (J-22). Among them, preferable are groups of the formulae (C-11) to (C-22), (D-9) to (D-24), (E-1) to (E-16), (E-19) to (E-26), (F-9) to (F-13) or (G-1) to (G-14), more preferable are groups of the formulae (C-11) to (C-22), (D-9) to (D-24), (E-1) to (E-16), (E-19) to (E-26) or (G-1) to (G-14), still preferable are groups of the formulae (C-11) to (C-22), (D-9) to (D-24), (E-1) to (E-16) or (G-1) to (G-14), further preferable are groups of the formulae (C-11) to (C-22), (D-9) to (D-24) or (G-1) to (G-14), further still preferable are groups of the formulae (C-11), (C-15) to (C-22), (D-9) to (D-24) or (G-1) to (G-14), and particularly preferable are groups of the formulae (C-11), (C-15) to (C-22), (D-10-1) or (G-1) to (G-14). Particularly among them, preferable are groups of the formulae (C-11), (C-15) to (C-22), (D-10-1) or (G-1) to (G-4), more preferable are groups of the formulae (C-11), (C-15), (D-10-1) or (G-1) to (G-4), and further preferable are groups of the formulae (C-11), (C-15), (D-10-1) or (G-1).

Here, in the formulae, $R^a$'s represent each independently the same meaning as for $R^a$ in the formula (B-12), and $R^b$'s represent each independently the same meaning as for $R^b$ in the formula (3). In the formulae, $R^c$'s represent each independently a hydrogen atom or substituent, and this substituent represents the same group as the preferable substituent when $A^1$, $A^2$, $A^3$ and $A^4$ in the formula (2) have a substituent. $R^1$, $R^2$, $R^3$, $R^4$ and $R^5$ in the formulae represent each independently, from the standpoints of stability of a copolymer, easiness of synthesis and the like, preferably a hydrogen atom, alkyl group, aryl group, arylalkyl group or monovalent heterocyclic group, more preferably an alkyl group, aryl group, arylalkyl group or monovalent heterocyclic group, further preferably an alkyl group or aryl group. As specific examples of the alkyl group, aryl group, arylalkyl group and monovalent heterocyclic group, the same specific examples as those of an alkyl group, aryl group, arylalkyl group and monovalent heterocyclic group when $A^1$, $A^2$, $A^3$ and $A^4$ in the formula (2) have a substituent are mentioned.

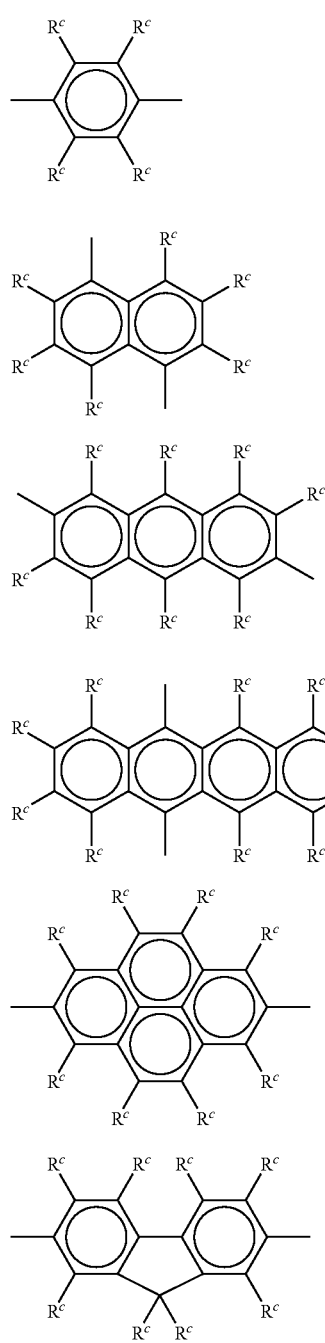

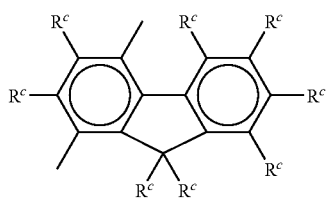 (C-13)
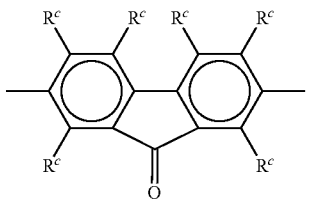 (C-14)
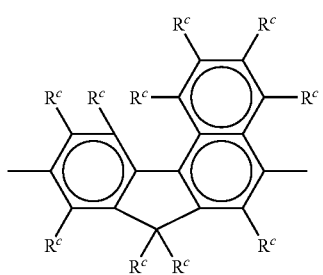 (C-15)
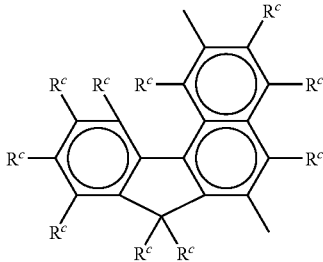 (C-16)
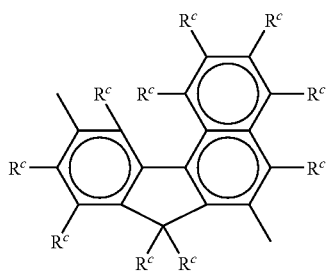 (C-17)
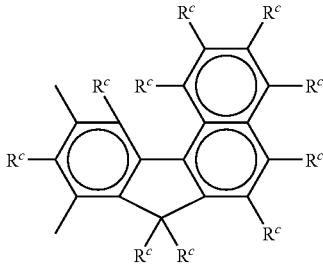 (C-18)
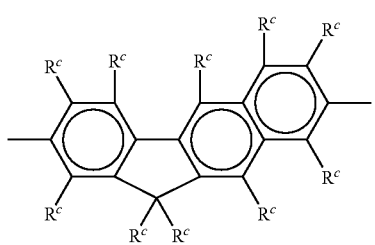 (C-19)
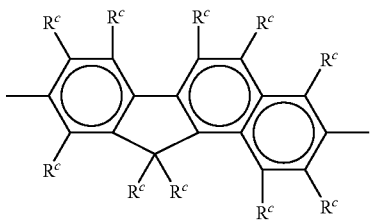 (C-20)
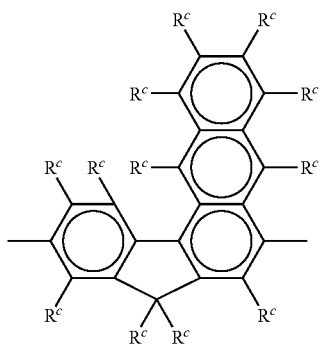 (C-21)
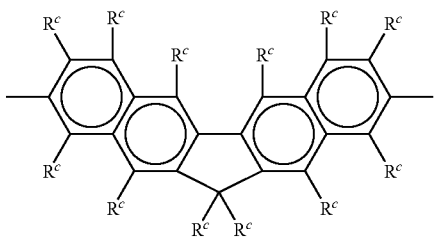 (C-22)
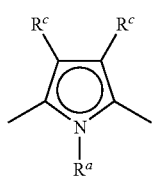 (D-1)
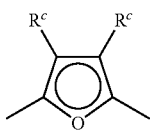 (D-2)

-continued
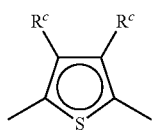 (D-3)
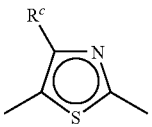 (D-4)
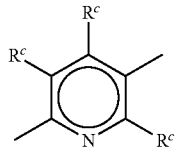 (D-5)
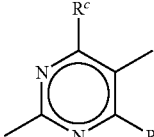 (D-6)
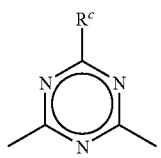 (D-7)
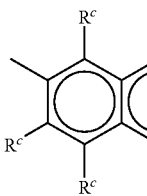 (D-8)
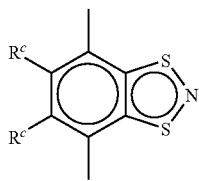 (D-9)
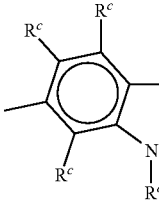 (D-10)
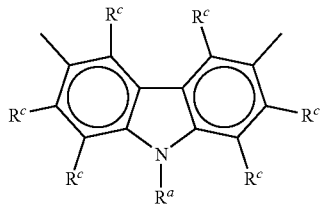 (D-10-1)
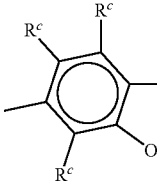 (D-11)
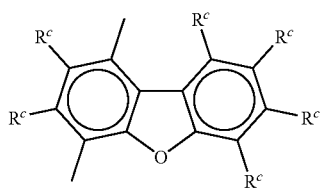 (D-12)
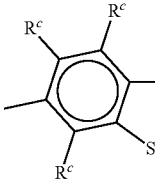 (D-13)
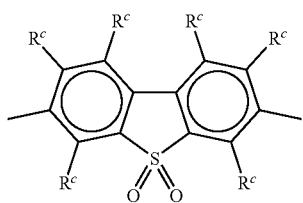 (D-14)
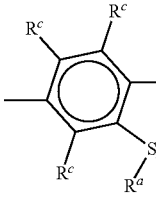 (D-15)
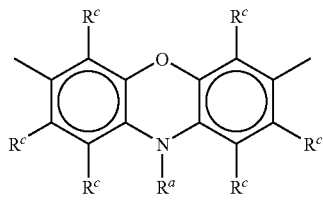 (D-16)
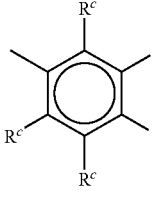 (D-17)

-continued
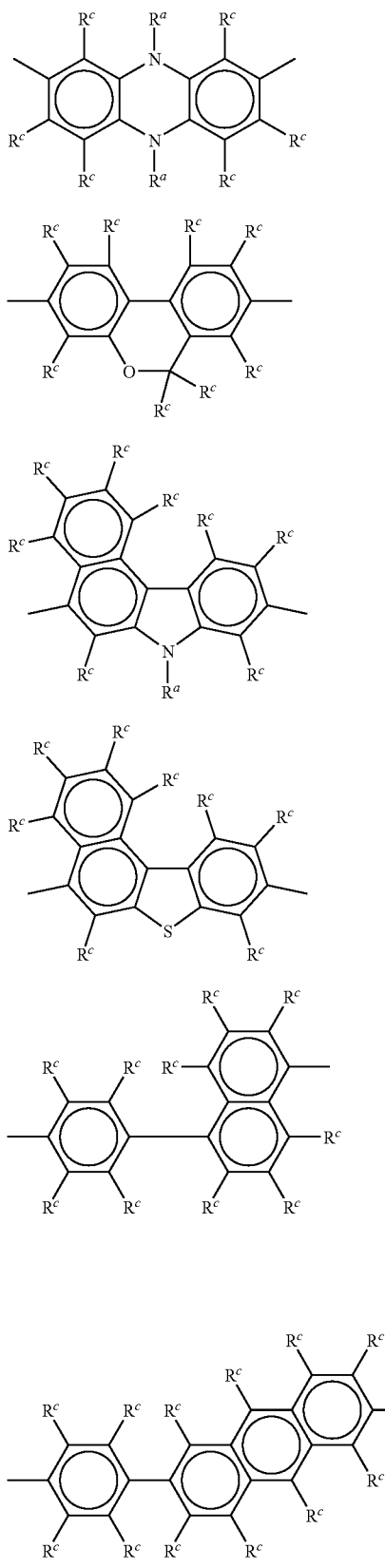
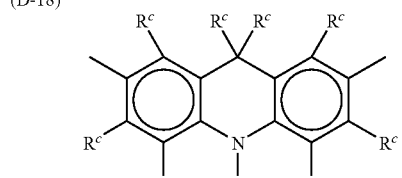
(D-18)
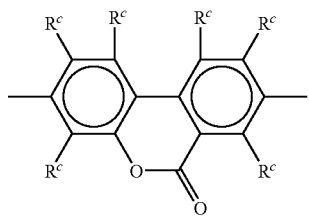
(D-19)
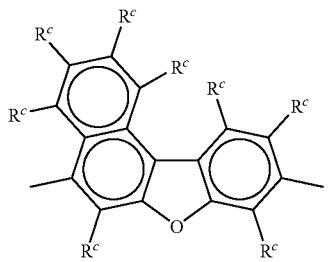
(D-20)
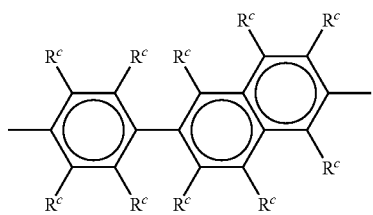
(D-21)
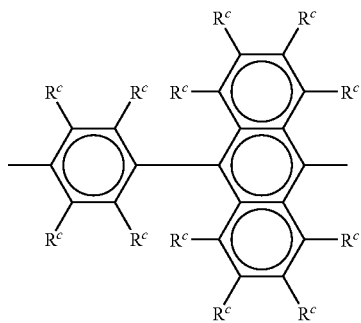
(D-22)
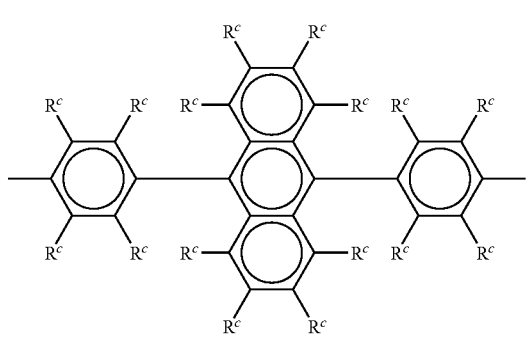
(D-23)

(E-6)
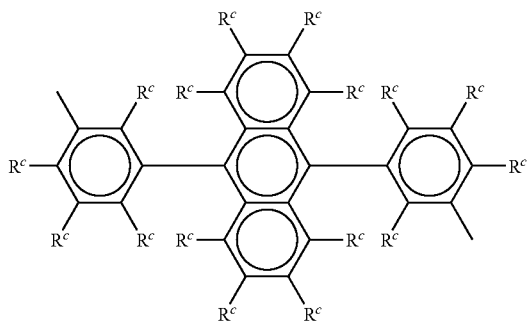
(E-7)
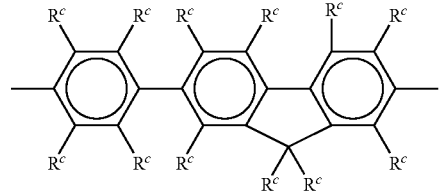
(E-8)
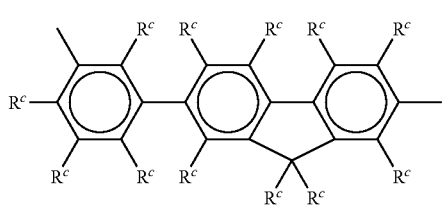
(E-9)
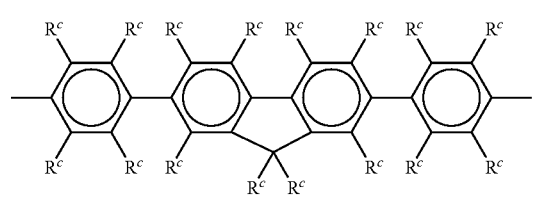
(E-10)
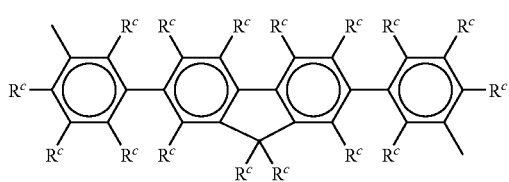
(E-11)
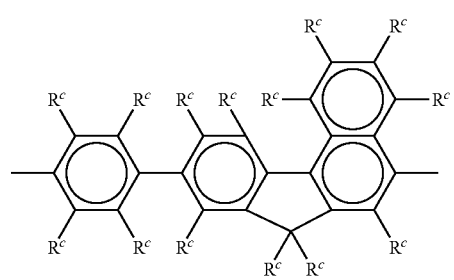
(E-12)
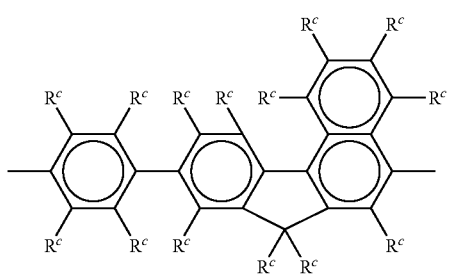
(E-13)
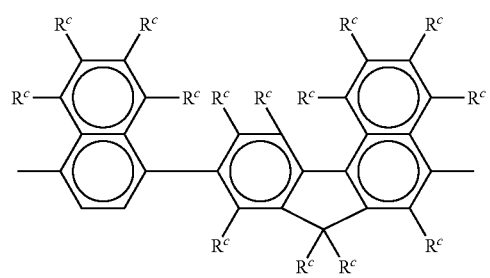
(E-14)
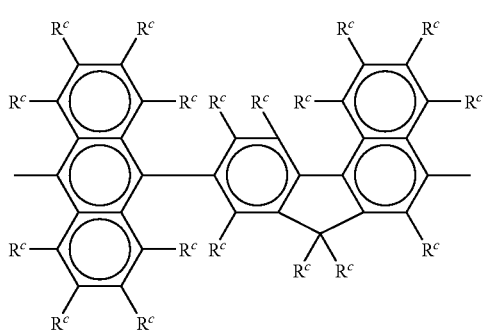
(E-15)
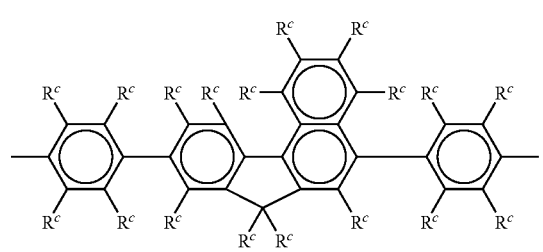

-continued
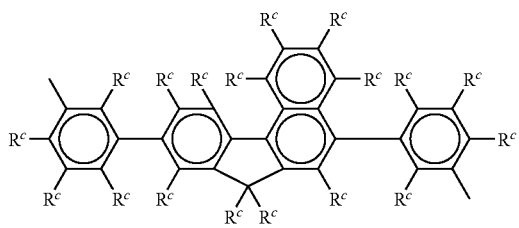
(E-16)
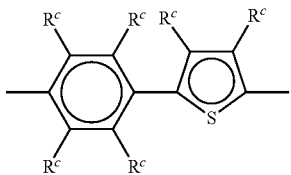
(E-17)
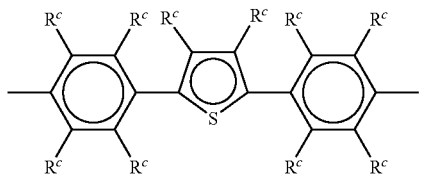
(E-18)
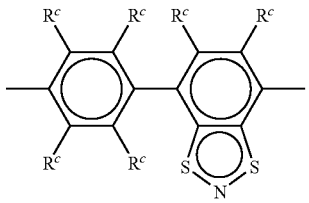
(E-19)
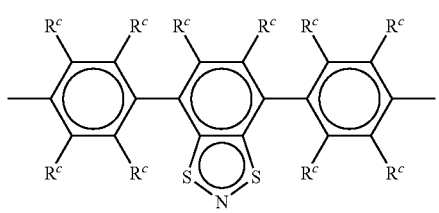
(E-20)
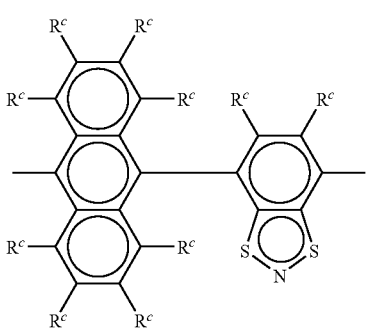
(E-21)
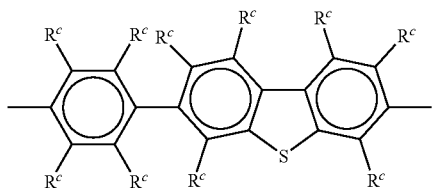
(E-22)
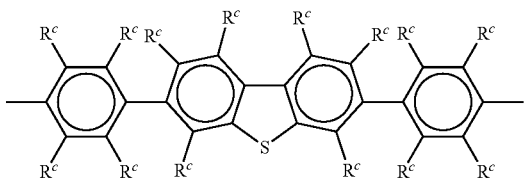
(E-23)
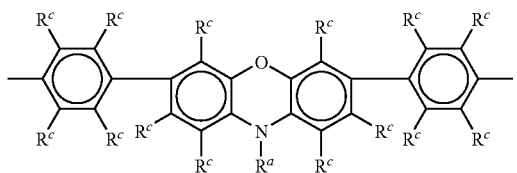
(E-24)
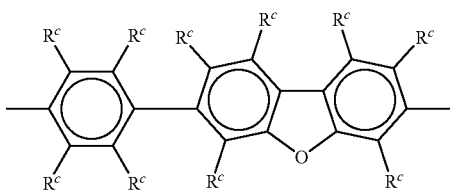
(E-25)
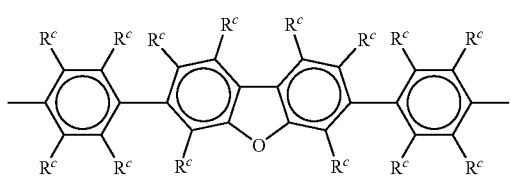
(E-26)
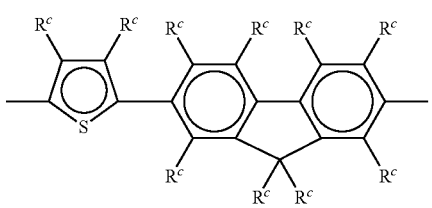
(F-1)

-continued
(F-2)
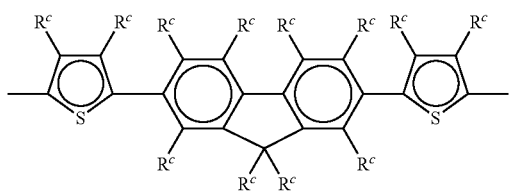
(F-3)
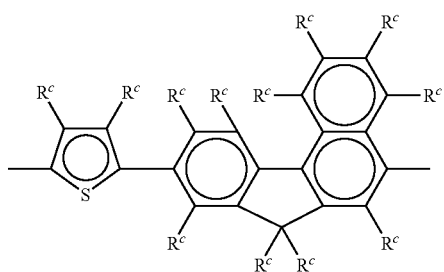
(F-4)
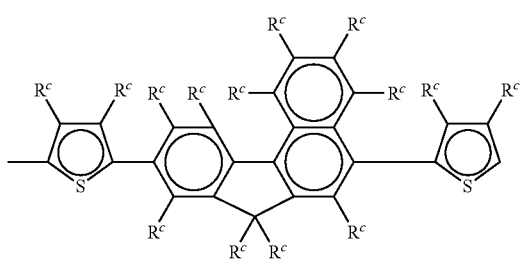
(F-5)
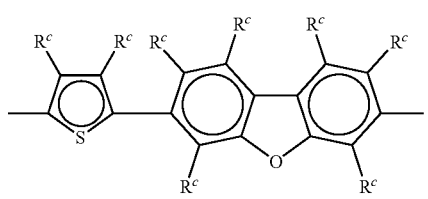
(F-6)
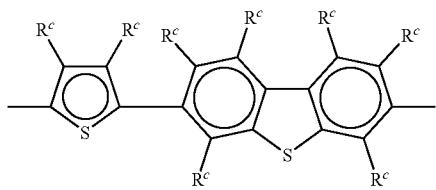
(F-7)
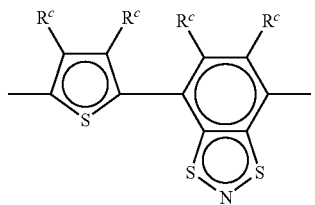
(F-8)
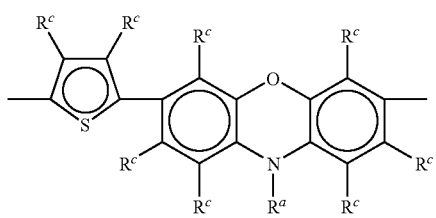
(F-9)
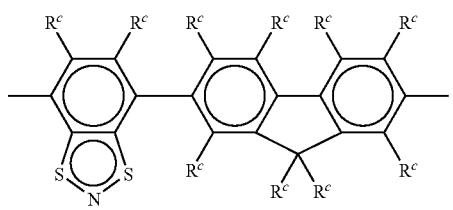
(F-10)
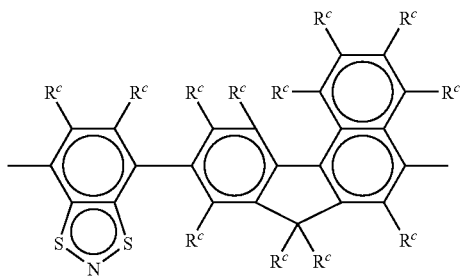
(F-11)
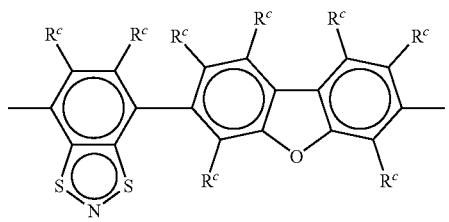
(F-12)
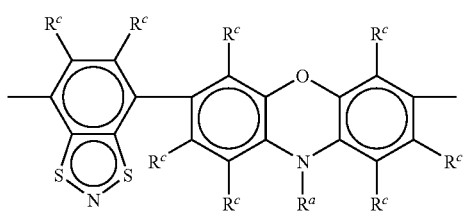
(F-13)
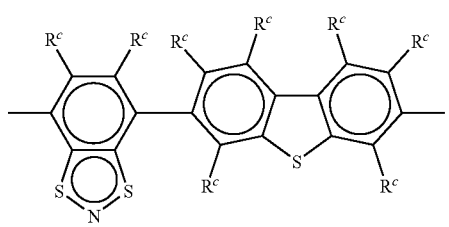

-continued
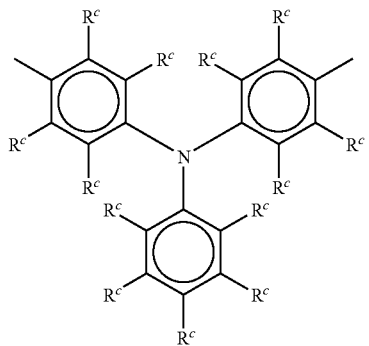
(G-1)
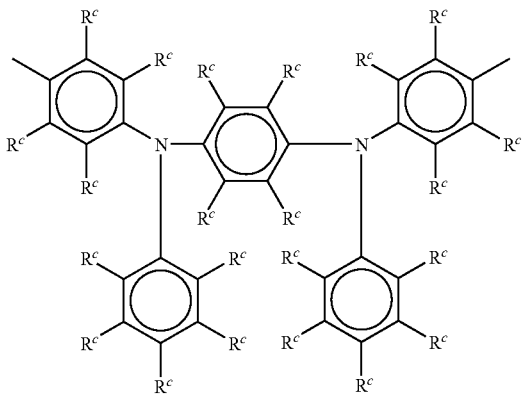
(G-2)
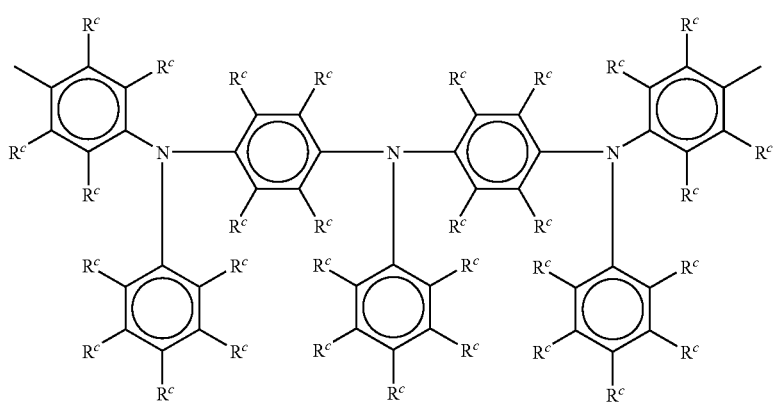
(G-3)
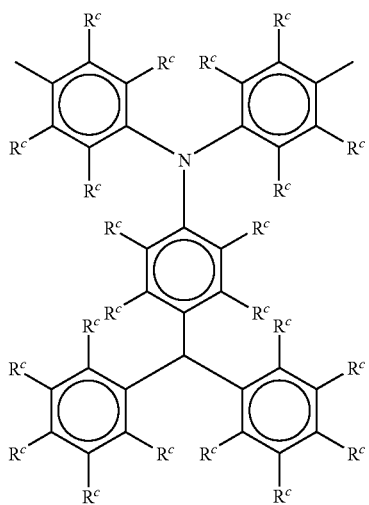
(G-4)
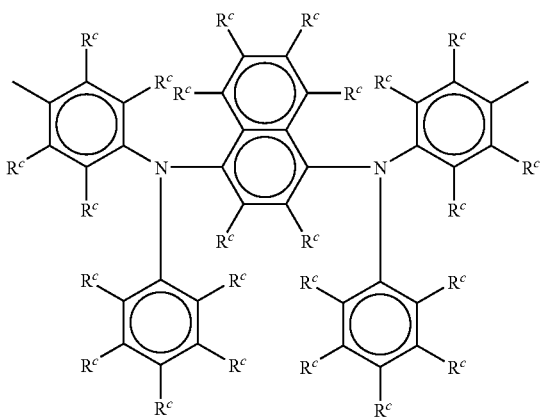
(G-5)

-continued
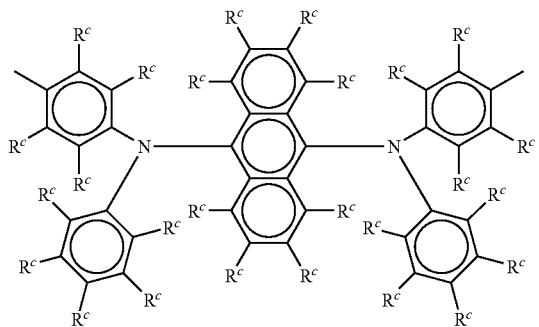
(G-6)
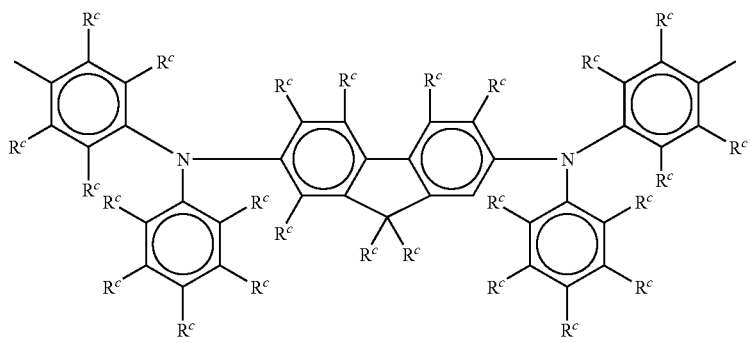
(G-7)
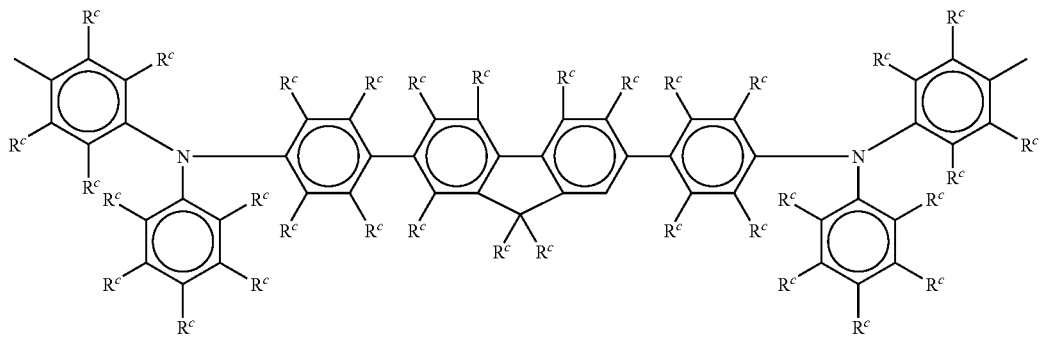
(G-8)
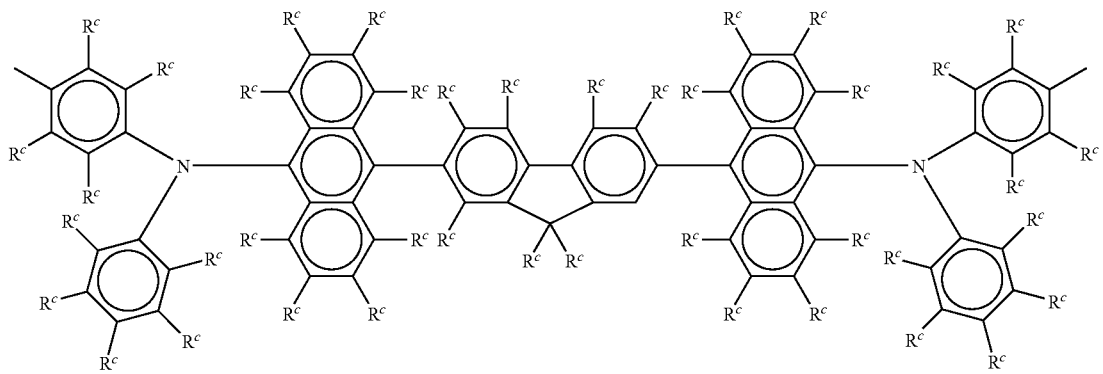
(G-9)

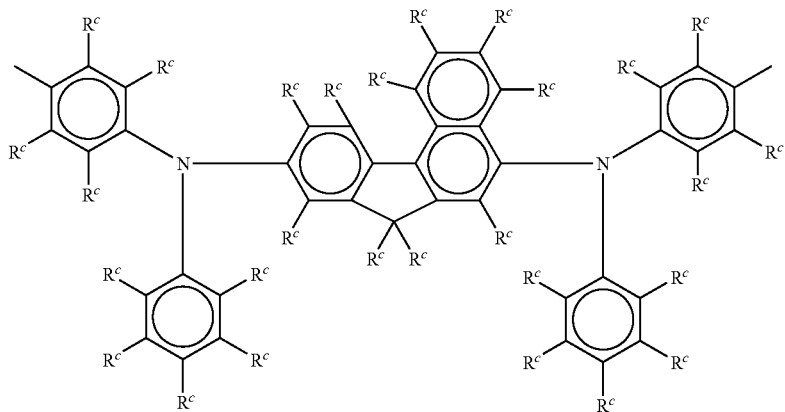
(G-10)
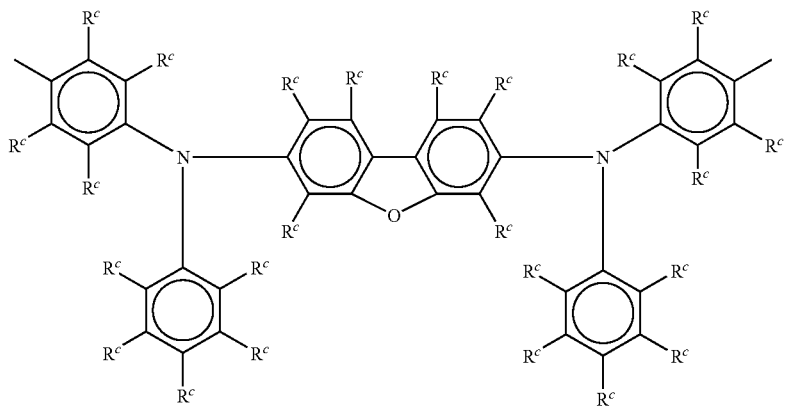
(G-11)
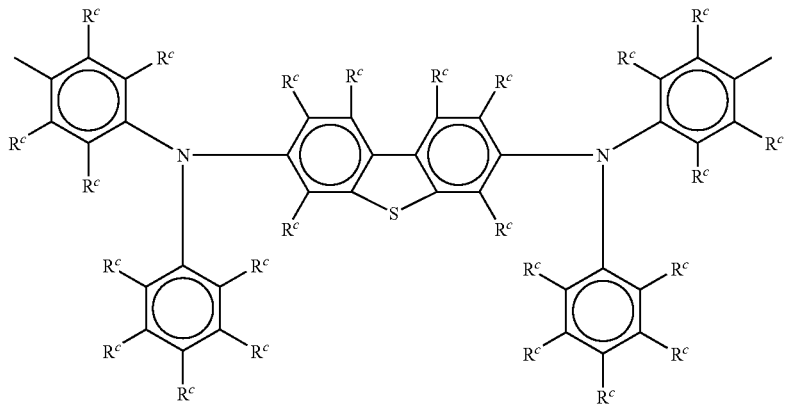
(G-12)
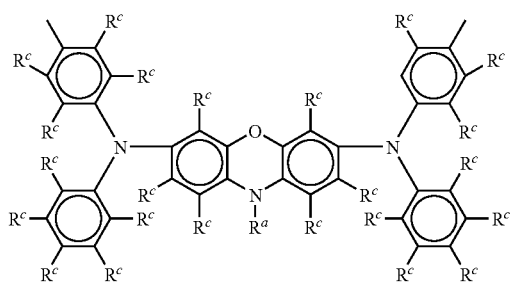
(G-13)
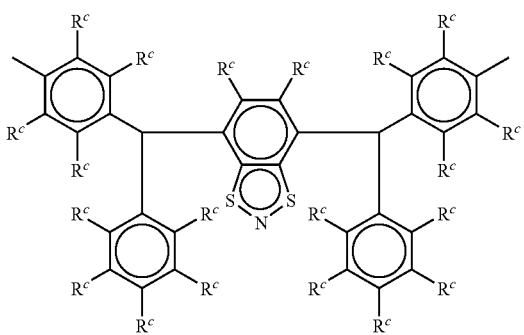
(G-14)

-continued
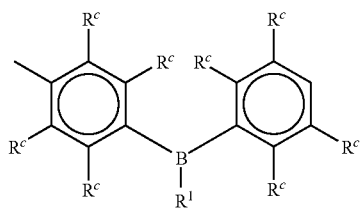 (H-1)
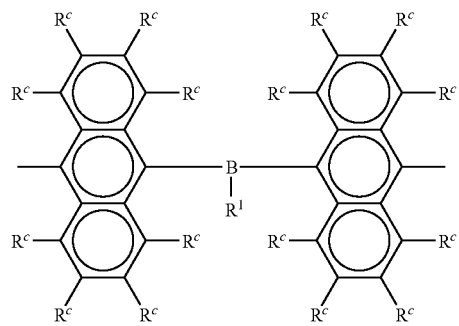 (H-2)
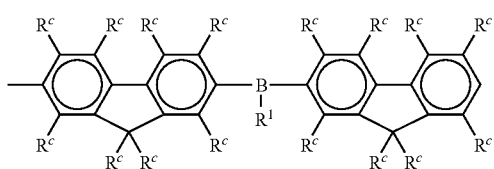 (H-3)
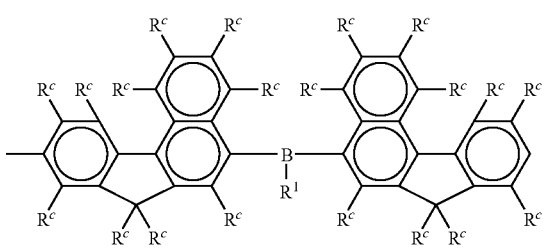 (H-4)
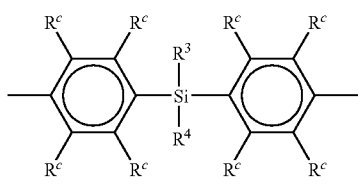 (H-5)
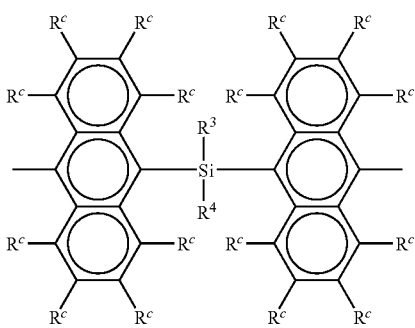 (H-6)
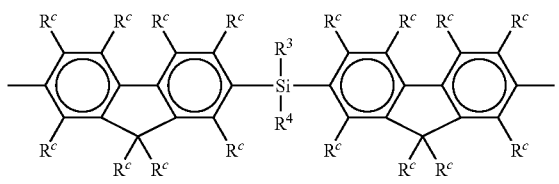 (H-7)
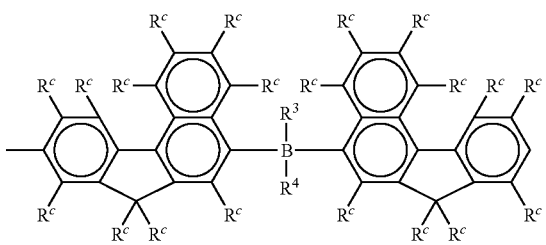 (H-8)
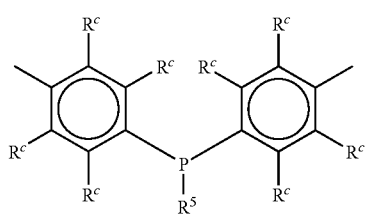 (H-9)
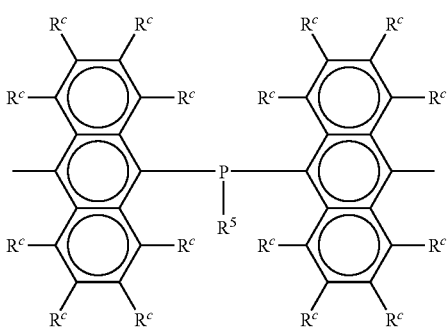 (H-10)

-continued
(H-11) 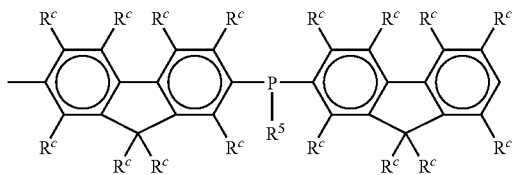
(H-12) 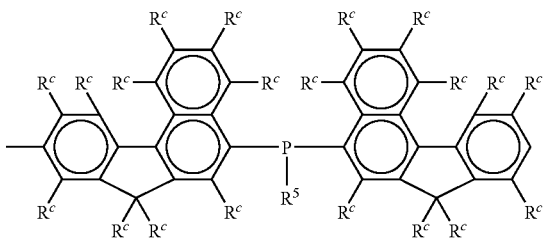
(J-1) 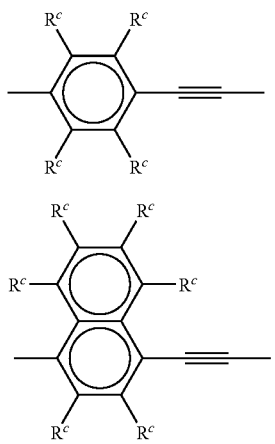
(J-2) 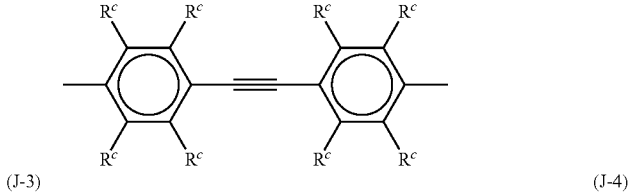
(J-3) 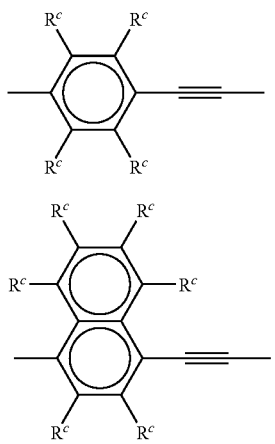
(J-4) 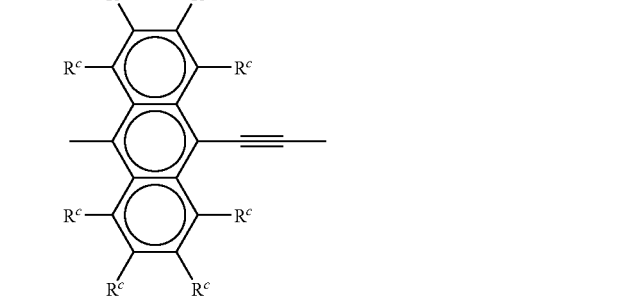
(J-5) 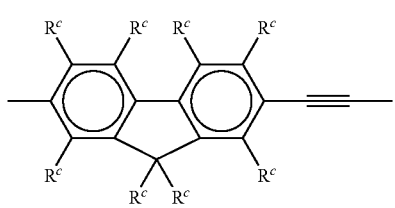
(J-6) 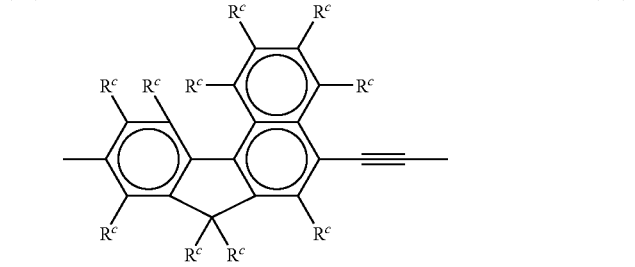
(J-7) 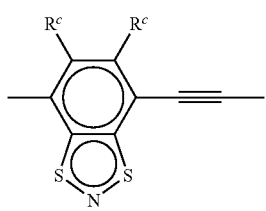
(J-8) 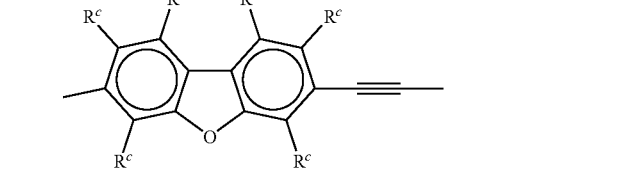
(J-9) 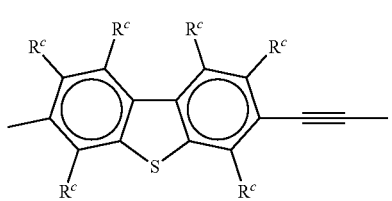
(J-10) 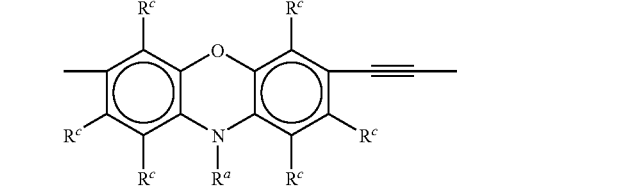
(J-11) 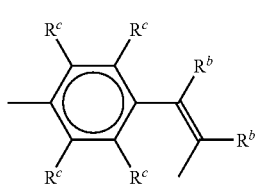
(J-12) 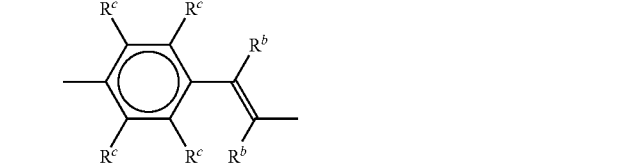

-continued
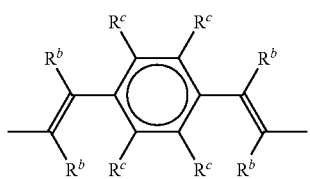 (J-13)
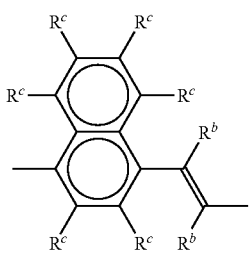 (J-14)
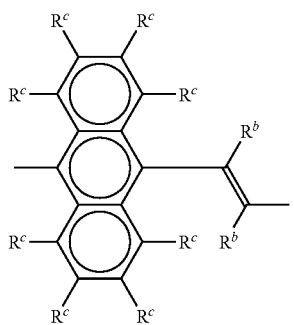 (J-15)
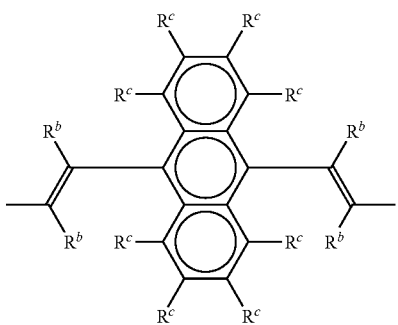 (J-16)
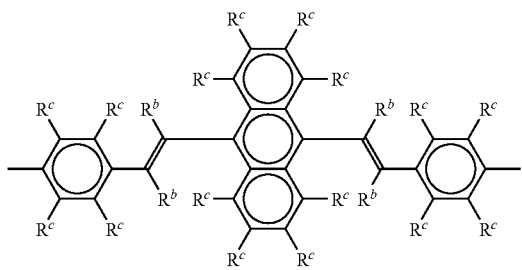 (J-17)
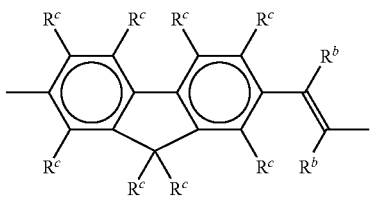 (J-18)
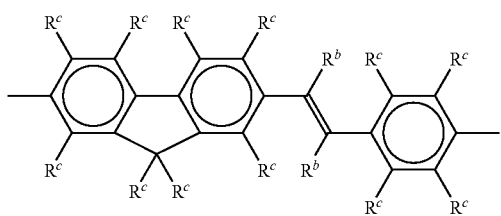 (J-19)
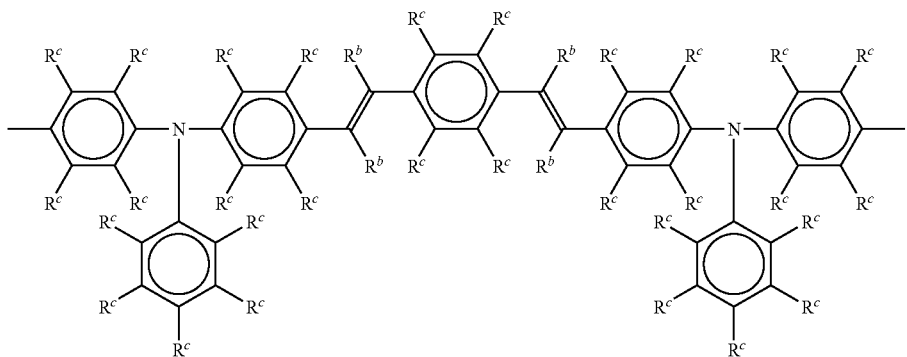 (J-20)

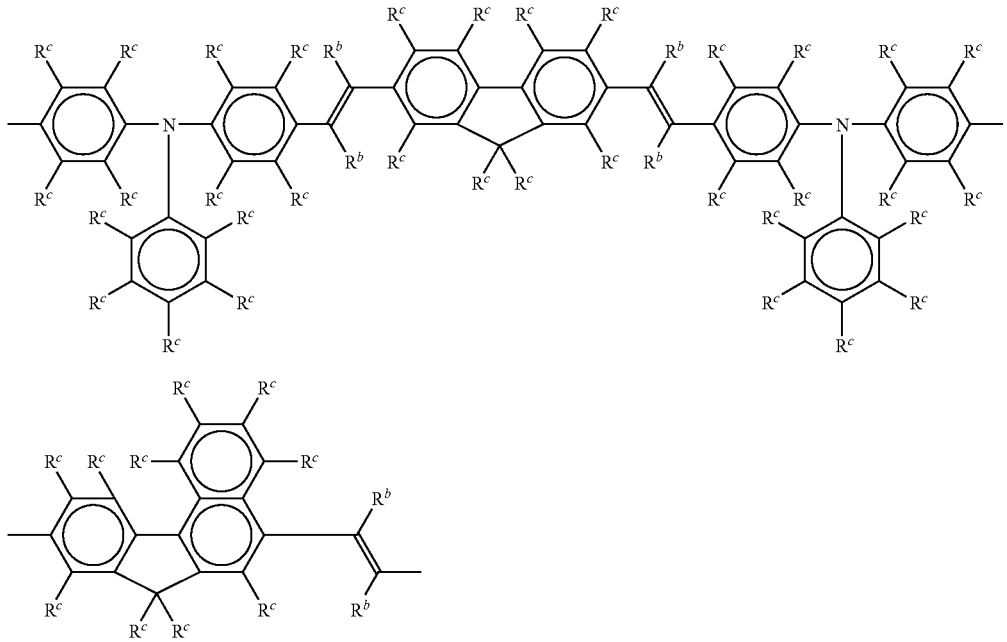

(J-21)

(J-22)

In the formula (1), Ar represents the same divalent group in an identical block, and two Ar's in adjacent two blocks are mutually different.

The block copolymer of the present invention has two Ar's when composed of 2 blocks of the formula (1), has two or more Ar's when composed of 3 blocks of the formula (1) and has four or more Ar's when composed of 4 or more blocks of the formula (1). Preferable is a case in which Ar's in different blocks represent all different divalent groups.

The block copolymer of the present invention has a polystyrene-reduced number average molecular weight (Mn) of usually about $1 \times 10^3$ to $1 \times 10^5$, preferably $1 \times 10^3$ to $1 \times 10^7$, more preferably $2 \times 10^3$ to $1 \times 10^6$, still preferably $5 \times 10^3$ to $5 \times 10^5$, further preferably $1 \times 10^4$ to $5 \times 10^5$, and particularly preferably $2 \times 10^4$ to $5 \times 10^5$. The polystyrene-reduced weight average molecular weight (Mw) is usually about $2 \times 10^3$ to $1 \times 10^8$, and from the standpoints of film formability, efficiency when made into a device, and the like, preferably $4 \times 10^3$ to $2 \times 10^7$, more preferably $1 \times 10^4$ to $5 \times 10^6$, still preferably $2 \times 10^4$ to $1 \times 10^6$, and further preferably $4 \times 10^4$ to $5 \times 10^5$. Mn and Mw can be measured by size exclusion chromatography (hereinafter, referred to as SEC).

In the formula (1), m's represent each independently a number of 1 or more showing the number average polymerization degree of a constitutional unit Ar present in one block. At least two of a plurality of m's present in the block copolymer of the present invention represent a number of 5 or more. Preferably, at least two of them represent a number of 5 to $5 \times 10^4$, more preferably, at least two of them represent a number of 5 to $5 \times 10^3$, still preferably, at least two of them represent a number of 10 to $1 \times 10^3$, further preferably, at least two of them represent a number of 15 to $5 \times 10^2$, and particularly preferably, at least two of them represent a number of 20 to $5 \times 10^2$.

The number average polymerization degree represented by m in one certain block is represented by the following formula (a-1) when the number average molecular weight of the block copolymer of the present invention is Mn, the mol fraction of the sum of constitutional units Ar in the block with respect to all constitutional units contained in the block copolymer of the present invention is Qa, and the chemical formula weight of the constitutional unit Ar in the block is Ma. Here, the chemical formula weight means the sum of relative atomic masses of atoms contained therein when represented by a composition formula, as described in Kagaku Jiten (1st edition, edited by Tokyo Kagaku Dojin, 1994), p. 253.

$$m=(Mn \times Qa)/Ma \qquad (a-1)$$

The block copolymer of the present invention has an end group in some cases. The end group is a monovalent group present on both ends of the block copolymer, and m in a block next to the end group represents a number of 2 or more. The block copolymer of the present invention may have two or more kinds of end groups.

The and groups of the block copolymer of the present invention are preferably selected each independently from a hydrogen atom, alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group, substituted phosphino group, hydroxyl group, sulfonic group and cyano group. As specific examples of the alkyl group, alkoxy group, alkylthio group, aryl group, aryloxy group, arylthio group, arylalkyl group, arylalkoxy group, arylalkylthio group, arylalkenyl group, arylalkynyl group, substituted amino group, substituted silyl group, halogen atom, acyl group, acyloxy group, imine residue, amide group, acid imide group, monovalent heterocyclic group, substituted carboxyl group and substituted phosphino group, the same specific examples as for an alkyl group, alkoxy group, alkylthio group, aryl group, aryloxy group, arylthio group, arylalkyl group, arylalkoxy group, arylalkylthio group, arylalkenyl group, arylalkynyl group, substituted amino group, substituted silyl group, halogen atom, acyl group, acyloxy group, imine residue, amide group, acid imide group, monovalent heterocyclic group, substituted carboxyl group and substituted phosphino group when $A^1$, $A^2$, $A^3$ and $A^4$ in the formula (2) have a substituent are mentioned, respectively.

The end groups of this block copolymer of the present invention are selected, from the standpoints of device properties and the like, preferably from a hydrogen atom, alkyl group, alkoxy group, aryl group, aryloxy group, arylalkyl group, arylalkoxy group, substituted amino group, substituted silyl group, acyl group, acyloxy group, imine residue, amide group, acid imide group, monovalent heterocyclic group and substituted phosphino group, more preferably from an alkyl group, alkoxy group, aryl group, aryloxy group, arylalkyl group, arylalkoxy group and substituted phosphino group, further preferably from an alkyl group, alkoxy group, aryl group and substituted phosphino group, and particularly selected from an alkyl group, alkoxy group and aryl group.

In the block copolymer of the present invention, end groups may mutually form a single bond thereby forming a cyclic structure.

In the block copolymer of the present invention, impurities such as a homopolymer and the like may be contained in an amount not deteriorating device properties.

The block copolymer of the present invention is composed of two or more of blocks of the formula (1). The block copolymer is composed of, from the standpoints of device properties, easiness of synthesis and the like, preferably 2 to 100 blocks, more preferably 2 to 50 blocks, still preferably 2 to 30 blocks, further preferably 2 to 20 blocks, further still preferably 2 to 10 blocks and particularly preferably 2 to 5 blocks.

Particularly, it is composed preferably of 2 to 4 blocks, more preferably 2 to 3 blocks, and further preferably of 2 blocks.

The copolymer composed of 2 to 10 blocks of the formula (1), as a preferable embodiment of the block copolymer of the present invention, is represented for example by the following formula (5):

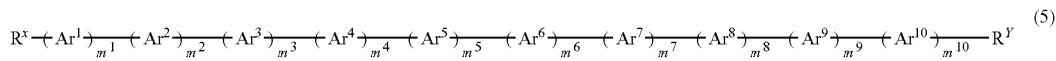

(in the formula (5), $Ar^1$, $Ar^2$, $Ar^3$, $Ar^4$, $Ar^5$, $Ar^6$, $Ar^7$, $Ar^8$, $Ar^9$ and $Ar^{10}$ represent each independently a conjugative divalent group and represent the same divalent group in an identical block, and these divalent groups in adjacent two blocks are mutually different. $R^X$ and $R^Y$ represent each independently an end group, alternatively, $R^X$ and $R^Y$ form one single bond giving a cyclic structure including mutual connection of two ends of the block copolymer. $m^1$, $m^2$, $m^3$, $m^4$, $m^5$, $m^6$, $m^7$, $m^8$, $m^9$ and $m^{10}$ represent each independently a number of 0 or more showing the number average polymerization degree of $Ar^1$, $Ar^2$, $Ar^3$, $Ar^4$, $Ar^5$, $Ar^6$, $Ar^7$, $Ar^8$, $Ar^9$ and $Ar^{10}$, respectively, and at least two of $m^1$, $m^2$, $m^3$, $m^4$, $m^5$, $m^6$, $m^7$, $m^8$, $m^9$ and $m^{10}$ represent a number of 5 or more. In the case of $m^1=5$ and $m^2=5$ and $m^3=m^4=m^5=m^6=m^7=m^8$, $m^9=m^{10}=0$, $Ar^1$ and $Ar^2$ represent mutually different groups. When $m^1$, $m^2$ and $m^3$ represent a number of 1 or more and at least two of $m^1$, $m^2$ and $m^3$ are numbers of 5 or more and $m^4=m^5=m^6=m^7=m^8=m^9=m^{10}=0$, then, $Ar^1$ and $Ar^2$ represent mutually different groups, $Ar^2$ and $Ar^3$ represent mutually different divalent groups and $Ar^1$ and $Ar^3$ may be mutually the same or different. When at least four of $m^1$, $m^2$, $m^3$, $m^4$, $m^5$, $m^5$, $m^7$, $m^8$, $m^9$ and $m^{10}$ represent a number of 1 or more and at least two of them represent a number of 5 or more, then, $Ar^1$, $Ar^2$, $Ar^3$, $Ar^4$, $Ar^5$, $Ar^6$, $Ar^7$, $Ar^8$, $Ar^9$ and $Ar^{10}$ represent four or more kinds of divalent groups).

In the formula (5), $Ar^1$, $Ar^2$, $Ar^3$, $Ar^4$, $Ar^5$, $Ar^6$, $Ar^7$, $Ar^8$, $Ar^9$ and $Ar^{10}$ represent each independently a conjugative divalent group and preferable examples thereof are the same as preferable examples for Ar.

In the formula (5), $R^X$ and $R^Y$ represent each independently an end group, alternatively, $R^X$ and $R^Y$ form one single bond giving a cyclic structure including mutual connection of two ends of the block copolymer. As the end group, those described above are mentioned. Two or more kinds of end groups represented by $R^X$ and $R^Y$ may present.

In the formula (5), $m^1$, $m^2$, $m^3$, $m^4$, $m^5$, $m^6$, $m^7$, $m^8$, $m^9$ and $m^{10}$ represent each independently a number of 0 or more showing the number average polymerization degree of $Ar^1$, $Ar^2$, $Ar^3$, $Ar^4$, $Ar^5$, $Ar^6$, $Ar^7$, $Ar^8$, $Ar^9$ and $Ar^{10}$, respectively, and at least two of $m^1$, $m^2$, $m^3$, $m^4$, $m^5$, $m^6$, $m^7$, $m^8$, $m^9$ and $m^{10}$ represent a number of 5 or more. When $R^X$ and $R^Y$ have an end group, the number average polymerization degree of a block next to 0 and is 2 or more.

The number average polymerization degree represented by $m^1$, $m^2$, $m^3$, $m^4$, $m^5$, $m^6$, $m^7$, $m^8$, $m^9$ and $m^{10}$ is represented by the following formula (a-2), when the number average molecular weight of the block copolymer of the present invention is Mn, the chemical formula weights of $Ar^1$, $Ar^2$, $Ar^3$, $Ar^4$, $Ar^5$, $Ar^6$, $Ar^7$, $Ar^8$, $Ar^9$ and $Ar^{10}$ are $Mn^1$, $Mn^2$, $Mn^3$, $Mn^4$, $Mn^5$, $Mn^6$, $Mn^7$, $Mn^8$, $Mn^9$ and $Mn^{10}$, respectively, and the mol fractions the sum of $Ar^1$'s, the sum of $Ar^2$'s, the sum of $Ar^3$'s, the sum of $Ar^4$'s, the sum of $Ar^5$'s, the sum of $Ar^6$'s, the sum of $Ar^7$'s, the sum of $Ar^8$'s, the sum of $Ar^9$'s and the sum of $Ar^{10}$'s with respect to all constitutional units contained in the block copolymer of the present invention are $Q^1$, $Q^2$, $Q^3$, $Q^4$, $Q^5$, $Q^6$, $Q^7$, $Q^8$, $Q^9$ and $Q^{10}$, respectively.

$$m^i = (Mn \times Q^i)/Mn^i \quad \text{(a-2)}$$

(in the formula (a-2), i represents 1, 2, 3, 4, 5, 6, 7, 8, 9 or 10).

At least two of $m^1$, $m^2$, $m^3$, $m^4$, $m^5$, $m^6$, $m^7$, $m^8$, $m^9$ and $m^{10}$ represent a number of 5 or more, preferably, at least two of them represent a number of 5 to $5 \times 10^4$, more preferably, at least two of them represent a number of 5 to $5 \times 10^3$, still preferably, at least two of them represent a number of 10 to $1 \times 10^3$, further preferably, at least two of them represent a number of 15 to $5 \times 10^2$, and particularly preferably, at least two of them represent a number of 20 to $5 \times 10^2$.

When at least four of $m^1$, $m^2$, $m^3$, $m^4$, $m^5$, $m^6$, $m^7$, $m^8$, $m^9$ and $m^{10}$ represent a number of 1 or more and at least two of them represent a number of 5 or more, there are four or more kinds of divalent groups represented by $Ar^1$, $Ar^2$, $Ar^3$, $Ar^4$, $Ar^5$, $Ar^6$, $Ar^7$, $Ar^8$, $Ar^9$ and $Ar^{10}$. Preferably there are seven or more kinds of, more preferably there are ten kinds of divalent groups represented by $Ar^1$, $Ar^2$, $Ar^3$, $Ar^4$, $Ar^5$, $Ar^6$, $Ar^7$, $Ar^8$, $Ar^9$ and $Ar^{10}$.

A case constituted of four blocks of the formula (1) as one of preferable embodiments of the block copolymer of the present invention is a case in which $m^1$, $m^2$, $m^3$ and $m^4$ represent each independently a number of 1 or more, at least two of $m^1$, $m^2$, $m^3$ and $m^4$ represent a number of 5 or more and $m^5=m^6=m^7=m^8=m^9=m^{10}=0$ in the formula (5), that is, a block copolymer of the following formula (5-A).

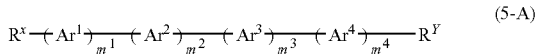

(5-A)

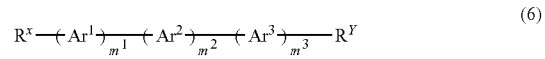

(6)

(in the formula (5-A), $Ar^1$, $Ar^2$, $Ar^3$ and $Ar^4$ represent each independently a conjugative divalent group optionally having a substituent and represent mutually different divalent groups. $R^X$ and $R^Y$ represent each independently an end group, alternatively, $R^X$ and $R^Y$ form one single bond giving a cyclic structure including mutual connection of two ends of the block copolymer. $m^1$, $m^2$, $m^3$ and $m^4$ represent each independently a number of 1 or more showing the number average polymerization degree of $Ar^1$, $Ar^2$, $Ar^3$ and $Ar^4$, respectively, and at least two of $m^1$, $m^2$, $m^3$ and $m^4$ represent a number of 5 or more).

In the formula (5-A), $Ar^1$, $Ar^2$, $Ar^3$ and $Ar^4$ represent each independently the same divalent group as that represented by Ar in the formula (1), and preferable examples thereof are the same as preferable examples for Ar. $Ar^1$, $Ar^2$, $Ar^3$ and $Ar^4$ represent mutually different divalent groups.

Preferable is a case in which at least one of $Ar^1$, $Ar^2$, $Ar^3$ and $Ar^4$ represents a divalent group of the above-described formula (C-11) or (C-15) and at least one of $Ar^1$, $Ar^2$, $Ar^3$ and $Ar^4$ represents a divalent group of the above-described formula (D-10-1), (D-16), (G-1), (G-2), (G-3) or (G-4), more preferable is a case in which $Ar^1$ and $Ar^2$ represent each independently a divalent group of the above-described formula (C-11) or (C-15) and $Ar^3$ and $Ar^4$ represent each independently a divalent group of the above-described formula (D-10-1), (D-16), (G-1), (G-2), (G-3) or (G-4), and further preferable is a case in which $Ar^1$ represents a divalent group of the formula (C-15), $Ar^2$ represents a divalent group of the formula (C-11), $Ar^3$ represents a divalent group of the formula (G-1) and $Ar^4$ represents a divalent group of the formula (D-10-1).

In the formula (5-A), $R^X$ and $R^Y$ represent each independently an end group, alternatively, $R^X$ and $R^Y$ form one single bond giving a cyclic structure including mutual connection of two ends of the block copolymer. As the end group, those described above are mentioned. Two or more kinds of end groups represented by $R^X$ and $R^Y$ may be present.

In the formula (5-A), $m^1$, $m^2$, $m^3$ and $m^4$ represent each independently a number of 1 or more showing the number average polymerization degree of $Ar^1$, $Ar^2$, $Ar^3$ and $Ar^4$, respectively, and at least two of $m^1$, $m^2$, $m^3$ and $m^4$ represent a number of 5 or more. $m^1$, $m^2$, $m^3$ and $m^4$ can be determined by a similar manner depending on i representing 1, 2, 3 or 4 in the formula (a-2).

At least two of $m^1$, $m^2$, $m^3$ and $m^4$ represent a number of 5 or more, preferably, at least two of them represent a number of 5 to $5 \times 10^4$, more preferably, at least two of them represent a number of 5 to $5 \times 10^3$, still preferably, at least two of them represent a number of 10 to $1 \times 10^3$, further preferably, at least two of them represent a number of 15 to $5 \times 10^2$, and particularly preferably, at least two of them represent a number of 20 to $5 \times 10^2$.

In the formula (5-A), when $R^X$ and $R^Y$ have an end group, the number average polymerization degree of a block next to $R^X$ and $R^Y$ is 2 or more.

A case constituted of three blocks of the formula (1) as one of preferable embodiments of the block copolymer of the present invention is a case in which $m^1$, $m^2$ and $m^3$ represent each independently a number of 1 or more, at least two of $m^1$, $m^2$ and $m^3$ represent a number of 5 or more and $m^4=m^5=m^6=m^7=m^8=m^9=m^{10}=0$ in the formula (5), that is, a block copolymer of the following formula (6).

(in the formula (6), $Ar^1$, $Ar^2$ and $Ar^3$ represent each independently a conjugative divalent group, $Ar^1$ and $Ar^2$ are mutually different, $Ar^2$ and $Ar^3$ are mutually different and $Ar^1$ and $Ar^3$ may be mutually the same or different. $R^X$ and $R^Y$ represent each independently an end group, alternatively, $R^X$ and $R^Y$ form one single bond giving a cyclic structure including mutual connection of two ends of the block copolymer. $m^1$, $m^2$ and $m^3$ represent each independently a number of 1 or more showing the number average polymerization degree of $Ar^1$, $Ar^2$ and $Ar^3$, respectively, and at least two of $m^1$, $m^2$ and $m^3$ represent a number of 5 or more).

In the formula (6), $Ar^1$, $Ar^2$ and $Ar^3$ represent each independently the same divalent group as that represented by Ar in the formula (1), and preferable examples thereof are the same as preferable examples for Ar.

In the formula (6), $Ar^1$ and $Ar^2$ represent mutually different divalent groups, $Ar^2$ and $Ar^3$ represent mutually different divalent groups and $Ar^1$ and $Ar^3$ may be mutually the same or different. In a preferable case, $Ar^1$ and $Ar^3$ represent mutually different divalent groups.

Preferable is a case in which at least one of $Ar^1$, $Ar^2$ and $Ar^3$ represents a divalent group of the above-described formula (C-11) or (C-15) and at least one of $Ar^1$, $Ar^2$ and $Ar^3$ represents a divalent group of the above-described formula (D-10-1), (D-16), (G-1), (G-2), (G-3) or (G-4), more preferable is a case in which $Ar^1$ represents a divalent group of the above-described formula (C-11) or (C-15) and $Ar^3$ represents a divalent group of the above-described formula (D-10-1), (D-16), (G-1), (G-2), (G-3) or (G-4), and further preferable is a case in which $Ar^1$ represents a divalent group of the formula (C-15), $Ar^2$ represents a divalent group of the formula (C-11) and $Ar^3$ represents a divalent group of the formula (G-1).

In the formula (6), $R^X$ and $R^Y$ represent each independently an end group, alternatively, $R^X$ and $R^Y$ form one single bond giving a cyclic structure including mutual connection of two ends of the block copolymer. As the end group, those described above are mentioned. Two or more kinds of end groups represented by $R^X$ and $R^Y$ may be present.

In the formula (6), $m^1$, $m^2$ and $m^3$ represent each independently a number of 1 or more showing the number average polymerization degree of $Ar^1$, $Ar^2$ and $Ar^3$, respectively, and at least two of $m^1$, $m^2$ and $m^3$ represent a number of 5 or more. $m^1$, $m^2$ and $m^3$ can be determined by a similar manner depending on i representing 1, 2 or 3 in the formula (a-2).

At least two of $m^1$, $m^2$ and $m^3$ represent a number of 5 or more, preferably, at least two of them represent a number of 5 to $5 \times 10^4$, more preferably, at least two of them represent a number of 5 to $5 \times 10^3$, still preferably, at least two of them represent a number of 10 to $1 \times 10^3$, further preferably, at least two of them represent a number of 15 to $5 \times 10^2$, and particularly preferably, at least two of them represent a number of 20 to $5 \times 10^2$.

In the formula (6), when $R^X$ and $R^Y$ have an end group, the number average polymerization degree of a block next to $R^X$ and $R^Y$ is 2 or more.

A case constituted of two blocks of the formula (1) as one of preferable embodiments of the block copolymer of the present invention is a case in which $m^1=5$ and $m^2=5$ and $m^3=m^4=m^5=m^6=m^7=m^8=m^9=m^{10}=0$ that is, a block copolymer of the following formula (7).

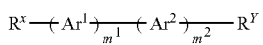 (7)

(in the formula (7), $Ar^1$ and $Ar^2$ represent each independently a conjugative divalent group, $Ar^1$ and $Ar^2$ are mutually different, and $R^X$ and $R^Y$ represent each independently an end group, alternatively, $R^X$ and $R^Y$ form one single bond giving a cyclic structure including mutual connection of two ends of the block copolymer. $m^1$ and $m^2$ represent each independently a number of 5 or more showing the number average polymerization degree of $Ar^1$ and $Ar^2$, respectively).

In the formula (7), $Ar^1$ and $Ar^2$ represent each independently the same divalent group as that represented by Ar in the formula (1), and preferable examples thereof are the same as preferable examples for Ar.

In the formula (7), $Ar^1$ and $Ar^2$ represent mutually different divalent groups.

Preferable is a case in which $Ar^1$ represents a divalent group of the above-described formula (C-11) or (C-15) and $Ar^2$ represents a divalent group of the above-described formula (D-10-1), (D-16), (G-1), (G-2), (G-3) or (G-4), and more preferable is a case in which $Ar^1$ represents a divalent group of the formula (C-11) or (C-15) and $Ar^2$ represents a divalent group, of the formula (D-10-1) or (G-1).

In the formula (7), $R^X$ and $R^Y$ represent each independently an end group, alternatively, $R^X$ and $R^Y$ form one single bond giving a cyclic structure including mutual connection of two ends of the block copolymer. As the end group, those described above are mentioned. Two or more kinds of end groups represented by $R^X$ and $R^Y$ may be present.

In the formula (7), $m^1$ and $m^2$ represent each independently a number of 5 or more showing the number average polymerization degree of $Ar^1$ and $Ar^2$, respectively. $m^1$ and $m^2$ can be determined by a similar manner depending on i representing 1 or 2 in the formula (a-2).

$m^1$ and $m^2$ represent each independently a number of 5 or more, preferably, they represent a number of 5 to $5 \times 10^4$, more preferably, they represent a number of 5 to $5 \times 10^3$, still preferably, they represent a number of 10 to $1 \times 10^3$, further preferably, they represent a number of 15 to $5 \times 10^2$, and particularly preferably, they represent a number of 20 to $5 \times 10^2$.

Of the block copolymers of the present invention, block copolymers produced by condensation-polymerization of two or more kinds of monomers of the following general formula (b) as raw materials are preferable.

Preferable methods of producing the block copolymer of the present invention will be described in detail below.

The block copolymer of the present invention can be produced by condensation-polymerization of two or more kinds of monomers of the following general formula (b) as raw materials.

$M^1$-Ar—$X^1$ (b)

(in the formula (b), Ar represents the same divalent group as that represented by Ar in the formula (1). $X^1$ represents a halogen atom, sulfonate group of the formula (c) or methoxy group. $M^1$ represents a borate group, boric group, group of the formula (d), group of the formula (e) or group of the formula (f))

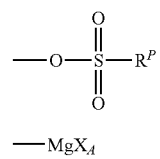 (c)

 (d)

(in the formulae (c) and (d), $X_A$ represents a halogen atom selected from the group consisting of a chlorine atom, bromine atom and iodine atom)

—$ZnX_A$ (e)

(in the formula (e), $X_A$ represents a halogen atom selected from the group consisting of a chlorine atom, bromine atom and iodine atom)

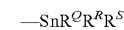 (f)

(in the formula (f), $R^Q$, $R^R$ and $R^S$ represent each independently an alkyl group or aryl group).

In the formula (b), $X^1$'s represent each independently a halogen atom, sulfonate group of the formula (c) or methoxy group.

Mentioned as the halogen atom $X^1$ in the formula (b) are a chlorine atom, bromine atom and iodine atom.

As the optionally substituted alkyl group or aryl group represented by $R^P$ in the formula (c), the same specific examples as those for an alkyl group and aryl group when $A^1$, $A^2$, $A^3$ and $A^4$ in the formula (2) have a substituent are mentioned, respectively. Examples of the sulfonate group of the formula (c) include a methanesulfonate group, trifluoromethanesulfonate group, phenylsulfonate group, 4-methylphenylsulfonate group and the like.

In the formula (b), $M^1$ represents a borate group, boric group (—$B(OH)_2$), group of the formula (d), group of the formula (e) or group of the formula (f).

As the borate group $M^1$ in the formula (b), for example, groups of the following formulae are exemplified.

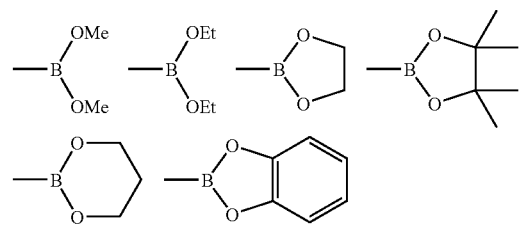

$R^Q$, $R^R$ and $R^S$ in the formula (f) represent each independently an alkyl group or aryl group. As specific examples thereof, the same specific examples as those for an alkyl group and aryl group when $A^1$, $A^2$, $A^3$ and $A^4$ in the formula (2) have a substituent are mentioned.

As the compound of the formula (b), those previously synthesized and isolated may be used, or the compound may be prepared in a reaction system which is then used as it is.

$M^1$ in the formula (b) represents, from the standpoints of simplicity of synthesis, easy handling, toxicity and the like, preferably a borate group, boric group (—$B(OH)_2$) of group of the formula (d).

In the condensation polymerization method, a monomer of the formula (b) is dissolved in an organic solvent if necessary, and this can be condensation-polymerized at the melting point or higher and the boiling point or lower of the organic solvent using an alkali or suitable catalyst. For example, a method of polymerization according to the Suzuki coupling reaction, a method of polymerization according to the Grignard reaction, a method of polymerization according to the Stille coupling and a method of polymerization according to the Negishi coupling, from the correspondent monomer, and the like are exemplified.

Of them, preferable are the method of polymerization according to the Suzuki coupling reaction and the method of polymerization according to the Grignard reaction, because of easiness of control of the structure. Among others, the method of polymerization according to the Suzuki coupling reaction is preferable.

The Suzuki coupling reaction can be carried out, for example, under reaction conditions described in Synthetic Communications, 1981, 11(7), 513.

By using a suitable catalyst, a carbon atom on Ar to which $X^1$ is connected in one certain molecule forms a bond to a carbon atom on Ar to which $M^1$ is connected in another molecule, in a monomer of the formula (b). For example, two molecules of a monomer of the formula (b) are reacted, a reaction formula as described in the following formula is generated.

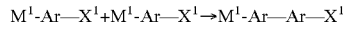

$$M^1\text{-Ar}\text{—}X^1 + M^1\text{-Ar}\text{—}X^1 \rightarrow M^1\text{-Ar}\text{—}Ar\text{—}X^1$$

(in the formula, Ar, $X^1$ and $M^1$ represent the same meanings as those for Ar, $X^1$ and $M^1$ in the formula (b)).

For example, by condensation polymerization of 1 mol of a compound having only $X^1$ such as $R^X\text{—}X^1$ or the like and $m^1$ mol of $M^1\text{-Ar}^1\text{—}X^1$, a polymer compound having only $X^1$ such as $R^X\text{—}(Ar^1)m^1\text{—}X^1$ is generated. By further condensation-polymerizing $m^2$ mol of $M^1\text{-Ar}^2\text{—}X^1$ to this polymer compound, a polymer compound composed of two blocks including a $Ar^1$ block and a $Ar^2$ block such as $R^X\text{—}(Ar^1)m^1\text{-}(Ar^2)m^2\text{—}X^1$ can be synthesized. Also a polymer compound composed of three or more blocks can be synthesized in a similar manner, and the order of arrangement of blocks can be appropriately altered. Here, $Ar^1$, $Ar^2$, $m^1$, $m^2$ and $R^X$ represent the same meanings as those for $Ar^1$, $Ar^2$, $m^1$, $m^2$ and $R^X$ in the formula (5), respectively, and $M^1$ and $X^1$ represent the same meanings as those for $M^1$ and $X^1$ in the formula (b), respectively.

Therefore, a block copolymer as represented by the formula (5) can be produced, for example, as described below.

In an example, 1) an end stopper such as $R^X\text{—}X^1$ or the like and $m^1$ mol of $M^1\text{-Ar}^1\text{—}X^1$ are reacted in the presence of a catalyst to synthesize $R^X\text{—}(Ar^1)_{m1}\text{—}X^1$, 2) $m^2$ mol or $M^1\text{-Ar}^2\text{—}X^1$ is reacted with respect to 1 mol of $R^X\text{—}(Ar^1)_{m1}\text{—}X^1$ in the presence of a catalyst to synthesize $R^X\text{—}(Ar^1)_{m1}\text{—}(Ar^2)_{m2}\text{—}X^1$, 3) $m^3$ mol of $M^1\text{-Ar}^3\text{—}X^1$ is reacted with respect to 1 mol of $R^X\text{—}(Ar^1)_{m1}\text{—}(Ar^2)_{m2}\text{—}X^1$ in the presence of a catalyst to synthesize $R^X\text{—}(Ar^1)_{m1}\text{—}(Ar^2)_{m2}\text{—}(Ar^3)_{m3}\text{—}X^1$, 4) $m^4$ mol of $M^1\text{-Ar}^4\text{—}X^1$ is reacted with respect to 1 mol of $R^X\text{—}(Ar^1)_{m1}\text{-}(Ar^2)_{m2}\text{—}(Ar^3)_{m3}\text{—}X^1$ in the presence of a catalyst to synthesize $R^X\text{—}(Ar^1)_{m1}\text{—}(Ar^2)_{m2}\text{—}(Ar^3)_{m3}\text{—}(Ar^4)_{m4}\text{—}X^1$, 5) $m^5$ mol of $M^1\text{-Ar}^5\text{—}X^1$ is reacted with respect to 1 mol of $R^X\text{—}(Ar^1)_{m1}\text{—}(Ar^2)_{m2}\text{—}(Ar^3)_{m3}\text{—}(Ar^4)_{m4}\text{—}X^1$ in the presence of a catalyst to synthesize $R^X\text{—}(Ar^1)_{m1}\text{—}(Ar^2)_{m2}\text{—}(Ar^3)_{m3}\text{—}(Ar^4)_{m4}\text{—}(Ar^5)_{m5}\text{—}X^1$, 6) $m^6$ mol of $M^1\text{-Ar}^6\text{—}X^1$ is reacted with respect to 1 mol of $R^X\text{—}(Ar^1)_{m1}\text{—}(Ar^2)_{m2}\text{—}(Ar^3)_{m3}\text{—}(Ar^4)_{m4}\text{—}(Ar^5)_{m5}\text{—}X^1$ in the presence of a catalyst to synthesize $R^X\text{—}(Ar^1)_{m1}\text{—}(Ar^2)_{m2}\text{—}(Ar^3)_{m3}\text{—}(Ar^4)_{m4}\text{—}(Ar^5)_{m5}\text{—}(Ar^6)_{m6}\text{—}X^1$, 7) $m^7$ mol of $M^1\text{-Ar}^7\text{—}X^1$ is reacted with respect to 1 mol of $R^X\text{—}(Ar^1)_{m1}\text{—}(Ar^2)_{m2}\text{—}(Ar^3)_{m3}\text{—}(Ar^4)_{m4}\text{—}(Ar^5)_{m5}\text{—}(Ar^6)_{m6}\text{—}X^1$ in the presence of a catalyst to synthesize $R^X\text{—}(Ar^1)_{m1}\text{—}(Ar^2)_{m2}\text{—}(Ar^3)_{m3}\text{—}(Ar^4)_{m4}\text{—}(Ar^5)_{m5}\text{—}(Ar^6)_{m6}\text{—}(Ar^7)_{m7}\text{—}X^1$, 8) $m^8$ mol of $M^1\text{-Ar}^8\text{—}X^1$ is reacted with respect to 1 mol of $R^X\text{—}(Ar^1)_{m1}\text{—}(Ar^2)_{m2}\text{—}(Ar^3)_{m3}\text{—}(Ar^4)_{m4}\text{—}(Ar^5)_{m5}\text{—}(Ar^6)_{m6}\text{—}(Ar^7)_{m7}\text{—}X^1$ in the presence of a catalyst to synthesize $R^X\text{—}(Ar^1)_{m1}\text{—}(Ar^2)_{m2}\text{-}(Ar^3)_{m3}\text{—}(Ar^4)_{m4}\text{—}(Ar^5)_{m5}\text{—}(Ar^6)_{m6}\text{—}(Ar^7)_{m7}\text{—}(Ar^8)_{m8}\text{—}X^1$, 9) $m^9$ mol of $M^1\text{-Ar}^9\text{—}X^1$ is reacted with respect to 1 mol of $R^X\text{—}(Ar^1)_{m1}\text{—}(Ar^2)_{m2}\text{—}(Ar^3)_{m3}\text{—}(Ar^4)_{m4}\text{—}(Ar^5)_{m5}\text{—}(Ar^6)_{m6}\text{—}(Ar^7)_{m7}\text{—}(Ar^8)_{m8}\text{—}X^1$ in the presence of a catalyst to synthesize $R^X\text{-}(Ar^1)_{m1}\text{—}(Ar^2)_{m2}\text{—}(Ar^3)_{m3}\text{—}(Ar^4)_{m4}\text{—}(Ar^5)_{m5}\text{—}(Ar^6)_{m6}\text{—}(Ar^7)_{m7}\text{—}(Ar^8)_{m8}\text{—}(Ar^9)_{m9}\text{—}X^1$, 10) $m^{10}$ mol of $M^1\text{-Ar}^{10}\text{—}X^1$ is reacted with respect to 1 mol of $R^X\text{—}(Ar^1)_{m1}\text{—}(Ar^2)_{m2}\text{—}(Ar^3)_{m3}\text{—}(Ar^4)_{m4}\text{—}(Ar^5)_{m5}\text{—}(Ar^6)_{m6}\text{—}(Ar^7)_{m7}\text{-}(Ar^8)_{m8}\text{—}(Ar^9)_{m9}\text{—}X^1$ in the presence of a catalyst to synthesize $R^X\text{—}(Ar^1)_{m1}\text{—}(Ar^2)_{m2}\text{—}(Ar^3)_{m3}\text{—}(Ar^4)_{m4}\text{—}(Ar^5)_{m5}\text{—}(Ar^6)_{m6}\text{—}(Ar^7)_{m7}\text{-}(Ar^8)_{m8}\text{—}(Ar^9)_{m9}\text{—}(Ar^{10})_{m10}\text{—}X^1$, and 11) an end stopper such as $R^Y\text{-}M^1$ or the like is reacted to $R^X\text{—}(Ar^1)_{m1}\text{—}(Ar^2)_{m2}\text{—}(Ar^3)_{m3}\text{—}(Ar^4)_{m4}\text{—}(Ar^5)_{m5}\text{—}(Ar^6)_{m6}\text{—}(Ar^7)_{m7}\text{—}(Ar^8)_{m8}\text{—}(Ar^9)_{m9}\text{—}(Ar^{10})_{m10}\text{—}X^1$ in the presence of a catalyst to synthesize $R^X\text{—}(Ar^1)_{m1}\text{—}(Ar^2)_{m2}\text{—}(Ar^3)_{m3}\text{—}(Ar^4)_{m4}\text{—}(Ar^5)_{m5}\text{—}(Ar^6)_{m6}\text{-}(Ar^7)_{m7}\text{—}(Ar^8)_{m8}\text{—}(Ar^9)_{m9}\text{—}(Ar^{10})_{m10}\text{—}R^Y$.

Here, $Ar^1$, $Ar^2$, $Ar^3$, $Ar^4$, $Ar^5$, $Ar^6$, $Ar^7$, $Ar^8$, $Ar^9$, $Ar^{10}$, $m^1$, $m^2$, $m^3$, $m^4$, $m^5$, $m^6$, $m^7$, $m^8$, $m^9$, $m^{10}$, $R^X$ and $R^Y$ represent the same meanings as those for $Ar^1$, $Ar^2$, $Ar^3$, $Ar^4$, $Ar^5$, $Ar^6$, $Ar^7$, $Ar^8$, $Ar^9$, $Ar^{10}$, $m^1$, $m^2$, $m^3$, $m^4$, $m^5$, $m^6$; $m^7$, $m^8$, $m^9$, $m^{10}$, $R^X$ and $R^Y$ in the formula (5), respectively, and $M^1$ and $X^1$ represent the same meanings as those for $M^1$ and $X^1$ in the formula (b), respectively.

In another example for synthesizing a block copolymer as represented by the formula (5), 1) an end stopped such as $R^X\text{-}M^1$ or the like and $m^1$ mol of $M^1\text{-Ar}^1\text{—}X^1$ are reacted in the presence of a catalyst to synthesize $R^X\text{—}(Ar^1)_{m1}\text{-}M^1$.

2) $m^2$ mol of $M^1\text{-Ar}^2\text{—}X^1$ is reacted with respect to 1 mol of $R^X\text{—}(Ar^1)_{m1}\text{-}M^1$ in the presence of a catalyst to synthesize $R^X\text{—}(Ar^1)_{m1}\text{—}(Ar^2)_{m2}\text{-}M^1$, 3) $m^3$ mol of $M^1\text{-Ar}^3\text{—}X^1$ is reacted with respect to 1 mol of $R^X\text{—}(Ar^1)_{m1}\text{—}(Ar^2)_{m2}\text{-}M^1$ in the presence of a catalyst to synthesize $R^X\text{—}(Ar^1)_{m1}\text{—}(Ar^2)_{m2}\text{—}(Ar^3)_{m3}\text{-}M^1$, 4) $m^4$ mol of $M^1\text{-Ar}^4\text{—}X^1$ is reacted with respect to 1 mol of $R^X\text{—}(Ar^1)_{m1}\text{—}(Ar^2)_{m2}\text{—}(Ar^3)_{m3}\text{-}M^1$ in the presence of a catalyst to synthesize $R^X\text{—}(Ar^1)_{m1}\text{-}(Ar^2)_{m2}\text{-}(Ar^3)_{m3}\text{—}(Ar^4)_{m4}\text{-}M^1$, 5) $m^5$ mol of $M^1\text{-Ar}^5\text{—}X^1$ is reacted with respect to 1 mol of $R^X\text{—}(Ar^1)_{m1}\text{—}(Ar^2)_{m2}\text{—}(Ar^3)_{m3}\text{—}(Ar^4)_{m4}\text{-}M^1$ in the presence of a catalyst to synthesize $R^X\text{—}(Ar^1)_{m1}\text{—}(Ar^2)_{m2}\text{—}(Ar^3)_{m3}\text{-}(Ar^4)_{m4}\text{—}(Ar^5)_{m5}\text{-}M^1$, 6) $m^6$ mol of $M^1\text{-Ar}^6\text{—}X^1$ is reacted with respect to 1 mol of $R^X\text{—}(Ar^1)_{m1}\text{—}(Ar^2)_{m2}\text{—}(Ar^3)_{m3}\text{—}(Ar^4)_{m4}\text{-}(Ar^5)_{m5}\text{-}M^1$ in the presence of a catalyst to synthesize $R^X\text{—}(Ar^1)_{m1}\text{—}(Ar^2)_{m2}\text{—}(Ar^3)_{m3}\text{—}(Ar^4)_{m4}\text{-}(Ar^5)_{m5}\text{-}(Ar^6)_{m6}\text{-}M^1$, 7) $m^7$ mol of $M^1\text{-Ar}^7\text{—}X^1$ is reacted with respect to 1 mol of $R^X\text{—}(Ar^1)_{m1}\text{—}(Ar^2)_{m2}\text{—}(Ar^3)_{m3}\text{—}(Ar^4)_{m4}\text{-}(Ar^5)_{m5}\text{—}(Ar^6)_{m6}\text{-}M^1$ in the presence of a catalyst to synthesize $R^X\text{—}(Ar^1)_{m1}\text{—}(Ar^2)_{m2}\text{—}(Ar^3)_{m3}\text{-}(Ar^4)_{m4}\text{—}(Ar^5)_{m5}\text{—}(Ar^6)_{m6}\text{-}(Ar^7)_{m7}\text{-}M^1$, 8) $m^8$ mol of $M^1\text{-Ar}^8\text{—}X^1$ is reacted with respect to 1 mol of $R^X\text{—}(Ar^1)_{m1}\text{—}(Ar^2)_{m2}$, $(Ar^3)_{m3}\text{—}(Ar^4)_{m4}\text{—}(Ar^5)_{m5}\text{—}(Ar^6)_{m6}\text{—}(Ar^7)_{m7}\text{-}M^1$ in the presence of a catalyst to synthesize $R^X\text{-}(Ar^1)_{m1}\text{—}(Ar^2)_{m2}\text{-}(Ar^3)_{m3}\text{—}(Ar^4)_{m4}\text{-}(Ar^5)_{m5}\text{—}(Ar^6)_{m6}\text{-}(Ar^7)_{m7}\text{-}(Ar^8)_{m8}\text{-}M^1$, 9) $m^9$ mol of $M^1$-$Ar^9$—$X^1$ is reacted with respect to 1 mol of $R^X$—$(Ar^1)_{m1}$—$(Ar^2)_{m2}$—$(Ar^3)_{m3}$—$(Ar^4)_{m4}$—$(Ar^5)_{m5}$—$(Ar^6)_{m6}$—$(Ar^7)_{m7}$-$(Ar^8)_{m8}$-$M^1$ in the presence of a catalyst to synthesize $R^X$-$(Ar^1)_{m1}$—$(Ar^2)_{m2}$—$(Ar^3)_{m3}$—$(Ar^4)_{m4}$—$(Ar^5)_{m5}$—$(Ar^6)_{m6}$-$(Ar^7)_{m7}$-$(Ar^8)_{m8}$-$(Ar^9)_{m9}$-$M^1$, 10) $m^{10}$ mol of $M^1$-$Ar^{10}$—$X^1$ is reacted with respect to 1 mol of $R^X$-$(Ar^1)_{m1}$—$(Ar^2)_{m2}$—$(Ar^3)_{m3}$—$(Ar^4)_{m4}$—$(Ar^5)_{m5}$-$(Ar^6)_{m6}$—$(Ar^7)_{m7}$-$(Ar^8)_{m8}$—$(Ar^9)_{m9}$-$M^1$ in the presence of a catalyst to synthesize $R^X$—$(Ar^1)_{m1}$—$(Ar^2)_{m2}$—$(Ar^3)_{m3}$—$(Ar^4)_{m4}$—$(Ar^5)_{m5}$—$(Ar^6)_{m6}$—$(Ar^7)_{m7}$-$(Ar^8)_{m8}$—$(Ar^9)_{m9}$—$(Ar^{10})_{m10}$-$M^1$, and 11) an end stopper such as $R^Y$—$X^1$ or the like is reacted to $R^X$—$(Ar^1)_{m1}$—$(Ar^2)_{m2}$—$(Ar^3)_{m3}$—$(Ar^4)_{m4}$-$(Ar^5)_{m5}$-$(Ar^6)_{m6}$-$(Ar^7)_{m7}$-$(Ar^8)_{m8}$—$(Ar^9)_{m9}$—$(Ar^{10})_{m10}$-$M^1$ in the presence of a catalyst to synthesize $R^X$—$(Ar^1)_{m1}$—$(Ar^2)_{m2}$—$(Ar^3)_{m3}$-$(Ar^4)_{m4}$-$(Ar^5)_{m5}$—$(Ar^6)_{m6}$-$(Ar^7)_{m7}$-$(Ar^8)_{m8}$-$(Ar^9)_{m9}$-$(Ar^{10})_{m10}$—$R^Y$.

Here, $Ar^1$, $Ar^2$, $Ar^3$, $Ar^4$, $Ar^5$, $Ar^6$, $Ar^7$, $Ar^8$, $Ar^9$, $Ar^{10}$, $m^1$, $m^2$, $m^3$, $m^4$, $m^5$, $m^6$, $m^7$, $m^8$, $m^9$, $m^{10}$, $R^X$ and $R^Y$ represent the same meanings as those for $Ar^1$, $Ar^2$, $Ar^3$, $Ar^4$, $Ar^5$, $Ar^6$, $Ar^7$, $Ar^8$, $Ar^9$, $Ar^{10}$, $m^1$, $m^2$, $m^3$, $m^4$, $m^5$, $m^6$, $m^7$, $m^8$, $m^9$, $m^{10}$, $R^X$ and $R^Y$ in the formula (5), respectively, and $M^1$ and $X^1$ represent the same meanings as those for $M^1$ and $X^1$ in the formula (b), respectively.

Likewise, a block copolymer as represented by the formula (5-A) can be produced, for example, as described below.

In an example, 1) an end stopper such as $R^X$—$X^1$ or the like and $m^1$ mol of $M^1$-$Ar^1$—$X^1$ are reacted in the presence of a catalyst to synthesize $R^X$-$(Ar^1)_{m1}$—$X^1$, 2) $m^2$ mol of $M^1$-$Ar^2$—$X^1$ is reacted with respect to 1 mol of $R^X$-$(Ar^1)_{m1}$—$X^1$ in the presence of a catalyst to synthesize $R^X$—$(Ar^1)_{m1}$-$(Ar^2)_{m2}$—$X^1$, 3) $m^3$ mol of $M^1$-$Ar^3$—$X^1$ is reacted with respect to 1 mol of $R^X$—$(Ar^1)_{m1}$—$(Ar^2)_{m2}$—$X^1$ in the presence of a catalyst to synthesize $R^X$—$(Ar^1)_{m1}$—$(Ar^2)_{m2}$-$(Ar^3)_{m3}$—$X^1$, 4) $m^4$ mol of $M^1$-$Ar^4$—$X^1$ is reacted with respect to 1 mol of $R^X$-$(Ar^1)_{m1}$—$(Ar^2)_{m2}$—$(Ar^3)_{m3}$—$X^1$ in the presence of a catalyst to synthesize $R^X$—$(Ar^1)_{m1}$—$(Ar^2)_{m2}$—$(Ar^3)_{m3}$—$(Ar^4)_{m4}$—$X^1$, and 5) an end stopper such as $R^Y$-$M^1$ or the like is reacted to $R^X$—$(Ar^1)_{m1}$—$(Ar^2)_{m2}$—$(Ar^3)_{m3}$—$(Ar^4)_{m4}$—$X^1$ in the presence of a catalyst to synthesize $R^X$—$(Ar^1)_{m1}$—$(Ar^2)_{m2}$—$(Ar^3)_{m3}$—$(Ar^4)_{m4}$—$R^X$.

Here, $Ar^1$, $Ar^2$, $Ar^3$, $Ar^4$, $m^1$, $m^2$, $m^3$, $m^4$, $R^X$ and $R^Y$ represent the same meanings as those for $Ar^1$, $Ar^2$, $Ar^3$, $Ar^4$, $m^1$, $m^2$, $m^3$, $m^4$, $R^X$ and $R^Y$ in the formula (5), respectively, and $M^1$ and $X^1$ represent the same meanings as those for $M^1$ and $X^1$ in the formula (b), respectively.

In another example for synthesizing a block copolymer as represented by the formula (5-A), 1) an end stopper such as $R^X$-$M^1$ or the like and $m^1$ mol of $M^1$-$Ar^1$—$X^1$ are reacted in the presence of a catalyst to synthesize $R^X$—$(Ar^1)_{m1}$-$M^1$.

2) $m^2$ mol of $M^1$-$Ar^2$—$X^1$ is reacted with respect to 1 mol of $R^X$—$(Ar^1)_{m1}$-$M^1$ in the presence of a catalyst to synthesize $R^X$—$(Ar^1)_{m1}$-$(Ar^2)_{m2}$-$M^1$.

3) $m^3$ mol of $M^1$-$Ar^3$—$X^1$ is reacted with respect to 1 mol of $R^X$—$(Ar^1)_{m1}$—$(Ar^2)_{m2}$-$M^1$ in the presence of a catalyst to synthesize $R^X$—$(Ar^1)_{m1}$—$(Ar^2)_{m2}$—$(Ar^3)_{m2}$-$M^1$, 4) $m^4$ mol of $M^1$-$Ar^4$—$X^1$ is reacted with respect to 1 mol of $R^X$—$(Ar^1)_{m1}$—$(Ar^2)_{m2}$—$(Ar^3)_{m3}$-$M^1$ in the presence of a catalyst to synthesize $R^X$—$(Ar^1)_{m1}$—$(Ar^2)_{m2}$—$(Ar^3)_{m3}$—$(Ar^4)_{m4}$-$M^1$, and 5) an end stopper such as $R^Y$—$X^1$ or the like is reacted to $R^X$—$(Ar^1)_{m1}$—$(Ar^2)_{m2}$—$(Ar^3)_{m3}$—$(Ar^4)_{m4}$-$M^1$ in the presence of a catalyst to synthesize $R^X$—$(Ar^1)_{m1}$—$(Ar^2)_{m2}$—$(Ar^3)_{m3}$—$(Ar^4)_{m4}$—$R^Y$.

Here, $Ar^1$, $Ar^2$, $Ar^3$, $Ar^4$, $m^1$, $m^2$, $m^3$, $m^4$, $R^X$ and $R^Y$ represent the same meanings as those for $Ar^1$, $Ar^2$, $Ar^3$, $Ar^4$, $m^1$, $m^2$, $m^3$, $m^4$, $R^X$ and $R^Y$ in the formula (5), respectively, and $m^1$ and $X^1$ represent the same meanings as those for $M^1$ and $X^1$ in the formula (b), respectively.

Likewise, in an example for synthesizing a block copolymer as represented by the formula (6), 1) an end stopper such as $R^X$—$X^1$ or the like and $m^1$ mol of $M^1$-$Ar^1$—$X^1$ are reacted in the presence of a catalyst to synthesize $R^X$—$(Ar^1)_{m1}$—$X^1$.

2) $m^2$ mol of $M^1$-$Ar^2$—$X^1$ is reacted with respect to 1 mol of $R^X$—$(Ar^1)_{m1}$—$X^1$ in the presence of a catalyst to synthesize $R^X$-$(Ar^1)_{m1}$—$(Ar^2)_{m2}$—$X^1$, 3) $m^3$ mol of $M^1$-$Ar^3$—$X^1$ is reacted with respect to 1 mol of $R^X$-$(Ar^1)_{m1}$—$(Ar^2)_{m2}$—$X^1$ in the presence of a catalyst to synthesize $R^X$—$(Ar^1)_{m1}$—$(Ar^2)_{m2}$-$(Ar^3)_{m3}$—$X^1$, and 4) an end stopper such as $R^X$-$M^1$ or the like is reacted to $R^X$—$(Ar^1)_{m1}$—$(Ar^2)_{m2}$—$(Ar^3)_{m3}$—$X^1$ in the presence of a catalyst to synthesize $R^X$-$(Ar^1)_{m1}$—$(Ar^2)_{m2}$—$(Ar^3)_{m3}$—$R^X$.

Here, $Ar^1$, $Ar^2$, $Ar^3$, $m^1$, $m^2$, $m^3$, $R^X$ and $R^Y$ represent the same meanings as those for $Ar^1$, $Ar^2$, $Ar^3$, $m^1$, $m^2$, $m^3$, $R^X$ and $R^Y$ in the formula (5), respectively, and $M^1$ and $X^1$ represent the same meanings as those for $M^1$ and $X^1$ in the formula (b), respectively.

In another example for synthesizing a block copolymer as represented by the formula (6).

1) an end stopper such as $R^X$-$M^1$ or the like and $m^1$ mol of $M^1$-$Ar^1$—$X^1$ are reacted in the presence of a catalyst to synthesize $R^X$—$(Ar^1)_{m1}$-$M^1$, 2) $m^2$ mol of $M^1$-$Ar^2$—$X^1$ is reacted with respect to 1 mol of $R^X$—$(Ar^1)_{m1}$-$M^1$ in the presence of a catalyst to synthesize $R^X$-$(Ar^1)_{m1}$—$(Ar^2)_{m2}$-$M^1$ 3) $m^3$ mol of $M^1$-$Ar^3$—$X^1$ is reacted with respect to 1 mol of $R^X$-$(Ar^1)_{m1}$-$(Ar^2)_{m2}$-$M^1$ in the presence of a catalyst to synthesize $R^X$—$(Ar^1)_{m1}$—$(Ar^2)_{m2}$—$(Ar^3)_{m3}$-$M^1$ and 4) an end stopper such as $R^Y$—$X^1$ or the like is reacted to $R^X$—$(Ar^1)_{m1}$—$(Ar^2)_{m2}$—$(Ar^3)_{m3}$-$M^1$ in the presence of a catalyst to synthesize $R^X$—$(Ar^1)_{m1}$—$(Ar^2)_{m2}$—$(Ar^3)_{m3}$—$R^Y$.

Here, $Ar^1$, $Ar^2$, $Ar^3$, $m^1$, $m^2$, $m^3$, $R^X$ and $R^Y$ represent the same meanings as those for $Ar^1$, $Ar^2$, $Ar^3$, $m^1$, $m^2$, $m^3$, $R^X$ and $R^Y$ in the formula (5), respectively, and $M^1$ and $X^1$ represent the same meanings as those for $M^1$ and $X^1$ in the formula (b), respectively.

Likewise, in an example for synthesizing a block copolymer as represented by the formula (7), 1) an end stopper such as $R^X$—$X^1$ or the like and $m^1$ mol of $M^1$-$Ar^1$—$X^1$ are reacted in the presence of a catalyst to synthesize $R^X$-$(Ar^1)_{m1}$—$X^1$, 2) $m^2$ mol, of $M^1$-$Ar^2$—$X^1$ is reacted with respect to 1 mol of $R^X$—$(Ar^1)_{m1}$—$X^1$ in the presence of a catalyst to synthesize $R^X$— $(Ar^1)_{m1}$—$(Ar^2)_{m2}$—$X^1$, and 3) an end stopper such as $R^Y$-$M^1$ or the like is reacted to $R^X$—$(Ar^1)_{m1}$—$(Ar^2)_{m2}$—$X^1$ in the presence of a catalyst to synthesize $R^X$—$(Ar^1)_{m1}$—$(Ar^2)_{m2}$—$R^X$.

Here, $Ar^1$, $Ar^2$, $m^1$, $m^2$, $R^X$ and $R^Y$ represent the same meanings as those for $Ar^1$, $Ar^2$, $m^1$, $m^2$, $R^X$ and $R^Y$ in the formula (5), respectively, and $M^1$ and $X^1$ represent the same meanings as those for $M^1$ and $X^1$ in the formula (b), respectively.

In another example for synthesizing a block copolymer as represented by the formula (7), 1) an end stopper such as $R^X$-$M^1$ or the like and $m^1$ mol of $M^1$-$Ar^1$—$X^1$ are reacted in the presence of a catalyst to synthesize $R^X$—$(Ar^1)_{m1}$-$M^1$, 2) $m^2$ mol of $M^1$-$Ar^2$—$X^1$ is reacted with respect to 1 mol of $R^X$—$(Ar^1)_{m1}$-$M^1$ in the presence of a catalyst to synthesize $R^X$-$(Ar^1)_{m1}$—$(Ar^2)_{m2}$-$M^1$, and 3) an end stopper such as $R^Y$—$X^1$ or the like is reacted to $R^X$—$(Ar^1)_{m1}$—$(Ar^2)_{m2}$-$M^1$ in the presence of a catalyst to synthesize $R^X$—$(Ar^1)_{m1}$—$(Ar^2)_{m2}$—$R^Y$.

Here, $Ar^1$, $Ar^2$, $m^1$, $m^2$, $R^X$ and $R^Y$ represent the same meanings as those for $Ar^1$, $Ar^2$, $m^1$, $m^2$, $R^X$ and $R^Y$ in the formula (5), respectively, and $M^1$ and $X^1$ represent the same meanings as those for $M^1$ and $X^1$ in the formula (b), respectively.

As the condensation polymerization catalyst, for example, catalysts are mentioned composed of a transition metal complex such as palladium[tetrakis(triphenylphosphine)], [tris(dibenzylideneacetone)]dipalladium, palladium acetate, bis(diphenylphosphinopropane)nickel, bis(cyclooctadiene)nickel and the like, and further, if necessary, a ligand such as triphenylphosphine, tri-t-butylphosphine, tricyclohexylphosphine, tris(2-methylphenyl)phosphine, tris(2-methoxyphenyl)phosphine, diphenylphosphinopropane, bipyridyl and the like.

In the case of condensation polymerization according to the Suzuki coupling reaction of a monomer represented by the formula (b) in which $X^1$ is selected from a halogen atom, sulfonate group of the formula (c) or methoxy group and $M^1$ is selected from the above-described borate group or —B(OH)$_2$ group, it is preferable to use catalysts composed of a palladium complex such as palladium[tetrakis(triphenylphosphine)], palladiumdichloro[bis(triphenylphosphine)], [tris(dibenzylideneacetone)]dipalladium, palladium acetate and the like, and further, if necessary, a ligand such as triarylphosphine such as triphenylphosphine, tris(2-methylphenyl)phosphine, tris(2-methoxyphenyl)phosphine and the like, trialkylphosphine such as tri-t-butylphosphine, tricyclohexylphosphine and the like, dialkylmonoarylphosphine such as di-t-butyro-biphenylphosphine and the like, monoalkyldiarylphosphine such as t-butyldiphenylphosphine and the like, carbene type ligands, and the like.

From the standpoints of enhancement of reactivity, suppression of side reactions, and the like, preferable are catalysts combining [tris(dibenzylideneacetone)]dipalladium or palladium acetate as a palladium complex and triarylphosphine as a ligand, more preferable is to use a catalyst prepared by combining [tris(dibenzylideneacetone)]dipalladium or palladium acetate as a palladium complex and tris(2-methylphenyl)phosphine or tris(2-methoxyphenyl)phosphine as a ligand, and further preferable is to use a catalyst prepared by combining [tris(dibenzylideneacetone)]dipalladiumtris and (2-methoxyphenyl)phosphine.

As the catalyst, those previously synthesized can be used, and those prepared in the reaction system can also be used. In the present invention, the catalysts can be used singly or in combination of two or more.

The catalyst can be used in any amount, and in general, the amount of a transition metal compound with respect to a compound of the formula (b) is preferably 0.001 to 300 mol %, more preferably 0.005 to 50 mol %, further preferably 0.01 to 20 mol %.

In condensation polymerization, a base is used if necessary in some cases. The base includes inorganic bases such as sodium carbonate, potassium carbonate, cesium carbonate, potassium fluoride, cesium fluoride, tripotassium phosphate and the like and aqueous solutions thereof, and organic bases such as tetrabutylammonium fluoride, tetrabutylammonium chloride, tetrabutylammonium bromide, tetrabutylammonium hydroxide and the like and aqueous solutions thereof. From the standpoints of enhancement of reactivity, suppression of side reactions, and the like, preferable are a sodium carbonate aqueous solution, potassium carbonate aqueous solution, cesium carbonate aqueous solution and tetrabutylammonium hydroxide aqueous solution, more preferable are a sodium carbonate aqueous solution and cesium carbonate aqueous solution, further preferable is a cesium carbonate aqueous solution.

The base can be used in any amount, and in general, the amount thereof with respect to a compound of the formula (b) is preferably 0.5 to 20 equivalents, more preferably 1 to 10 equivalents.

Though condensation polymerization can be carried out in the absence of a solvent, it is usually carried out in the presence of an organic solvent.

As the organic solvent to be used, tetrahydrofuran, toluene, 1,4-dioxane, dimethoxyethane, N,N-dimethylacetamide, N,N-dimethylformamide and the like are mentioned. These organic solvents may be used singly or in admixture of two or more.

The organic solvent is usually used in a proportion to give a monomer concentration of 0.1 to 90 wt %. The preferable proportion is 1 to 50 wt %, more preferable proportion is 2 to 30 wt %.

The organic solvent varies depending on compounds and reactions to be used, and in general, it is desirable to carry out a deoxidation treatment for suppressing side reactions.

In condensation polymerization, water may be used together in an amount not deteriorating the reaction.

The reaction temperature for performing condensation polymerization is not particularly restricted providing it is within a range in which the reaction medium remains liquid. The preferable temperature range is −100° C. to 200° C., more preferably −80° C. to 150° C., further preferably 0° C. to 120° C.

The reaction time varies depending on reaction conditions such as the reaction temperature and the like, and usually, it is 1 hour or longer, preferably 2 to 500 hours.

In some cases, it is desirable to carry out condensation polymerization under dehydration conditions if necessary. Particularly when $M^1$ in a compound of the formula (b) is a group of the formula (d), it is necessary to carry out condensation polymerization under dehydration conditions.

Post treatments can be carried out according to known methods. For example, a reaction solution is added into a lower alcohol such as methanol and the like to cause deposition of a precipitate which is then filtrated and dried, thus, an intended polymer compound can be obtained.

When the polymer compound obtained in the above-described post treatment has low purity, it can be purified by usual methods such as re-crystallization, continuous extraction by a Soxhlet extractor, column chromatography and the like.

Next, the polymer light emitting device of the present invention will be described.

The polymer light emitting device of the present invention is characterized in that an organic layer is present between electrodes composed of an anode and a cathode and the organic layer contains a block copolymer of the present invention.

The organic layer may be any of a light emitting layer, hole transporting layer, hole injection layer, electron transporting layer, electron injection layer, "interlayer" layer and the like, and the organic layer is preferably a light emitting layer.

Here, the light emitting layer means a layer having a function of light emission, the hole transporting layer means a layer having a function of transporting holes, and the electron transporting layer means a layer having a function of transporting electrons. The "interlayer" layer means a layer which is present adjacent to a light emitting layer between the light emitting layer and an anode, and has a function of insulating a light emitting layer and an anode, or a light emitting layer and a hole injection layer or hole transporting layer. The electron transporting layer and the hole transporting layer are generically called a charge transporting layer. The electron injection layer and the hole injection layer are generically called a charge injection layer. Two or more light emitting layers, two or more hole transporting layers, two or more hole injection layers, two or more electron transporting layers and two or more electron injection layers may be used each independently.

When the organic layer is a light emitting layer, the light emitting layer as an organic layer may further contain a hole transporting material, electron transporting material or light emitting material. Here, the light emitting material means a material showing fluorescence or phosphorescence.

When a block copolymer of the present invention and a hole transporting material are mixed, the mixing ratio of the hole transporting material based on the whole mixture is 1 wt % to 80 wt %, preferably 5 wt % to 60 wt %. When a block copolymer of the present invention and an electron transporting material are mixed, the mixing ratio of the electron transporting material based on the whole mixture is 1 wt % to 80 wt %, preferably 5 wt % to 60 wt %. Further, when a block copolymer of the present invention and a light emitting material are mixed, the mixing ratio of the light emitting material based on the whole mixture is 1 wt % to 80 wt %, preferably 5 wt % to 60 wt %. When a block copolymer of the present invention, a light emitting material, a hole transporting material and/or an electron transporting material are mixed, the mixing ratio of the light emitting material based on the whole mixture is 1 wt % to 50 wt %, preferably 5 wt % to 40 wt %, the ratio of the sum the hole transporting material and the electron transporting material is 1 wt % to 50 wt %, preferably 5 wt % to 40 wt %. Thus, the content of the block copolymer of the present invention is 98 wt % to 1 wt %, preferably 90 wt % to 20 wt %.

As the hole transporting material, electron transporting material and light emitting material to be mixed, known low molecular weight compounds, triplet light emitting complexes or polymer compounds can be used, and polymer compounds are preferably used.

Exemplified as the hole transporting material, electron transporting material and light emitting material as polymer compounds are polyfluorene, its derivatives and copolymers, polyarylene, its derivatives and copolymers, polyarylenevinylene, its derivatives and copolymers, and (co)polymers of aromatic amine and its derivatives disclosed in WO 99/13692, WO 99/48160, GB 2340304A, WO 00/53656, WO 01/19834, WO 00/55927, GB 2348316, WO 00/46321, WO 00/06665, WO 99/54943, WO 99/54385, U.S. Pat. No. 5,777,070, WO 98/06773, WO 97/05184, WO 00/35987, WO 00/53655, WO 01/34722, WO 99/24526, WO 00/22027, WO 00/22026, WO 98/27136, U.S. Pat. No. 573,636, WO 98/21262, U.S. Pat. No. 5,741,921, WO 97/09394, WO 96/29356, WO 96/10617, EP 0707020, WO 95/07955, JP-A Nos. 2001-181618, 2001-123156, 2001-3045, 2000-303066, 2000-351967, 2000-299189, 2000-252065, 2000-136379, 2000-104057, 2000-80167, 10-324870, 10-114891, 9-111233, 9-45478 and the like.

As the fluorescent material of lower molecular weight, there can be used, for example, naphthalene derivatives, anthracene or its derivatives, perylene or its derivatives, and polymethine, xanthene, coumarin and cyanine coloring matters, metal complexes of 8-hydroxyquinoline or its derivatives, aromatic amines, tetraphenylcyclopentadiene or its derivatives, or tetraphenylbutadiene or its derivatives, and the like.

Specifically, known compounds such as those described in, for example, JP-A Nos. 57-51781, 59-194393, and the like can be used.

As the triplet light emitting complex, for example, Ir(ppy)$_3$, Btp$_2$Ir(acac) containing iridium as a center metal, PtOEP containing platinum as a center metal, Eu(TTA)$_3$phen containing europium as a center metal, and the like are mentioned.

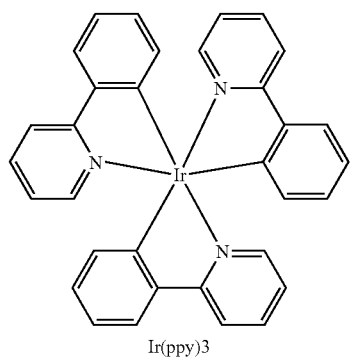

Ir(ppy)3

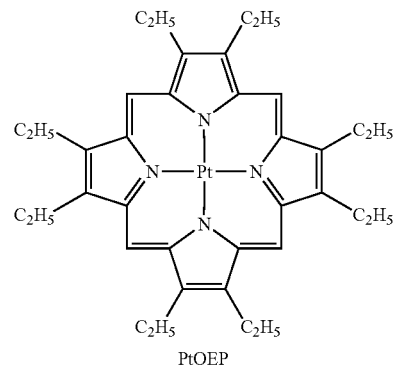

PtOEP

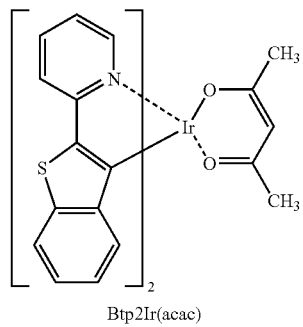

Btp2Ir(acac)

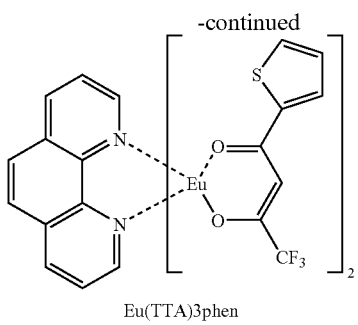

Eu(TTA)3phen

The triplet light emitting complex is described, for example, in Nature, (1998), 395, 151, Appl. Phys. Lett. (1999), 75(1), 4, Proc. SPIE-Int. Soc. Opt. Eng. (2001). 4105 (Organic Light-Emitting Materials and Devices IV), 119, J. Am. Chem. Soc., (2001), 123, 4304, Appl. Phys. Lett., (1997), 71(18). 2596, Syn. Met., (1998), 94(1), 103, Syn. Met., (1999), 99(2), 1361, Adv. Mater., (1999), 11(10), 852, Jpn. J. Appl. Phys., 34, 1883 (1995), and the like.

The polymer composition of the present invention contains at least one material selected from hole transporting materials, electron transporting materials and light emitting materials, and a block copolymer of the present invention, and can be used as a light emitting material or charge transporting material.

The content ratio of at least one material selected from hole transporting materials, electron transporting materials and light emitting materials to a block copolymer of the present invention may be determined depending on use, and in the case of use of a light emitting material, the same content ratio as in the above-described light emitting layer is preferable.

The polymer composition of the present invention has a polystyrene-reduced number average molecular weight of usually about $10^3$ to $10^8$, preferably $10^4$ to $10^6$. The polystyrene-reduced weight average molecular weight is usually about $10^3$ to $10^8$, and from the standpoint of film formability and from the standpoint of efficiency when made into a device, preferably $1 \times 10^4$ to $5 \times 10^6$. Here, the average molecular weight of a polymer composition is a value obtained by SEC analysis of a composition obtained by mixing two or more polymer compounds.

The thickness of a light emitting layer of a polymer light emitting device of the present invention manifests the optimum value varying depending on the material to be used, and may be advantageously selected so as to give optimum driving voltage and light emission efficiency, and it is, for example, 1 nit to 1 μm, preferably 2 nm to 500 nm, further preferably 5 nm to 200 nm.

As the method for forming a light emitting layer, for example, a method of film formation from a solution is exemplified. As the film formation method from a solution, application methods such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like can be used. Printing methods such as a screen printing method, flexo printing method, offset printing method, inkjet printing method and the like are preferable since pattern formation and multicolor separate painting are easy.

As the ink composition used in printing methods, at least one of block copolymers of the present invention may be advantageously contained, and in addition to the block copolymer of the present invention, additives such as a hole transporting material, electron transporting material, light emitting material, solvent, stabilizer and the like may be contained.

The ratio of a block copolymer of the present invention in the ink composition is usually 20 wt % to 100 wt %, preferably 40 wt % to 100 wt % based on the total weight of the composition excepting a solvent.

The ratio of a solvent when the ink composition contains a solvent is 1 wt % to 99.9 wt %, preferably 60 wt % to 99.5 wt %, further preferably 80 wt % to 99.0 wt % based on the total weight of the composition.

Though the viscosity of an ink composition varies depending on a printing method, when an ink composition passes through a discharge apparatus such as in an inkjet print method and the like, the viscosity at 2520 is preferably in a range of 1 to 20 mPa·s, for preventing clogging and curving in flying in discharging.

The solution of the present invention may contain additives for regulating viscosity and/or surface tension in addition to the block copolymer of the present invention. As the additive, a polymer compound (thickening agent) having high molecular weight for enhancing viscosity and a poor solvent, a compound of low molecular weight for lowering viscosity, a surfactant for lowering surface tension, and the like may be appropriately combined and used.

As the above-described polymer compound having high molecular weight, a compound which is soluble in the same solvent as for the block copolymer of the present invention and which does not disturb light emission and charge transportation may be used. For example, polystyrene of high molecular weight, polymethyl methacrylate, block copolymers of the present invention having larger molecular weights, and the like can be used. The weight-average molecular weight is preferably 500000 or more, more preferably 1000000 or more.

It is also possible to use a poor solvent as a thickening agent. Namely, by adding a small amount of poor solvent for solid components in a solution, viscosity can be enhanced. When a poor solvent is added for this purpose, the kind and addition amount of the solvent may be advantageously selected in a range not causing deposition of solid components in a solution. When stability in preservation is taken into consideration, the amount of a poor solvent is preferably 50 wt % or less, further preferably 30 wt % or less based on the whole solution.

The solution of the present invention may contain an antioxidant in addition to the block copolymer of the present invention for improving preservation stability. As the antioxidant, a compound which is soluble is the same solvent as for the block copolymer of the present invention and which does not disturb light emission and charge transportation is permissible, and exemplified are phenol-type antioxidants, phosphorus-based antioxidants and the like.

Though the solvent to be used as an ink composition is not particularly restricted, compounds which can dissolve or uniformly disperse materials other than the solvent constituting the ink composition are preferable. Exemplified as the solvent are chlorine-based solvents such as chloroform, methylene chloride, 1,2-dichloroethane, 1,1,2-trichloroethane, chlorobenzene, o-dichlorobenzene and the like, ether solvents such as tetrahydrofuran, dioxane, anisole and the like, aromatic hydrocarbon solvents such as toluene, xylene and the like, aliphatic hydrocarbon solvents such as cyclohexane, methylcyclohexane, n-pentane, n-hexane, n-heptane, n-octane, n-nonane, n-decane and the like, ketone solvents such as acetone, methyl ethyl ketone, cyclohexanone, benzophenone, acetophenone and the like, ester solvents such as ethyl acetate, butyl acetate, ethylcellosolve acetate, methyl benzoate, phenyl acetate and the like, polyhydric alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol and the like and derivatives thereof, alcohol solvents such as methanol, ethanol, propanol, isopropanol, cyclohexanol and the like, sulfoxide solvents such as dimethyl sulfoxide and the like, amide solvents such as N-methyl-2-pyrrolidone, N,N-dimethylformamide and the like. These organic solvents can be used singly or in combination of two or more.

Of them, preferable from the standpoints of solubility of a polymer compound and the like, uniformity in film formation, viscosity property and the like are aromatic hydrocarbon solvents, ether solvents, aliphatic hydrocarbon solvents, ester solvents and ketone solvents, and preferable are toluene, xylene, ethylbenzene, diethylbenzene, trimethylbenzene, n-propylbenzene, isopropylbenzene, n-butylbenzene, isobutylbenzene, s-butylbenzene, n-hexylbenzene, cyclohexylbenzene, 1-methylnaphthalene, tetralin, anisole, ethoxybenzene, cyclohexane, bicyclohexyl, cyclohexenylcyclohexanone, n-heptylcyclohexane, n-hexylcyclohexanone, decalin, methyl benzoate, cyclohexanone, 2-propylcyclohexanone, 2-heptanone, 3-heptanone, 4-heptanone, 2-octanone, 2-nonanone, 2-decanone, dicyclohexylketone, acetophenone and benzophenone.

The number of solvents in a solution is preferably 2 or more, more preferably 2 to 3, further preferably 2, from the standpoint of film formability and from the standpoints of device properties and the like.

When two solvents are contained in a solution, one of them may be solid at 25° C. From the standpoint of film formability, it is preferable that one solvent has a boiling point of 180° C. or higher, and a solvent having a boiling point of 200° C. or higher is more preferable. From the standpoint of viscosity, it is preferable that an aromatic polymer is dissolved in an amount of 1 wt % or more at 60° C. in both solvents, and it is preferable that one of two solvents dissolves an aromatic polymer in an amount of 1 wt % or more at 25° C.

When two or more solvents are contained in a solution, the content of a solvent having highest boiling point is preferably 40 to 90 wt %, more preferably 50 to 90 wt %, further preferably 65 to 85 wt % based on the weight of all solvents in the solution from the standpoints of viscosity and film formability.

Block copolymers of the present invention may be contained singly or in combination of two or more in a solution, and a polymer compound other than the block copolymers of the present invention may also be contained in a range not deteriorating device properties and the like.

The solution of the present invention may contain water, metal and its salt in an amount of 1 to 1000 ppm. As the metal, specifically, lithium, sodium, calcium, potassium, iron, copper, nickel, aluminum, zinc, chromium, manganese, cobalt, platinum, iridium and the like are mentioned. Further, silicon, phosphorus, fluorine, chlorine and/or bromine may be contained in an amount of 1 to 1000 ppm.

Using a solution of the present invention, a thin film can be formed by a spin coat method, casting method, micro gravure coat method, gravure coat method, bar coat method, roll coat method, wire bar coat method, dip coat method, spray coat method, screen printing method, flexo printing method, offset printing method, inkjet printing method and the like. Particularly, a solution of the present invention is preferably used for film formation by a screen printing method, flexo printing method, offset printing method or inkjet printing method, and more preferably used for film formation by an inkjet method.

When a thin film is formed using a solution of the present invention, baking at temperatures of 100° C. or higher is possible since a polymer compound contained in the solution has high glass transition temperature, and even if baking is performed at a temperature of 130° C., lowering of device properties is very small. Depending on the kind of the polymer compound, baking at temperatures of 160° C. or higher is also possible.

As the thin film which can be formed using a solution of the present invention, exemplified are a light emitting thin film, electric conductive thin film and organic semiconductor thin film.

The electric conductive thin film of the present invention preferably has a surface resistance of 1 K$\Omega$/□ or less. By doping a thin film with a Lewis acid, ionic compound and the like, electric conductivity can be enhanced. The surface resistance is preferably 100$\Omega$/□ or less, further preferably 10$\Omega$/□ or less.

In the organic semiconductor thin film of the present invention, one larger parameter of electron mobility or hole mobility is preferably $10^{-5}$ cm$^2$/V/s or more. More preferably, it is $10^{-3}$ cm$^2$/V/s or more, and further preferably $10^{-1}$ cm$^2$/V/s or more.

By forming the organic semiconductor thin film on a Si substrate carrying a gate electrode and an insulation film of SiO$_2$ and the like formed thereon, and forming a source electrode and a drain electrode with Au and the like, an organic transistor can be obtained.

In the polymer light emitting device of the present invention, the maximum external quantum yield when a voltage of 3.5 V or more is applied between an anode and a cathode is preferably 1% or more, more preferably 1.5% or more from the standpoints of device luminance and the like.

As the polymer light emitting device of the present invention, mentioned are a polymer light emitting device having an electron transporting layer provided between a cathode and a light emitting layer, a polymer light emitting device having a hole transporting layer provided between an anode and a light emitting layer, a polymer light emitting device having an electron transporting layer provided between a cathode and a light emitting layer and a hole transporting layer provided between an anode and a light emitting layer, and the like.

For example, the following structures a) to d) are specifically mentioned.

a) anode/light emitting layer/cathode
b) anode/hole transporting layer/light emitting layer/cathode
c) anode/light emitting layer/electron transporting layer/cathode
d) anode/hole transporting layer/light emitting layer/electron transporting layer/cathode (wherein, / means adjacent lamination of layers, being applicable also in the followings)

Also exemplified are structures having an "interlayer" layer provided adjacent to a light emitting layer between the light emitting layer and an anode in the above-described structures. That is, the following structures a') to d') are exemplified.

a') anode/"interlayer" layer/light emitting layer/cathode
b') anode/hole transporting layer/"interlayer" layer/light emitting layer/cathode
c') anode/"interlayer" layer/light emitting layer/electron transporting layer/cathode
d') anode/hole transporting layer/"interlayer" layer/light emitting layer/electron transporting layer/cathode When the polymer light emitting device of the present invention contains a hole transporting layer, exemplified as the hole transporting material to be used are polyvinylcarbazole or its derivatives, polysilane or its derivatives, polysiloxane derivatives having an aromatic amine on the side chain or main chain, pyrazoline derivatives, arylamine derivatives, stilbene derivatives, triphenyldiamine derivatives, polyaniline or its derivatives, polythiophene or its derivatives, polypyrrole or its derivatives, poly(p-phenylenevinylene) or its derivatives, poly(2,5-thienylenevinylene) or its derivatives, and the like.

Specifically, exemplified as the hole transporting material are those described in JP-A Nos. 63-70257, 63-175860, 2-135359, 2-135361, 2-209988, 3-37992 and 3-152184, and the like.

Among them, preferable as the hole transporting material used in a hole transporting layer are polymer hole transporting materials such as polyvinylcarbazole or its derivatives, polysilane or its derivatives, polysiloxane derivatives having an aromatic amine compound group on the side chain or main chain, polyaniline or its derivatives, polythiophene or its derivatives, poly(p-phenylenevinylene) or its derivatives, poly(2,5-thienylenevinylene) or its derivatives, and the like, and further preferable are polyvinylcarbazole or its derivatives, polysilane or its derivatives, and polysiloxane derivatives having an aromatic amine on the side chain or main chain.

Exemplified as the hole transporting material of low molecular weight are pyrazoline derivatives, arylamine derivatives, stilbene derivatives, and triphenyldiamine derivatives. In the case of the hole transporting material of low molecular weight, it is preferably dispersed in a polymer binder in use.

The polymer binder to be mixed is preferably that which does not extremely disturb charge transportation, and those showing no strong absorption against visible ray are suitably used. Exemplified as the polymer binder are poly(N-vinylcarbazole), polyaniline or its derivatives, polythiophene or its derivatives, poly(p-phenylenevinylene) or its derivatives, poly(2,5-thienylenevinylene) or its derivatives, polycarbonate, polyacrylate, polymethyl acrylate, polymethyl methacrylate, polystyrene, polyvinyl chloride, polysiloxane and the like.

Polyvinylcarbazole or its derivative can be obtained, for example, from a vinyl monomer by cation polymerization or radical polymerization.

As the polysilane or its derivative, compounds described in Chem. Rev., vol. 89, p. 1359 (1989), GB Patent No. 2300196 publication, and the like are exemplified. Also as the synthesis method, methods described in them can be used, and particularly, the Kipping method is suitably used.

In the polysiloxane or its derivative, the siloxane skeleton structure shows little hole transporting property, thus, those having a structure of the above-described hole transporting material of low molecular weight on the side chain or main chain are suitably used. Particularly, those having an aromatic amine showing hole transportability on the side chain or main chain are exemplified.

Though the film formation method of a hole transporting layer is not particularly restricted, a method of film formation from a mixed solution with a polymer binder is exemplified, in the case of a hole transporting material of low molecular weight. In the case of a hole transporting material of high molecular weight, a method of film formation from a solution is exemplified.

As the solvent used for film formation from a solution, those which can dissolve or uniformly disperse a hole transporting material are preferable. Exemplified as the solvent are chlorine-based solvents such as chloroform, methylene chloride, 1,2-dichloroethane, 1,1,2-trichloroethane, chlorobenzene, o-dichlorobenzene and the like, ether solvents such as tetrahydrofuran, dioxane and the like, aromatic hydrocarbon solvents such as toluene, xylene and the like, aliphatic hydrocarbon solvents such as cyclohexane, methylcyclohexane, n-pentane, n-hexane, n-heptane, n-octane, n-nonane, n-decane and the like, ketone solvents such as acetone, methyl ethyl ketone, cyclohexanone and the like, ester solvents such as ethyl acetate, butyl, acetate, ethylcellosolve acetate and the like, polyhydric alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol and the like and derivatives thereof, alcohol solvents such as methanol, ethanol, propanol, isopropanol, cyclohexanol and the like, sulfoxide solvents such as dimethyl sulfoxide and the like, amide solvents such as N-methyl-2-pyrrolidone, N,N-dimethylformamide and the like. These organic solvents can be used singly or in combination of two or more.

As the method for film formation from a solution, there can be used application methods from a solution such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like.

Regarding the thickness of a hole transporting layer, the optimum value varies depending on a material to be used, and it may be advantageously selected so as to give suitable driving voltage and light emission efficiency, and a thickness at least causing no formation of pin holes is necessary, and when the thickness is too large, the driving voltage of a device increases undesirably. Therefore, the thickness of the hole transporting layer is, for example, 1 nm to 1 μm, preferably 2 nm to 500 nm, further preferably 5 nm to 200 nm.

When the polymer light emitting device of the present invention has an electron transporting layer, known materials can be used as the electron transporting material to be used, and exemplified are oxadiazole derivatives, anthraquinodimethane or its derivatives, benzoquinone or its derivatives, naphthoquinone or its derivatives, anthraquinone or its derivatives, tetracyanoanthraquinodimethane or its derivatives, fluorenone derivatives, diphenyldicyanoethylene or its derivatives, diphenoquinone derivatives, metal complexes of 8-hydroxyquinoline or its derivatives, polyquinoline or its derivatives, polyquinoxaline or its derivatives, polyfluorene or its derivatives, and the like.

Specifically, those described in JP-A Nos. 63-70257, 63-175860, 2-135359, 2-135361, 2-209988, 3-37992, 3-152184, and the like are exemplified.

Of them, oxadiazole derivatives, benzoquinone or its derivatives, anthraquinone or its derivatives, metal complexes of 8-hydroxyquinoline or its derivatives, polyquinoline or its derivatives, polyquinoxaline or its derivatives, polyfluorene or its derivatives are preferable, and 2-(4-biphenylyl)-5-(4-t-butylphenyl)-1,3,4-oxadiazole, benzoquinone, anthraquinone, tris(8-quinolinol)aluminum and polyquinoline are further preferable.

The film formation method of an electron transporting layer is not particularly restricted, and in the case of an electron transporting material of low molecular weight, exemplified are a vacuum vapor-deposition method from powder, film formation methods from solution or melted condition, and in the case of an electron transporting material of high molecular weight, film formation methods from solution or melted condition are exemplified, respectively. In film formation from solution or melted condition, the above-described polymer binders may be used together.

As the solvent used in film formation from a solution, compounds which can dissolve or uniformly disperse an electron transporting material and/or polymer binder are preferable. Exemplified as the solvent are chlorine-based solvents such as chloroform, methylene chloride, 1,2-dichloroethane, 1,1,2-trichloroethane, chlorobenzene, o-dichlorobenzene and the like, ether solvents such as tetrahydrofuran, dioxane and the like, aromatic hydrocarbon solvents such as toluene, xylene and the like, aliphatic hydrocarbon solvents such as cyclohexane, methylcyclohexane, n-pentane, n-hexane, n-heptane, n-octane, n-nonane, n-decane and the like, ketone solvents such as acetone, methyl ethyl ketone, cyclohexanone and the like, ester solvents such as ethyl acetate, butyl acetate, ethylcellosolve acetate and the like, polyhydric alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol and the like and derivatives thereof, alcohol solvents such as methanol, ethanol, propanol, isopropanol, cyclohexanol and the like, sulfoxide solvents such as dimethyl sulfoxide and the like, amide solvents such as N-methyl-2-pyrrolidone, N,N-dimethylformamide and the like. These organic solvents can be used singly or in combination of two or more.

As the film formation method from solution or melted condition, application methods such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like can be used.

Regarding the thickness of an electron transporting layer, the optimum value varies depending on a material to be used, and it may be advantageously selected so as to give suitable driving voltage and light emission efficiency, and a thickness at least causing no formation of pin holes is necessary, and when the thickness is too large, the driving voltage of a device increases undesirably. Therefore, the thickness of the electron transporting layer is, for example, 1 nm to 1 µm, preferably 2 nm to 500 nm, further preferably 5 nm to 200 nm.

Among charge transporting layers provided adjacent to an electrode, those having a function of improving charge injection efficiency from an electrode and having an effect of lowering the driving voltage of a device are, in particularly, called generally a charge injection layer (hole injection layer, electron injection layer).

Further, for improving close adherence with an electrode and improving charge injection from an electrode, the above-described charge injection layer or an insulation layer having a thickness of 2 nm or less may be provided adjacent to the electrode, alternatively, for improving close adherence of an interface and preventing mixing, a thin buffer layer may be inserted into an interface of a charge transporting layer and a light emitting layer.

The order and number of layers to be laminated, and thickness of each layer can be appropriately determined in view of light emission efficiency and device life.

In the present invention, as the polymer light emitting device carrying a provided charge injection layer (electron injection layer, hole injection layer), mentioned are polymer light emitting devices having a charge injection layer provided adjacent to a cathode and polymer light emitting devices having a charge injection layer provided adjacent to an anode.

For example, the following structures e) to p) are specifically mentioned.

e) anode/charge injection layer/light emitting layer/cathode f) anode/light emitting layer/charge injection layer/cathode g) anode/charge injection layer/light emitting layer/charge injection layer/cathode h) anode/charge injection layer/hole transporting layer/light emitting layer/cathode i) anode/hole transporting layer/light emitting layer/charge injection layer/cathode j) anode/charge injection layer/hole transporting layer/light emitting layer/charge injection layer/cathode k) anode/charge injection layer/light emitting layer/electron transporting layer/cathode l) anode/light emitting layer/electron transporting layer/charge injection layer/cathode m) anode/charge injection layer/light emitting layer/electron transporting layer/charge injection layer/cathode n) anode/charge injection layer/hole transporting layer/light emitting layer/electron transporting layer/cathode o) anode/hole transporting layer/light emitting layer/electron transporting layer/charge injection layer/cathode p) anode/charge injection layer/hole transporting layer/light emitting layer/electron transporting layer/charge injection layer/cathode Also exemplified are structures having an "interlayer" layer provided adjacent to a light emitting layer between the light emitting layer and an anode in the above-described structures. In this case, the "interlayer" layer may also function as a hole injection layer and/or hole transporting layer.

As specific examples of the charge injection layer, exemplified are a layer containing an electric conductive polymer, a layer provided between an anode and a hole transporting layer and containing a material having ionization potential of a value between an anode material and a hole transporting material contained in a hole transporting layer, a layer provided between a cathode and an electron transporting layer and containing a material having electron affinity of a value between a cathode material and an electron transporting material contained in an electron transporting layer, and the like.

When the above-described charge injection layer contains an electric conductive polymer, electric conductivity of the electric conductive polymer is preferably $10^{-5}$ S/cm or more and $10^3$ or less, and for decreasing leak current between light emission picture elements, more preferably $10^{-5}$ S/cm or more and $10^2$ or less, further preferably $10^{-5}$ S/cm or more and $10^1$ or less.

When the above-described charge injection layer contains an electric conductive polymer, electric conductivity of the electric conductive polymer is preferably $10^{-5}$ S/cm or more and $10^3$ S/cm or less, and for decreasing leak current between light emission picture elements, more preferably $10^{-5}$ S/cm or more and $10^2$ S/cm or less, further preferably $10^{-5}$ S/cm or more and $10^1$ S/cm or less.

Usually, for controlling the electric conductivity of the electric conductive polymer to $10^{-5}$ S/cm or more and $10^3$ or less, the electric conductive polymer is doped with a suitable amount of electrons.

As the kind of ions to be doped, an anion is used in a hole injection layer and a cation is used in an electron injection layer. Examples of the anion include a polystyrenesulfonic ion, alkylbenzenesulfonic ton, camphorsulfonic ion and the like, and examples of the cation include a lithium ion, sodium ion, potassium ion, tetrabutylammonium ion and the like.

The thickness of the charge injection layer is, for example, 1 nm to 100 nm, preferably 2 nm to 50 nm.

The material used in the charge injection layer may be appropriately selected depending on a relation with materials of an electrode and an adjacent layer, and exemplified are polyaniline or its derivatives, polythiophene or its derivatives, polypyrrole and its derivatives, polyphenylenevinylene and its derivatives, polythienylenevinylene and its derivatives, polyquinoline and its derivatives, polyquinoxaline and its derivatives, electric conductive polymers such as polymers containing an aromatic amine structure on the main chain or side chain, metal phthalocyanines (copper phthalocyanine and the like), carbon and the like.

An insulation layer having a thickness of 2 nm or less has a function of making charge injection easy. As the material of the above-described insulation layer, a metal fluoride, metal oxide, organic insulating material and the like are mentioned. As the polymer light emitting device carrying an insulation layer having a thickness of 2 nm or less provided thereon, there are mentioned polymer light emitting devices in which an insulation layer having a thickness of 2 nm or less is provided adjacent to a cathode, and polymer light emitting devices in which an insulation layer having a thickness of 2 nm or less is provided adjacent to an anode.

Specifically, for example, the following structures q) to ab) are mentioned.

q) anode/insulation layer having a thickness of 2 nm or less/light emitting layer/cathode r) anode/light emitting layer/insulation layer having a thickness of 2 nm or less/cathode s) anode/insulation layer having a thickness of 2 nm or less/light emitting layer/insulation layer having a thickness of 2 nm or less/cathode t) anode/insulation layer having a thickness of 2 nm or less/hole injection layer/light emitting layer/cathode u) anode/hole injection layer/light emitting layer/insulation layer having a thickness of 2 nm or less/cathode v) anode/insulation layer having a thickness of 2 nm or less/hole transporting layer/light emitting layer/insulation layer having a thickness of 2 nm or less/cathode w) anode/insulation layer having a thickness of 2 nm or less/light emitting layer/electron transporting layer/cathode x) anode/light emitting layer/electron transporting layer/insulation layer having a thickness of 2 nm or less/cathode y) anode/insulation layer having a thickness of 2 nm or less/light emitting layer/electron transporting layer/insulation layer having a thickness of 2 nm or less/cathode z) anode/insulation layer having a thickness of 2 nm or less/hole transporting layer/light emitting layer/electron transporting layer/cathode aa) anode/hole transporting layer/light emitting layer/electron transporting layer/insulation layer having a thickness of 2 nm or less/cathode ab) anode/insulation layer having a thickness of 2 nm or less/hole transporting layer/light emitting layer/electron transporting layer/insulation layer having a thickness of 2 nm or less/cathode Also exemplified are structures having an "interlayer" layer provided adjacent to a light emitting layer between the light emitting layer and an anode in the above-described structures. In this case, the "interlayer" layer may also function as a hole injection layer and/or hole transporting layer.

In structures in which an "interlayer" layer is applied to the above-described structures a) to ab), the "interlayer" layer is preferably provided between an anode and a light emitting layer and constituted of a material having intermediate ionization potential between the anode or hole injection layer or hole transporting layer, and a polymer compound constituting the light emitting layer.

As the material to be used in the "interlayer" layer, exemplified are polymers containing an aromatic amine such as polyvinylcarbazole or its derivatives, polyarylene derivatives having an aromatic amine on the side chain or main chain, arylamine derivatives, triphenyldiamine derivatives and the like.

Though the method for forming the "interlayer" layer is not particularly restricted, a method of film formation from a solution is exemplified, for example, in the case of use of a polymer material.

As the solvent to be used in film formation from a solution, compounds which can dissolve or uniformly disperse a material used in an "interlayer" layer are preferable. Exemplified as the solvent are chlorine-based solvents such as chloroform, methylene chloride, 1,2-dichloroethane, 1,1,2-trichloroethane, chlorobenzene, o-dichlorobenzene and the like, ether solvents such as tetrahydrofuran, dioxane and the like, aromatic hydrocarbon solvents such as toluene, xylene and the like, aliphatic hydrocarbon solvents such as cyclohexane, methylcyclohexane, n-pentane, n-hexane, n-heptane, n-octane, n-nonane, n-decane and the like, ketone solvents such as acetone, methyl ethyl ketone, cyclohexanone and the like, ester solvents such as ethyl acetate, butyl acetate, ethylcellosolve acetate and the like, polyhydric alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol and the like and derivatives thereof, alcohol solvents such as methanol, ethanol, propanol, isopropanol, cyclohexanol and the like, sulfoxide solvents such as dimethyl sulfoxide and the like, amide solvents such as N-methyl-2-pyrrolidone, N,N-dimethylformamide and the like. These organic solvents can be used singly or in combination of two or more.

As the film formation method from a solution, application methods from a solution such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like can be used.

Regarding the thickness of an "interlayer" layer, the optimum value varies depending on a material to be used, and it may be advantageously selected so as to give suitable driving voltage and light emission efficiency. The thickness thereof is, for example, 1 nm to 1 μm, preferably 2 nm to 500 nm, further preferably 5 nm to 200 nm.

When the "interlayer" layer is provided adjacent to a light emitting layer, particularly when both the layers are formed by an application method, the two layers may be mixed to exert an undesirable influence on device properties and the like in some cases. When the "interlayer" layer is formed by an application method before formation of a light emitting layer by an application method, there is mentioned a method in which an "interlayer" layer is formed by an application method, then, the "Interlayer" layer is heated to be insolubilized in an organic solvent to be used for manufacturing a light emitting layer, then, the light emitting layer is formed, as a method for reducing mixing of materials of the two layers. The heating temperature is usually about 150° C. to 300° C., and the heating time is usually about 1 minute to 1 hour. In this case, for removal of components not insolubilized in solvent by heating, the "interlayer" layer can be removed by rinsing with a solvent to be used for formation of a light emitting layer, after heating and before formation of the light emitting layer. When insolubilization in solvent by heating is carried out sufficiently, rinsing with a solvent can be omitted. For insolubilization in solvent by heating to be carried out sufficiently, it is preferable to use a compound containing at least one polymerizable group in the molecule, as a polymer compound to be used in an "interlayer" layer. Further, the number of polymerizable groups is preferably 5% or more based on the number of repeating units in the molecule.

The substrate which forms a polymer light emitting device of the present invention may be that forming an electrode and which does not change in forming a layer of an organic substance, and exemplified are, for example, substrates of glass, plastic, polymer film, silicon and the like. In the case of an opaque substrate, it is preferable that the opposite electrode is transparent or semi-transparent.

Usually, at least one of an anode and a cathode contained in a polymer light emitting device of the present invention is transparent or semi-transparent. It is preferable that a cathode is transparent or semi-transparent.

As the material of the cathode, an electric conductive metal oxide film, semi-transparent metal thin film and the like are used. Specifically, films (NESA and the like) formed using electric conductive glass composed of indium oxide, zinc oxide, tin oxide, and composite thereof: indium-tin oxide (ITO), indium.zinc.oxide and the like, gold, platinum, silver, copper and the like are used, and ITO, indium.zinc.oxide, tin oxide are preferable. As the manufacturing method, a vacuum vapor-deposition method, sputtering method, ion plating method, plating method and the like are mentioned. As the anode, organic transparent electric conductive films made of polyaniline or its derivative, polythiophene or its derivative, and the like may be used.

The thickness of an anode can be appropriately selected in view of light transmission and electric conductivity, and it is, for example, 10 nm to 10 μm, preferably 20 nm to 1 μm, more preferably 50 nm to 500 nm.

For making charge injection easy, a layer made of a phthalocyanine derivative, electric conductive polymer, carbon and the like, or a layer having an average thickness of 2 nm or less made of a metal oxide, metal fluoride, organic insulation material and the like, may be provided on an anode.

As the material of a cathode used in a polymer light emitting device of the present invention, materials of small work function are preferable. For example, metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, alloys of two or more of them, or alloys made of at least one of them and at least one gold, silver, platinum, copper, manganese, titanium, cobalt, nickel, tungsten and tin, or graphite or graphite intercalation compounds and the like are used. Examples of the alloy include magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may take a laminated structure including two or more layers.

The thickness of a cathode can be appropriately selected in view of electric conductivity and durability, and it is, for example, 10 nm to 10 μm, preferably 20 nm to 1 μm, further preferably 50 nm to 500 nm.

As the cathode manufacturing method, a vacuum vapor-deposition method, sputtering method, lamination method of thermally press-binding a metal thin film, and the like are used. A layer made of an electric conductive polymer, or a layer having an average thickness of 2 nm or less made of a metal oxide, metal fluoride, organic insulation material and the like, may be provided between a cathode and an organic substance layer, and after manufacturing a cathode, a protective layer for protecting the polymer light emitting device may be installed. For use of the polymer light emitting device stably for a long period of time, it is preferable to install a protective layer and/or protective cover, for protecting a device from outside.

As the protective layer, a polymer compound, metal oxide, metal fluoride, metal boride and the like can be used. As the protective cover, a metal plate, a glass plate, and a plastic plate having a surface which has been subjected to low water permeation treatment, and the like can be used, and a method of pasting the cover to a device substrate with a thermosetting resin or photo-curable resin to attain close seal is suitably used. When a space is kept using a spacer, prevention of blemishing of a device is easy. If an inert gas such as nitrogen, argon and the like is filled in this space, oxidation of a cathode can be prevented, further, by placing a drying agent such as barium oxide and the like in this space, it becomes easy to suppress moisture adsorbed in a production process or a trace amount of moisture invaded passing through the hardened resin from imparting damage to the device. It is preferable to adopt one strategy among these methods.

The polymer light emitting device of the present invention can be used as a sheet light source, segment display, dot matrix display, back light of a liquid crystal display, and the like.

For obtaining light emission in the form of sheet using a polymer light emitting device of the present invention, it may be advantageous to place a sheet anode and a sheet cathode so as to overlap. For obtaining light emission in the form of pattern, there are a method in which a mask having a window in the form of pattern is placed on the surface of the above-described sheet light emitting device, a method in which an organic substance layer in non-light emitting parts is formed with extremely large thickness to give substantially no light emission, and a method in which either anode or cathode, or both electrodes are formed in the form pattern. By forming a pattern by any of these methods, and placing several electrodes so that on/off is independently possible, a display of segment type is obtained which can display digits, letters, simple marks and the like. Further, for providing a dot matrix device, it may be permissible that both an anode and a cathode are formed in the form of stripe, and placed so as to cross. By using a method in which several polymer fluorescent bodies showing different emission colors are painted separately or a method in which a color filter or a fluorescence conversion filter is used, partial color display and multi-color display are made possible. In the case of a dot matrix device, passive driving is possible, and active driving may be carried out in combination with TFT and the like. These displays can be used as a display of a computer, television, portable terminal, cellular telephone, car navigation, view finder of video camera, and the like.

Further, the above-described sheet light emitting device is of self emitting and thin type, and can be suitably used as a sheet light source for back light of a liquid crystal display, or as a sheet light source for illumination. If a flexible substrate is used, it can also be used as a curved light source or display.

The block copolymer of the present invention can be used also in a polymer electrolyte film, photoelectric conversion material, thermoelectric conversion material and the like.

EXAMPLES

The present invention will be illustrated further in detail below, but the present invention is not limited to them.

NMR measurement of a monomer was carried out under the following conditions.
Apparatus; nuclear magnetic resonance apparatus INOVA 300 manufactured by Varian
Measurement solvent: Deuterated chloroform
Sample concentration: about 1 wt %
Measurement temperature: 25° C.

NMR measurement of a block copolymer of the present invention was carried out under the following conditions.
Apparatus: nuclear magnetic resonance apparatus Avance 600 manufactured by Bruker
Measurement solvent: Deuterated tetrahydrofuran
Sample concentration: about 1 wt %
Measurement temperature: 30° C.

The polystyrene-reduced number average molecular weight (Mn) and weight average molecular weight (Mw) were measured by site exclusion chromatography (SEC) under the following conditions.
Apparatus: HLC-8220 GPC manufactured by Tosoh Corporation
Column: one TSKguard column SuperH-H (manufactured by Tosoh Corporation)
two TSKgel SuperM-H (manufactured by Tosoh Corporation)
one TSKgel SuperH2000 (manufactured by Tosoh Corporation)
The above-described four columns were connected serially.
Mobile phase: tetrahydrofuran
Detector: differential refractive index detector

Synthesis Example 1

Synthesis of 2-(9-bromo-7,7-dioctyl-7H-benzo[c]fluorene-5-yl)-4,4,5,5-tetramethyl-[1,3,2]dioxaborolane (compound 1)

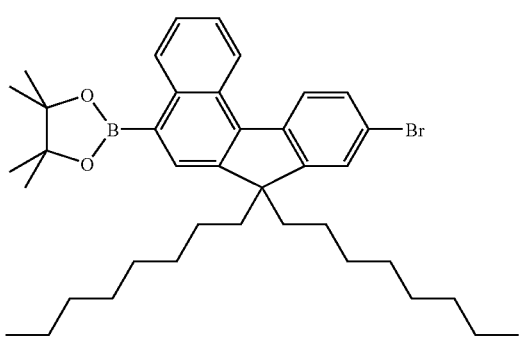

(compound 1)

Under an inert gas atmosphere, 70.0 g (0.12 mol) of 5,9-dibromo-7,7-dioctyl-7H-benzo[c]fluorene (compound 2) was dissolved in 1170 mL of dehydrated tetrahydrofuran and 1170 mL of dehydrated diethyl ether, and cooled to −65° C. 73.1 mL (0.12 mol) of n-butyllithium in the form of 1.6 mol/L hexane solution was dropped at −65 to −70° C. over a period of 30 minutes, and the mixture was stirred for about 1 hour at −70° C. Then, 28.6 mL (0.14 mol) of 2-isopropoxy-4,4,5,5-tetramethyl-1,3,2-dioxaborolane was dropped at −70° C. over a period of 10 minutes, and the mixture was stirred for about 1 hour at −70° C., further, stirred overnight at room temperature. Then, the reaction solution was dropped at room temperature over a period of 15 minutes into mixed liquid composed of 936 mL of water and 234 mL of concentrated hydrochloric acid, and the mixture was further stirred for 15 minutes, then, the organic layer was separated from the aqueous layer. The organic layer was washed with distilled water, 54 NaHCO$_2$ aqueous solution and distilled water, in this order, and liquid-separation was performed, then, concentrated to obtain 77 g of an oily coarse product. The coarse product was dissolved in 31 mL of tetrahydrofuran, and 306 mL of methanol was dropped into this to cause deposition of a crystal which was then filtrated, washed and dried under reduced pressure, to obtain solid. The above-described solid was further subjected to recrystallization from tetrahydrofuran and methanol twice, to obtain 57.7 g of compound 1 (purity: 99.94, yield: 76%).

$^1$H-NMR: 0.50 (br, 4H), 0.80 (t, 6H), 0.92 to 1.26 (m, 20H), 1.46 (s, 12H), 2.05 (m, 4H), 7.57 to 7.51 (m, 4H), 8.19 (d, 1H), 8.66 (d, 1H), 8.92 (d, 1H)

LC-MS: 644 (M$^+$)

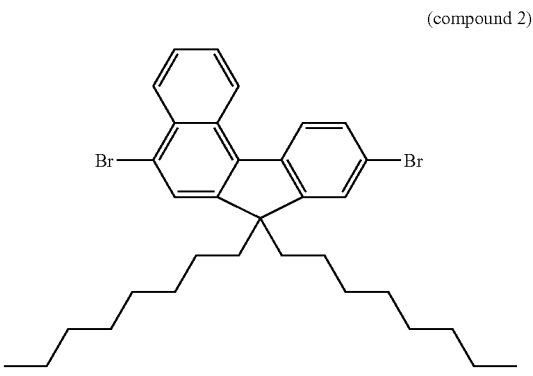 [SMILES: CCCCCCCCC1(CCCCCCCC)c2cc(Br)ccc2-c2c1cc(Br)c1ccccc21]

(compound 2)

Synthesis Example 2

Synthesis of (4-bromo-phenyl)-(4-tert-butyl-2,6-dimethylphenyl)-[4-(4,4,5,5-tetramethyl-[1,3,2]dioxaborolane-2-yl)-phenyl]-amine (compound 3)

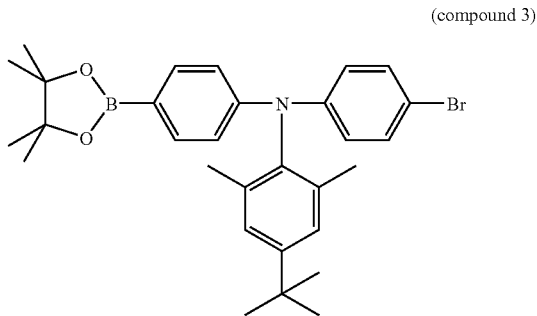 [SMILES: Cc1cc(C(C)(C)C)cc(C)c1N(c1ccc(Br)cc1)c1ccc(B2OC(C)(C)C(C)(C)O2)cc1]

(compound 3)

Into a dried four-necked flask was charged 91.89 g (188.58 mmol) of bis(4-bromo-phenyl)-(4-tert-butyl-2,6-dimethylphenyl)amine under an argon atmosphere, and 2750 mL of dehydrated tetrahydrofuran was added to make the liquid uniform. The reaction solution was cooled to −70° C., and 98 mL (150.9 mmol) of a 1.54 M n-butyllithium n-hexane solution was dropped over a period of 78 minutes, and stirred as it was for 65 minutes. Then, 35.1 g (188.65 mmol) of 2-isopropoxy-4,4,5,5-tetramethyl-1,3,2-dioxaborolane was dropped at −70° C. over a period of 60 minutes, and stirred as it was for 1 hour, then, heated up to 15 to 20° C. and the mixture was stirred for 2 hours. At room temperature, 1 L of water was charged and the mixture was stirred for 1 hour, then, tetrahydrofuran was distilled off by concentration under reduced pressure. To the concentrated suspension was added 2 L of toluene and the mixture was stirred, then, the organic layer was separated from the aqueous layer. The above-described liquid separation operation was performed three times and the resultant organic layers were combined, and to this was added anhydrous sodium sulfate and the mixture was stirred. Anhydrous sodium sulfate was filtrated off, and the resultant filtrate was concentrated under reduced pressure to obtain 113.54 g of white solid. This white solid was purified by silica gel column chromatography using toluene and n-hexane as developing liquid and concentrated to dryness, to obtain 45.5 g of yellow white solid. This yellow white solid was dissolved in 800 mL of tetrahydrofuran, and into this was dropped 800 mL of distilled water at 25° C. over a period of 3 hours to cause deposition of crystals, and the mixture was stirred for 1 hour, then, filtrated, and this series of operations were repeated 7 times, and the resultant crystal was dried under reduced pressure, to obtain compound 3 as white solid (yielded amount: 40.2 g, yield: 37.8%, LC area percentage: 98.0%).

$^1$H-NMR: 1.32 (s, 9H), 1.32 (s, 12H), 1.98 (s, 6H), 6.87 (d, 2H), 6.90 (d, 2H), 7.09 (s, 2H), 7.28 (d, 2H), 7.63 (d, 2H)

LC-MS: 535.1 (M+H)

Synthesis Example 3

Synthesis of Random Copolymer 1

Under an inert gas atmosphere, 0.70 g (1.2 mmol) of compound 2, 0.24 g (0.50 mmol) of bis(4-bromo-phenyl)-(4-tert-butyl-2,6-dimethyl-phenyl)amine, 0.63 g (4.0 mmol) of 2,2'-bipyridyl, 1.10 g (4.0 mmol) of bis(1,5-cyclooctadiene)nickel (0), and 50 mL of dehydrated tetrahydrofuran were added, and the mixture was stirred at 60° C. for 5 hours.

After the reaction, this reaction liquid was cooled to room temperature, and dropped into a mixed solution of 254 ammonia water 5 mL/methanol 50 mL/ion exchanged water 50 mL and the resultant mixture was stirred, then, the deposited precipitate was filtrated and dried under reduced pressure. Then, the dried product was dissolved in 50 mL of toluene, and radiolite was added to this and the mixture was stirred, and insoluble substances were filtrated. The resultant filtrate was purified by passing through an aluminum column chromatography. Then, a 5.2% hydrochloric acid aqueous solution was added and the mixture was stirred, then, the aqueous layer was removed, and 44 ammonia water was added to the organic layer and the mixture was stirred, then, the aqueous layer was removed, further, ion exchanged water was added to the organic layer and the mixture was stirred, then, the aqueous layer was removed. Thereafter, the organic layer was poured into methanol and stirred, and the deposited precipitate was filtrated and dried under reduced pressure, to obtain random copolymer 1. The polystyrene-reduced number average molecular weight and weight average molecular weight were Mn=3.5×10$^4$ and Mw=1.0×10$^5$, respectively. This random copolymer had a molar ratio of the following divalent group 1 to the following divalent group 2 of 70:30.

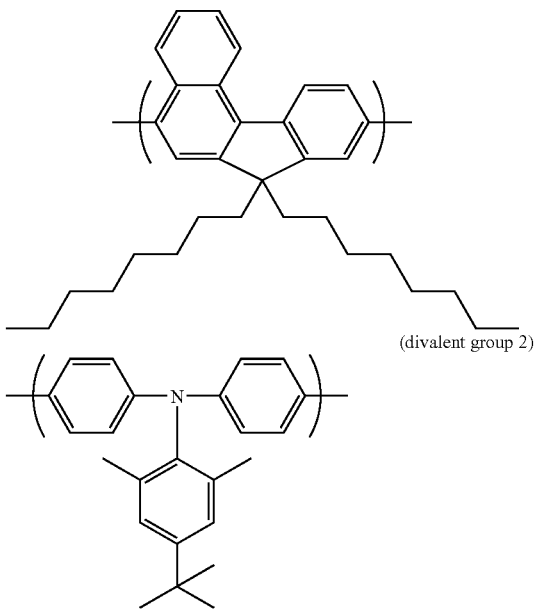

Synthesis Example 4

Synthesis of Random Copolymer 2

Under an inert gas atmosphere, 0.80 g (1.3 mmol) of compound 2, 0.65 g (1.3 mmol) of bis(4-bromo-phenyl)-(4-tert-butyl-2,6-dimethyl-phenyl)amine, 1.00 g (6.4 mmol) of 2,2'-bipyridyl, 1.8 g (6.4 mmol) of bis(1,5-cyclooctadiene)nickel (0), and 150 mL of dehydrated tetrahydrofuran were added, and the mixture was stirred at 60° C. for 4 hours. After the reaction, this reaction liquid was cooled to room temperature, and dropped into a mixed solution of 25% ammonia water 15 mL/methanol 150 mL/ion exchanged water 150 mL and the resultant mixture was stirred, then, the deposited precipitate was filtrated and dried under reduced pressure. Then, the dried product was dissolved in 150 mL of toluene, and radiolite was added to this and the mixture was stirred, and insoluble substances were filtrated. The resultant filtrate was purified by passing through an aluminum column chromatography. Then, a 5.2% hydrochloric acid aqueous solution was added and the mixture was stirred, then, the aqueous layer was removed, and 44 ammonia water was added to the organic layer and the mixture was stirred, then, the aqueous layer was removed, further, ion exchanged water was added to the organic layer and the mixture was stirred, then, the aqueous layer was removed. Thereafter, the organic layer was poured into methanol and stirred, and the deposited precipitate was filtrated and dried under reduced pressure, to obtain random copolymer 2. The polystyrene-reduced number average molecular weight and weight average molecular weight were Mn=1.9×10$^4$ and Mw=6.5×10$^4$, respectively. This random copolymer had a molar ratio of the above-described divalent group 1 to the above-described divalent group 2 of 50:50.

Example 1

Synthesis of Block Copolymer 1

Into a 200 mL three-necked flask was charged 1.00 g (1.5 mmol) of compound 1, and an atmosphere in the flask was purged with an argon gas. Then, 6.6 mg (0.03 mmol) of 4-t-butylbromobenzene and 34 mL of toluene were charged and the mixture was stirred at 45° C. for 5 minutes. Then, 2.2 mg (0.002 mmol) of tris(dibenzylideneacetone)dipalladium and 6.6 mg (0.019 mmol) of tris(2-methoxyphenyl)phosphine were added and the mixture was stirred at 45° C. for 10 minutes, and 7.0 ml, of a 33 wt. % cesium carbonate aqueous solution was added and the mixture was stirred at 45° C. for 7 minutes. Then, the mixture was stirred at 110° C. for 3 hours, and disappearance of compound 1 was confirmed by high performance liquid chromatography, and the molecular weight of the polymer compound at peak top in SEC was confirmed to be $7.1 \times 10^4$ at this stage. Then, 0.82 g (1.5 mmol) of compound 3 and 10 mL of toluene were added and the mixture was stirred at 110° C. for 21 hours, and disappearance of compound 3 was confirmed by high performance liquid chromatography, and the molecular weight of the polymer compound at peak top in SEC was confirmed to be $8.9 \times 10^4$, confirming an increase in molecular weight by copolymerization. Then, 0.17 g (0.78 mmol) of 4-(4,4,5,5-tetramethyl-1,3,2-dioxaborolane-2-yl)toluene and 2 mL of toluene were added, and the mixture was stirred at 110° C. for 3 hours. After cooling down to room temperature, the reaction solution was dropped into 500 mL of ethanol to obtain a precipitate which was then filtrated and dried, to obtain yellow solid. The above-described yellow solid was dissolved in 65 mL of toluene, and the solution was subjected to column chromatography with silica gel and active alumina, and concentrated to dryness. The resultant solid was dissolved in chloroform to give a solution which was then dropped into ethanol, and the deposited precipitate was filtrated and dried, to obtain 0.82 g of solid. 0.73 g of the solid was dissolved in tetrahydrofuran, and the solution was dropped into acetone to obtain a precipitate which was then filtrated and dried, and this series of operations were repeated 4 times, to obtain 0.40 g of the intended block copolymer 1. The polystyrene-reduced number average molecular weight and weight average molecular weight were $Mn=7.2 \times 10^4$ and $Mw=1.1 \times 10^5$, respectively. The elemental analysis results of the block copolymer showed that the molar ratio of the above-described divalent group 1 to the above-described divalent group 2 was 73:27. Therefore, block copolymer 1 was composed of two blocks: one containing the divalent group 1 as a constituent unit and one containing the divalent group 2 as a constituent unit, and the chemical formula weights of the divalent group 1 and the divalent group 2 were 438.7 and 327.4, respectively, thus, the block containing the divalent group 1 as a constituent unit had a number average polymerization degree of 120 and the block containing the divalent group 2 as a constituent unit had a number average polymerization degree of 59.

<Fraction of Block Copolymer 1 by SEC>

200.2 mg of block copolymer 1 was dissolved in 40 mL of toluene and the solution was developed over a SEC column each in an amount of 200 μl and higher molecular weight components of block copolymer 1 were separated. With respect to the SEC column, one TSKgel GMH$_{HR}$-3000 column and one TSKgel GMH$_{HR}$-4000 column manufactured by Tosoh Corporation were connected serially, and with respect to the chromatography apparatus, LC-10Avp manufactured by Shimadzu Corporation was used, and SEC was performed at 60° C. using tetrahydrofuran as a mobile phase. The flow rate was 1.0 mL per minute, and an eluate was collected at an interval of 30 seconds. A fraction from 10.5 minutes to 11 minutes after injection (fr. 2) and a fraction from 11 minutes to 11.5 minutes after injection (fr. 3) were combined and the solvent was removed, to obtain block copolymer 1A. The above-described fr. 2 and fr. 3 had polystyrene-reduced Mn and Mw as described below, respectively.

| Fraction | Mn | Mw |
|----------|-----|-----|
| fr. 2 | $3.5 \times 10^5$ | $5.5 \times 10^5$ |
| fr. 3 | $1.9 \times 10^5$ | $2.5 \times 10^5$ |

<NMR Measurement of Block Copolymer 1A>

Block copolymer 1A was used to prepare a tetrahydrofuran-d$_8$ solution, and TOCSY spectrum thereof was measured at 30° C. As the NMR apparatus, Avance 600 type nuclear magnetic resonance apparatus manufactured by Bruker was used.

In the TOCSY spectrum, cross peaks between protons represented by H$_A$ and H$_B$ in the formula (Z1) were clearly observed, at positions of (F1 axis, F2 axis) (7.11 ppm, 7.67 ppm) and (F1 axis, F2 axis)=(7.67 ppm, 7.11 ppm). This means that a block containing the divalent group 1 as constituent unit and a block containing the divalent group 2 as constituent unit are connected by a chemical bond in the block copolymer 1A.

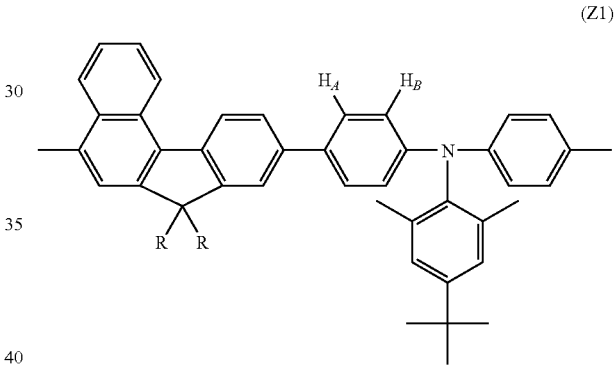

(Z1)

(in the formula (Z1), R represents a C$_8$H$_{17}$ group)

On the other hand, in the TOCSY spectrum, no peaks were observed at all at emersion positions of cross peaks between protons represented by H$_C$ and H$_D$ in the formula (Z2), that is, at (F1 axis, F2 axis)=(7.97 ppm, 8.60 ppm) and (F1 axis. F2 axis)=(8.60 ppm, 7.97 ppm).

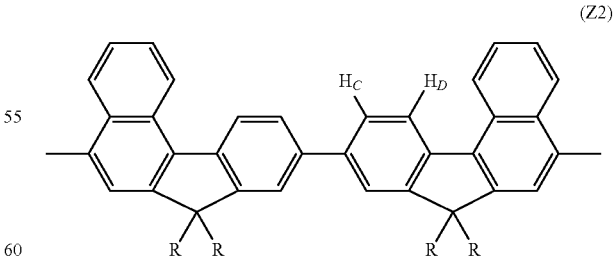

(Z2)

(in the formula (Z2), R represents a C$_8$H$_{17}$ group)

Further, no peaks were observed at all also at emersion positions of cross peaks between protons represented by H$_E$ and H$_F$ in the formula (Z3), that is, at (F1 axis, F2 axis)=(7.38 ppm, 7.67 ppm) and (F1 axis, F2 axis) (7.67 ppm, 7.38 ppm).

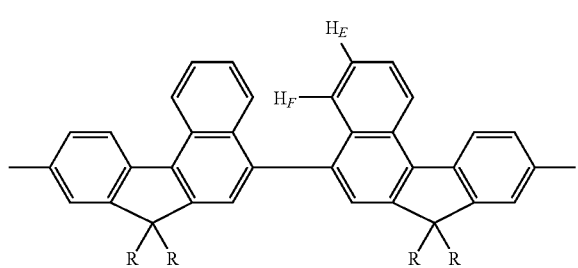

(Z3)

(in the formula (Z3), R represents a $C_8H_{17}$ group)

Furthermore, no peaks were observed at all also at emersion positions of cross peaks between protons represented by $H_G$ and $H_H$ in the formula (Z4), that is, at (F1 axis, F2 axis)= (7.43 ppm, 7.18 ppm) and (F1 axis, F2 axis) (7.18 ppm, 7.43 ppm).

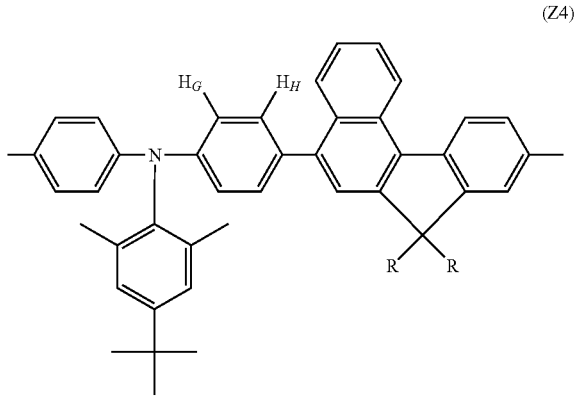

(Z4)

(in the formula (Z4), R represents a $C_8H_{17}$ group)

When summarized, these findings show that the block containing the divalent group as a constituent unit 1 of the block copolymer 1A has head-tail regularity which is so high that a head-tail bond represented by the formula (Z3) and a tail-tail bond represented by the formula (Z2) are not detected on the NMR spectrum. On the other hand, also in the block containing the divalent group 2 as a constituent unit, it is clear from the reaction using the model compound that a reaction of removal of two Br groups of a monomer of compound 3 and coupling thereof does not occur, that is, there is only one reaction point between the block containing the divalent group 1 as a constituent unit and the block containing the divalent group 2 as a constituent unit in the block copolymer 1A, as shown in the formula (Z1), indicating that such a structure is present at only one position in one molecule of the block copolymer 1A. Thus, it was confirmed that the block copolymer 1A was composed of two blocks: a block containing the divalent group 1 as a constituent unit and a block containing the divalent group 2 as a constituent unit.

Example 2

Synthesis of Block Copolymer 2

Into a 300 mL three-necked flask was charged 1.00 g (1.5 mmol) of compound 1, and an atmosphere in the flask was purged with an argon gas. Then, 6.6 mg (0.03 mmol) of 4-t-butylbromobenzene and 34 mL of toluene were charged and the mixture was stirred at 45° C. for 5 minutes. Then, 2.1 mg (0.002 mmol) of tris(dibenzylideneacetone)dipalladium and 6.5 mg (0.018 mmol) of tris(2-methoxyphenyl)phosphine were added and the mixture was stirred at 45° C. for 10 minutes, and 7.0 mL of a 33 wt % cesium carbonate aqueous solution was added and the mixture was stirred at 45° C. for 5 minutes. Then, the mixture was stirred at 110° C. for 2.5 hours, and disappearance of compound 1 was confirmed by high performance liquid chromatography, and it was confirmed that the molecular weight of the polymer compound at peak top of SEC was $5.2 \times 10^4$ at this stage. Then, 2.23 g (4.2 mmol) of compound 3, 5.7 mg (0.006 mmol) of tris(dibenzylideneacetone)dipalladium, 17.4 mg (0.049 mmol) of tris (2-methoxyphenyl)phosphine, 19 mL of a 33 wt % cesium carbonate aqueous solution and 9 mL of toluene were added and the mixture was stirred at 110° C. for 17 hours, and disappearance of compound 3 was confirmed by high performance liquid chromatography, and it we confirmed that the molecular weight of the polymer compound at peak top of SEC was $8.1 \times 10^4$ at this stage, confirming an increase in molecular weight by copolymerization. Then, 0.46 g (2.1 mmol) of 4-(4,4,5,5-tetramethyl-1,3,2-dioxaborolane-2-yl) toluene and 2 mL of toluene were added and the mixture was stirred at 110° C. for 3 hours. The same purification operation as in Example 1 was carried out, to obtain 1.1 g of the intended block copolymer 2. The polystyrene-reduced number average molecular weight and weight average molecular weight were Mn=$5.1 \times 10^4$ and Mw=$8.1 \times 10^4$, respectively. The elemental analysis results of the block copolymer showed that the molar ratio of the above-described divalent group 1 to the above-described divalent group 2 was 42156. Therefore, block copolymer 2 was composed of two blocks: one containing the divalent group 1 as a constituent unit and one containing the divalent group 2 as a constituent unit, and the chemical formula weights of the divalent group 1 and the divalent group 2 were 438.7 and 327.4, respectively, thus, the block containing the divalent group 1 as a constituent unit had a number average polymerization degree of 49 and the block containing the divalent group 2 as a constituent unit had a number average polymerization degree of 90.

Example 3

Synthesis of Block Copolymer 3

Into a 300 DILL three-necked flask was charged 1.00 g (1.5 mmol) of compound 1, and an atmosphere in the flask was purged with an argon gas. Then, 6.6 mg (0.03 mmol) of 4-t-butylbromo-benzene and 34 mL of toluene were charged and the mixture was stirred at 45° C. for 5 minutes. Then, 2.1 mg (0.002 mmol) of tris(dibenzylideneacetone)dipalladium and 6.6 mg (0.018 mmol) of tris(2-methoxyphenyl)phosphine were added and the mixture was stirred at 45° C. for 10 minutes, and 7.0 mL of a 33 wt % cesium carbonate aqueous solution was added and the mixture was stirred at 45° C. for 5 minutes. Then, the mixture was stirred at 110° C. for 4 hours, and disappearance of compound 1 was confirmed by high performance liquid chromatography, and it was confirmed that the molecular weight of the polymer compound at peak top of SEC was $5.6 \times 10^4$ at this stage. Then, 5.12 g (9.6 mmol) of compound 3, 13.2 mg (0.014 mmol) of tris(dibenzylideneacetone)dipalladium, 40.6 mg (0.115 mmol) of tris(2-methoxyphenyl)phosphine, 44 mL of a 33 wt % cesium carbonate aqueous solution and 10 mL of toluene were added and the mixture was stirred at 110° C. for 14.5 hours, and disappearance of compound 3 was confirmed by high performance liquid chromatography, and it was confirmed that the molecular weight of the polymer compound at peak top of SEC was $1.0 \times 10^5$ at this stage, confirm an increase in molecular weight by copolymerization. Then, 1.05 g (4.8 mmol) of 4-(4,4,5,5-tetramethyl-1,3,2-dioxaborolane-2-yl)toluene and 2 mL of toluene were added and the mixture was stirred at 110° C. for 3 hours. The same purification operation aa in Example 1 was carried out, to obtain 2.5 g of the intended block copolymer 3. The polystyrene-reduced number average molecular weight and weight average molecular weight were Mn=$7.2 \times 10^4$ and Mw=$1.2 \times 10^5$, respectively.

The elemental analysis results of the block copolymer showed that the molar ratio of the above-described divalent group 1 to the above-described divalent group 2 was 24276. Therefore, block copolymer 3 was composed of two blocks: one containing the divalent group 1 as a constituent unit and one containing the divalent group 2 as a constituent unit, and the chemical formula weights of the divalent group 1 and the divalent group 2 were 438.7 and 327.4, respectively, thus, the block containing the divalent group 1 as a constituent unit had a number average polymerization degree of 39 and the block containing the divalent group 2 as a constituent unit had a number average polymerization degree of 167.

Comparative Example 1

Fabrication of Light Emitting Device by Random Copolymer 1

On a glass substrate carrying an ITO film having a thickness of 150 nm formed thereon by a sputtering method, a suspension of poly(3,4)ethylenedioxythiophene/polystyrenesulfonic acid (manufactured by Bayer, Baytron P 2114083) was spin-coated to form a film having a thickness of 60 nm, and dried on a hot plate at 200° C. for 10 minutes. Next, random copolymer 1 obtain in Synthesis Example 2 was dissolved in toluene. This solution was so prepared that the concentration of solid components was 1.6 wt %. This toluene solution was spin-coated at 2800 rpm to form a film. Thereafter, this was dried for 1 hour at 90° C. under a degree of vacuum of $5 \times 10^{-3}$ Pa or lees, then, as a cathode, lithium fluoride was vapor-deposited at a thickness of about 4 nm, then, calcium was vapor-deposited at a thickness of 5 nm, finally, aluminum was vapor-deposited at a thickness of about 100 nm, to manufacture an organic EL device. The device constitution includes ITO/Baytron P (80 nm)/random copolymer 1 (80 nm)/LiF/Ca/Al. The vapor depositions of metals were started after the degree of vacuum reached $1 \times 10^{-4}$ Pa or less.

By applying voltage on the resulting device, blue light emission showing a peak wavelength of 460 nm derived from random copolymer 1 was observed. This device had a maximum light emission efficiency of 0.60 cd/A.

Example 4

Fabrication of Light Emitting Device by Block Copolymer 1

On a glass substrate carrying an ITO film having a thickness of 150 nm formed thereon by a sputtering method, a suspension of poly(3,4)ethylenedioxythiophene/polystyrenesulfonic acid (manufactured by Bayer, Baytron P AI4083) was spin-coated to form a film having a thickness of 80 nm, and dried on a hot plate at 200° C. for 10 minutes. Next, block copolymer 1 obtain in Example 1 was dissolved in toluene. This solution was so prepared that the concentration of solid components was 1.6 wt %. This toluene solution was spin-coated at 2800 rpm to form a film. Thereafter, this was dried for 1 hour at 90° C. under a degree of vacuum of $5 \times 10^{-3}$ Pa or less, then, as a cathode, lithium fluoride was vapor-deposited at a thickness of about 4 nm, then, calcium was vapor-deposited at a thickness of 5 nm, finally, aluminum was vapor-deposited at a thickness of about 100 nm, to manufacture an organic EL device. The device constitution includes ITO/Baytron P (80 nm)/block copolymer 1 (80 nm)/LiF/Ca/Al. The vapor depositions of metals were started after the degree of vacuum reached $1 \times 10^{-4}$ Pa or less.

By applying voltage on the resulting device, blue light emission showing a peak wavelength of 460 nm derived from block copolymer 1 was observed. This device had a maximum light emission efficiency of 1.36 cd/A.

As described above, the block copolymer according to the present invention shows higher light emission efficiency and has more excellent properties as materials to be used in a polymer light emitting device, as compared with the random copolymer of Comparative Example 1.

Comparative Example 2

Fabrication of Light Emitting Device by Random Copolymer 2

On a glass substrate carrying an ITO film having a thickness of 150 nm formed thereon by a sputtering method, a suspension of poly(3,4)ethylenedioxythiophene/polystyrenesulfonic acid (manufactured by Bayer, Baytron P AI4083) was spin-coated to form a film having a thickness of 80 nm, and dried on a hot plate at 200° C. for 10 minutes. Next, random copolymer 2 obtain in Synthesis Example 4 was dissolved in toluene. This solution was so prepared that the concentration of solid components was 1.8 wt %. This toluene solution was spin-coated at 1200 rpm to form a film. Thereafter, this was dried for 1 hour at 90° C. under a degree of vacuum of $5 \times 10^{-3}$ Pa or less, then, as a cathode, lithium fluoride was vapor-deposited at a thickness of about 4 nm, then, calcium was vapor-deposited at a thickness of 5 nm, finally, aluminum was vapor-deposited at a thickness of about 100 nm, to manufacture an organic EL device. The device constitution includes ITO/Baytron P (80 nm)/random copolymer 2 (80 nm)/LiF/Ca/Al. The vapor depositions of metal were started after the degree of vacuum reached $1 \times 10^{-4}$ Pa or less.

By applying voltage on the resulting device, blue light emission showing a peak wavelength of 460 nm derived from random copolymer 2 was observed. This device had a maximum light emission efficiency of 0.08 cd/A.

Example 5

Fabrication of Light Emitting Device by Block Copolymer 2

On a glass substrate carrying an ITO film having a thickness of 150 nm formed thereon by a sputtering method, a suspension of poly(3,4)ethylenedioxythiophene/polystyrenesulfonic acid (manufactured by Bayer, Baytron P AI4083) was spin-coated to form a film having a thickness of 80 nm, and dried on a hot plate at 200° C. for 10 minutes. Next, block Copolymer 2 obtain in Example 2 was dissolved in toluene. This solution was so prepared that the concentration of solid components was 1.8 wt %. This toluene solution was spin-coated at 1200 rpm to form a film. Thereafter, this was dried for 1 hour at 90° C. under a degree of vacuum of $5 \times 10^{-3}$ Pa or less, than, as a cathode, lithium fluoride was vapor-deposited at a thickness of about 4 nm, than calcium was vapor-deposited at a thickness of 5 nm, finally, aluminum was vapor-deposited at a thickness of about 100 nm, to manufacture an organic EL device. The device constitution includes ITO/Baytron P (80 nm)/block copolymer 2 (60 nm)/LiF/Ca/Al. The vapor depositions of metal were started after the degree of vacuum reached $1\times10^{-4}$ Pa or less.

By applying voltage on the resulting device, blue light emission showing a peak wavelength of 460 nm derived from block copolymer 2 was observed. This device, had a maximum light emission efficiency of 0.61 cd/A.

As described above, the block copolymer according to the present invention shows higher light emission efficiency and has more excellent properties as materials to be used in a polymer light emitting device, as compared with the random copolymer of Comparative Example 2.

Synthesis Example 5

Synthesis of Alternating Copolymer 1

Into a 200 mL three-necked flask was charged 0.703 g (1.02 mmol) of the following compound 4 and 0.491 g (1.01 mmol) of bis-(4-bromo-phenyl)-(4-tert-butyl-2,6-dimethyl-phenyl)amine, and an atmosphere in the flask was purged with an argon gas. Then, 21.5 mL of toluene was charged and the mixture was stirred at 45° C. for 5 minutes. Then, 2.70 mg (0.0029 mmol) of tris(dibenzylideneacetone)dipalladium and 8.22 mg (0.023 mmol) of tris(2-methoxyphenyl)phosphine, and 4.0 mL of toluene were added and the mixture was stirred at 45° C. for 10 minutes, and 9.1 mL of a 33 wt % cesium carbonate aqueous solution was added and the mixture was stirred at for 2 hours and 10 minutes. Then, 2.75 mg (0.0030 mmol) of tris(dibenzylideneacetone)dipalladium and 8.56 mg (0.024 mmol) of tris(2-methoxyphenyl)phosphine, and 4.0 mL of toluene were added. Then, the mixture was stirred at 114° C. for 2 hours and 20 minutes, and disappearance of compound 4 and bis-(4-bromo-phenyl)-(4-tent-butyl-2,6-dimethyl-phenyl)amine was confirmed by high performance liquid chromatography. Then, 42.6 mg (0.20 mmol) of 4-t-butylbromo-benzene and 2.0 mL of toluene were added, and 0.87 mg (0.001 mmol) of tris(dibenzylideneacetone)dipalladium, 2.57 in (0.0073 mmol) of tris(2-Methoxyphenyl)phosphine, 1.0 mL of toluene and 2.7 mL of a 33 wt % cesium carbonate aqueous solution were added. Then, the mixture was stirred at 114° C. for 2 hours and 25 minutes, then, 0.090 g (0.41 mmol) of 4-(4,4,5,5-tetramethyl-1,3,2-dioxaborolane-2-yl)toluene and 2.0 mL of toluene were added and the mixture was stirred at 114° C. for 2 hours.

After cooling down to room temperature, the organic layer of the reaction solution was dropped into 165 mL of methanol to obtain a precipitate which was then filtrated and dried, to obtain yellow solid. The above-described yellow solid was dissolved in 71 mL of toluene, and the solution was subjected to column chromatography with silica gel and active alumina, and concentrated and dried to obtain 0.59 g of solid. 0.59 g of the solid was dissolved in tetrahydrofuran, and the solution was dropped into acetone to obtain a precipitate which was then filtrated and dried, and this series of operations were repeated 3 times, further, the solid was dissolved in toluene, and the solution was dropped into methanol to obtain a precipitate which was then filtrated and dried, to obtain 0.52 g of the intended alternating copolymer 1. The polystyrene-reduced number average molecular weight and weight average molecular weight were Mn=$6.5\times10^4$ and Mw=$1.1\times10^5$, respectively. The elemental analysis results of the alternating copolymer showed that the molar ratio of the above-described divalent group 1 to the above-described divalent group 2 was 54:46.

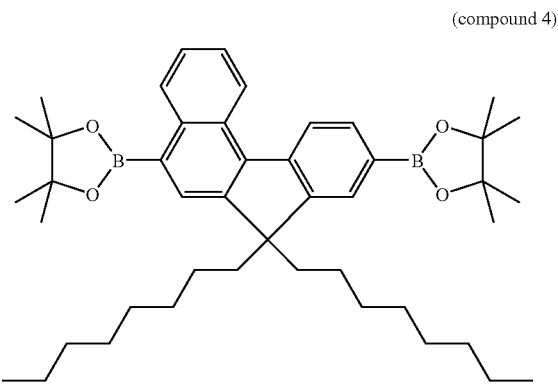 [SMILES: CCCCCCCCC1(CCCCCCCC)c2cc(B3OC(C)(C)C(C)(C)O3)ccc2-c2c1cc(B1OC(C)(C)C(C)(C)O1)c1ccccc21]

(compound 4)

Synthesis Example 9

Synthesis of Hole Transporting Polymer 1

Under an inert gas atmosphere, 1.59 g (3.0 mmol) of the following compound 8, 1.38 g (3.0 mmol) of the following compound 9, palladium acetate (2.0 mg), tris(2-methoxyphenyl)phosphine (22.2 mg), Aliquat 336 (0.39 g, manufactured by Aldrich) and toluene (30 mL) were mixed in a reaction vessel, and the mixture was heated at 105° C. Into this reaction solution, a 2M $Na_2CO_3$ aqueous solution (8.2 mL) was dropped, and the solution was refluxed for 2 hours. After the reaction, phenylboric acid (37 mg) was added, the solution was further refluxed for 2 hours. Then, a sodium diethyldithiacarbamate aqueous solution was added and the mixture was stirred at 80° C. for 2 hours. After cooling, the solution was washed with water (40 mL) twice, with a 3% acetic acid aqueous solution (40 mL) twice and with water (40 mL) twice, and the resultant solution was dropped into methanol (465 mL) and the resultant solution was filtrated to obtain a precipitate. The precipitate was dissolved in toluene (93 mL) and purified by passing through an alumina column and a silica gel column. The resultant toluene solution was dropped into methanol (465 mL) and the solution was stirred, then, the resultant precipitate was filtrated and dried. The resultant hole transporting polymer 1 showed a yielded amount of 1.4 g. Hole transporting polymer 1 had a polystyrene-reduced number average molecular weight of $1.1\times10^5$ and a polystyrene-reduced weight average molecular weight of $2.8\times10^5$.

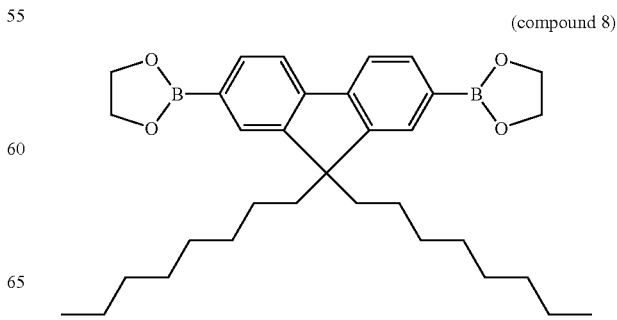

(compound 8)

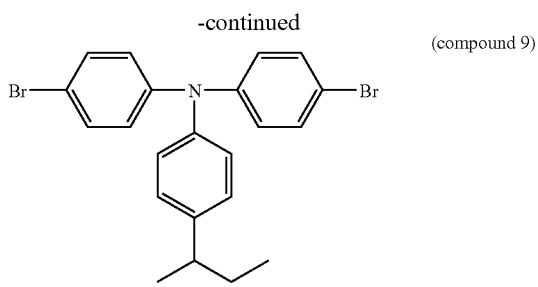

(compound 9)

Example 6

Fabrication of Light Emitting Device by Block Copolymer 2

Preparation of Solution

Block copolymer 2 obtained above was dissolved in xylene to prepare a xylene solution having a polymer concentration of 1.6 wt %.

Manufacturing of EL Device

On a glass substrate carrying an ITO film having a 1$ thickness of 150 nm formed thereon by a sputtering method, a solution obtained by filtering a suspension of poly(3,4) ethylenedioxythiophene/polystyrenesulfonic acid (manufactured by Bayer, Baytron P CH8000) through a 0.2 μm membrane filter was spin-coated to form a film having a thickness of 60 nm, and dried on a hot plate at 200° C. for 10 minutes. Next, a xylene solution (concentration: 0.5 wt %) of hole transporting polymer compound 1 obtained above was spin-coated at a revolution of 3000 rpm to form a thin film having a thickness of 10 nm. Thereafter, it was thermally treated on a hot plate at 18020 for 15 minutes under a nitrogen atmosphere.

On thus formed layer of hole transporting polymer compound 1, a xylene solution block copolymer 2 obtained above was spin-coated at a revolution of 3200 rpm to form a thin film. The thickness after film formation was about 80 nm. Further, this was dried on a hot plate of 130° C. for 20 minutes under a nitrogen atmosphere, than, as a cathode, barium was vapor-deposited at a thickness of about 5 nm, then, aluminum was vapor-deposited at a thickness of about 83 nm, to manufacture an EL device. The vapor depositions of metal were started after the degree of vacuum reached $1 \times 10^{-4}$ Pa or less.

Performance of EL Device

By applying voltage on the resulting device, EL light emission showing a peak at 450 nm was obtained from this device. When EL light emission color at a luminance of 100 cd/m$^2$ is indicated by C.I.E. chromatic coordinate value, x=0.150 and y=0.126. The EL light emission intensity was approximately in proportion to the current density. The driving voltage at 100 cd/se was 7.5 V. This device showed the light emission when the voltage is 4.9 V or above, and the maximum light emission efficiency was 0.07 cd/A.

Comparative Example 3

Fabrication of Light Emitting Device by Alternating Copolymer 1

Preparation of Solution

Alternating copolymer 1 obtained above was dissolved in xylene to prepare a xylene solution having a polymer concentration of 1.8 wt %.

Manufacturing of EL Device

An EL device was fabricated in the same manner as in Example 6 excepting that a xylene solution of alternating copolymer 1 obtained above was used instead of the xylene solution of block copolymer 2. The revolution in spin coating was 2000 rpm, and the thickness after film formation was about 82 nm.

Performance of EL Device

By applying voltage on the resulting device, EL light emission showing a peak at 455 nm was obtained from this device. When EL light emission color at a luminance of 100 cd/m$^2$ is indicated by C.I.E. chromatic coordinate value, x=0.186 and y=0.206. The EL light emission intensity was approximately in proportion to the current density. The driving voltage at 100 cd/m$^2$ was 9.6 V. This device showed the light emission when the voltage is 5.8 V or above, and the maximum light emission efficiency was 0.01 cd/A.

Figure 2:
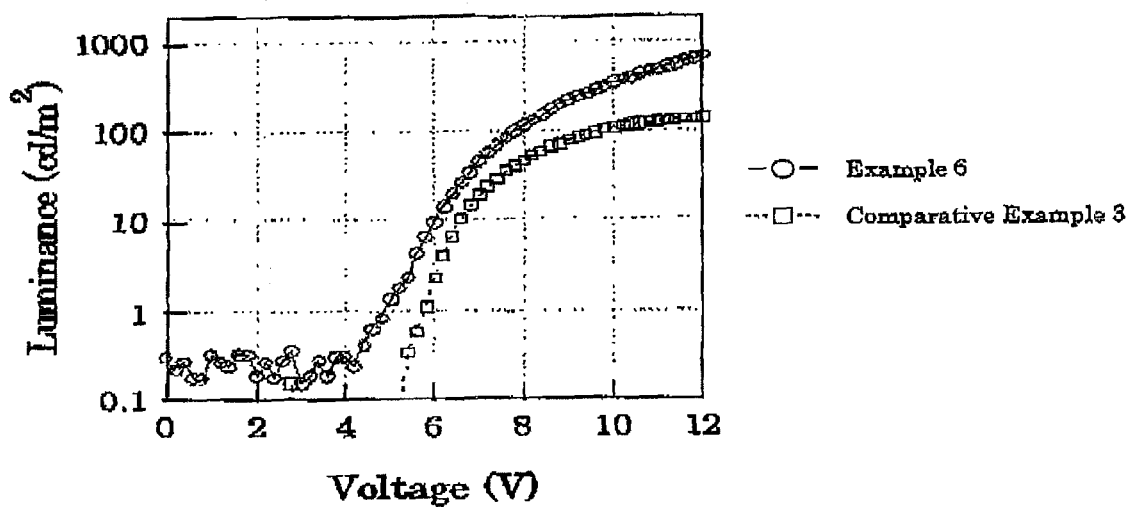
FIG. 2 shows voltage-luminance properties of a copolymer in Example 6 of the present invention and a copolymer in Comparative Example 3 in respective devices.

The voltage-current properties and the voltage-luminance properties of the device of block copolymer 2 in Example 6 and the device of alternating copolymer 1 in Comparative Example 3 are compared and shown in FIG. 1 and FIG. 2, respectively. (in the figures, ○ represents block copolymer 2 and □ represents alternating copolymer 1) As is known from the figures, the device of block copolymer 2 shows larger current density and luminance at identical voltage as compared with the device of alternating copolymer 1. The device of block copolymer 2 shows light emission at lower voltage than the device of alternating copolymer 1 shows and the device of block copolymer 2 shows higher light emission efficiency than the device of alternating copolymer 1 shows, thus, block copolymer 2 is recognized as a material which is more suitable for use in electroluminescence devices.

Synthesis Example 6

Synthesis of Compound 5

Under an inert atmosphere, into a reaction vessel was added 31-26 g (57.0 mmol) of 2,7-dibromo-9,9-dioctyl-fluorene and 390 mL of t-butylmethyl ether, and a 1.6 M hexane solution of n-butyllithium was dropped over a period of 30 minutes at −70° C. and the mixture was stirred at −20° C. for 2 hours, and stirred at 0° C. for 2 hours. Then, at −70° C., 17.5 mL (76.1 mmol) of triisopropoxyborane was dropped over a period of 20 minutes, and the mixture wan stirred at the same temperature for 1 hour and at room temperature for 16 hours. Then, at −20° C., 88 mL of a 5% hydrochloric acid aqueous solution was dropped over a period of 20 minutes, and the mixture was stirred at room temperature for 30 minutes. An aqueous layer was removed from the organic layer, 88 ml. Of water was added to the organic layer and the mixture was stirred, and the aqueous layer was removed from the organic layer, and this series of operations were repeated 3 times, 88 mL of saturated saline was added to the organic layer and the mixture was stirred, and the aqueous layer was removed from the organic layer, and the resultant organic layer was dried over anhydrous magnesium sulfate and the solvent was removed. Then, silica gel chromatography was performed using hexane and chloroform as a developing solvent, and the solvent was distilled off, and drying under reduced pressure was performed to obtain 15.87 g of white solid. Under an inert atmosphere, into a reaction vessel equipped with a Dean Stark was added 6.89 g of the solid, 1.50 g of catechol and 100 mL of toluene, and the mixture was stirred at 100° C. for 8 hours while dehydration-refluxing. The solution was cooled down to room temperature and concentrated to dryness, to obtain 7.93 g of solid. The solid was re-crystallized from hexane and acetonitrile once, re-crystallized from chloroform and acetonitrile twice, and re-crystallized from hexane once, to obtain 3.30 g of the intended compound 5 (yield: 22.7%, LC area percentage: 99.6%).

(compound 5)

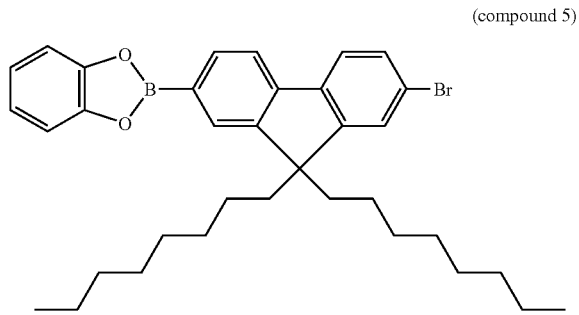 [SMILES: CCCCCCCCC1(CCCCCCCC)c2cc(Br)ccc2-c2ccc(B3Oc4ccccc4O3)cc21]

Synthesis Example 7

Synthesis of Compound 6-1

Into a reaction vessel was added 200.0 g (0.855 mol) of 4-iodoanisole, 441.0 g (2.56 mol) of 4-bromoaniline and 5.60 g (0.031 mol) of 1,10-phenanthroline, and an atmosphere in the vessel was purged with an argon gas, and 545 mL of toluene was added. To this was added 3.08 g (0.031 mol) of cuprous chloride, 374.9 g (6.68 mol) of potassium hydroxide and 11 mL of toluene, and the mixture was stirred at 125° C. for 2 hours. The mixture was cooled down to room temperature, and 545 mL of chloroform was added and the mixture was filtrated, and the filtrate was washed with 2 N hydrochloric acid and distilled water and the organic layer was concentrated to dryness, to obtain 141.8 g of a dark violet substance. 14.9 g of the dark violet substance was purified by silica gel column chromatography (developing solvent: hexane/Chloroform=1/3), and the eluate was concentrated to dryness and dried under reduced pressure to obtain 4.4 g of the intended compound 6-1 (yield: 18%).

LC-MS (APPI/posi): 278 [M+H$^+$]

(compound 6-1)

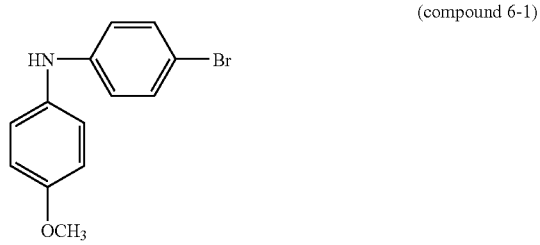 [SMILES: COc1ccc(Nc2ccc(Br)cc2)cc1]

Synthesis of Compound 6-2

Into a reaction vessel was added 10.00 g (36.0 mmol) of the above-described compound 6-1, 35.58 g (108 mmol) of p-diiodobenzene and 0.24 g (1.3 mmol) of 1,10-phenanthroline, and an atmosphere in the vessel was purged with an argon gas, and 206 mL of toluene was added. To this was added 0.13 g (1.3 mmol) of cuprous chloride, 15.77 g (2$1 mmol) of potassium hydroxide and 4 mL of toluene, and the mixture was stirred at 125° C. for 7 hours. The mixture was cooled down to room temperature, and 206 mL of chloroform was added and the mixture was filtrated, and the filtrate was concentrated to dryness. When the concentrated substance was dissolved in chloroform and methanol was dropped into this, a precipitate was deposited, and the precipitate was removed by filtrated and the filtrate was concentrated to obtain solid. Then, the solid was purified by silica gel column chromatography (developing solvent: hexane/chloroform=3/1), and the eluate was concentrated to dryness and dried under, reduced pressure to obtain 12.57 g of the intended compound 6-0.2 (yield: 73%).

LC-MS (APPI/posi): 480 [M+H$^+$]

(compound 6-2)

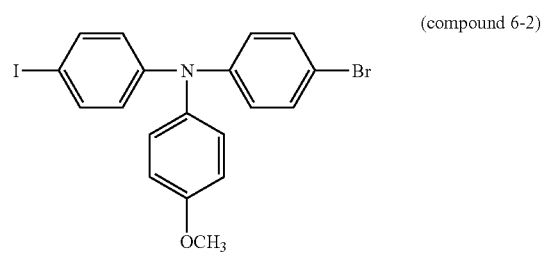 [SMILES: COc1ccc(N(c2ccc(Br)cc2)c2ccc(I)cc2)cc1]

Synthesis of Compound 6-3

Into a reaction vessel was added 2.26 g (4.7 mmol) of the above-described compound 6-2, and an atmosphere in the vessel was purged with an argon gas, and 40 mL of tetrahydrofuran was added. Then, at room temperature, 3.50 mL (7.0 mmol) of a tetrahydrofuran solution of 2 mol/L isopropylmagnesium chloride was dropped over a period of 10 minutes, and the mixture was stirred for 1 hour. After stirring, the reaction solution was cooled down to −45° C. and 1.60 mL (14 mmol) of trimethoxyborane was dropped over a period of 10 Minutes, and the mixture was stirred at −45° C. for 30 minutes, further, stirred at room temperature for 30 minutes. The reaction solution was dropped into 25 mL of 2 N hydrochloric acid and toluene was added to this and the mixture was stirred, than, the aqueous layer was removed from the organic layer. To the organic layer was added 2 N hydrochloric acid and the aqueous layer was removed from the organic layer, and saturated saline was added to the organic layer and the aqueous layer was removed from the organic layer, and the organic layer was dried over anhydrous magnesium sulfate, and concentrated to dryness, to obtain an oily substance. The oily substance was dissolved in chloroform, and silica gel column chromatography (developing solvent: chloroform) was performed. Then, 90 mL of toluene and 0.56 g (4.7 mmol) of pinacol ware added, and the mixture was stirred at 125° C. for 2 hours. The mixture was cooled down to room temperature, water was added and the mixture was stirred, then, the aqueous layer was removed from the organic layer, and the resultant organic layer was dried over anhydrous magnesium sulfate, and concentrated to dryness and dried under reduced pressure, to obtain 0.64 g of the intended compound 6-3 (yield: 28%) as oily substance.

LC-MS (APPI/posi): 480 [M+H$^+$]

(compound 6-3)

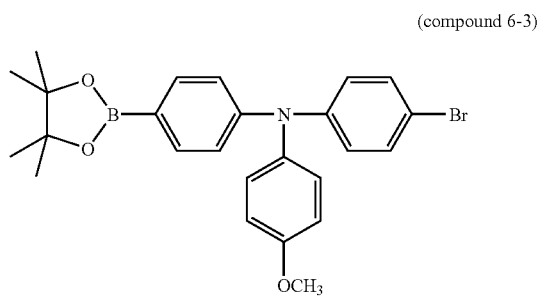 [SMILES: COc1ccc(N(c2ccc(Br)cc2)c2ccc(B3OC(C)(C)C(C)(C)O3)cc2)cc1]

Synthesis Example 8

Synthesis of Compound 7-1

Under an inert gas atmosphere, into a reaction vessel was added 1.56 g (6.98 mmol) of palladium acetate, 2.8 g (13.96 mmol) of tri-t-butylphosphine and 1.6 L of xylene and the mixture was 0.5 stirred at 28° C. for 1 hour, and 128.4 g (768 mmol) of carbazole, 160.0 g (695 mmol) of 1-bromo-4-butyloxybenzene and 1.6 L of xylene were added and the mixture was stirred. Then, at 80° C., 80.0 g (838 mmol) of sodium-tent-butoxide and 0.8 L of xylene ware added and the mixture was stirred overnight at 130° C. The reaction solution was cooled down to room temperature, then, filtrated through a filtration apparatus on which Celite had been spread, and concentrated to dryness, then, silica gel column chromatography wag performed to obtain 150.6 g of the intended compound 7-1 (yields 66%).

(compound 7-1)

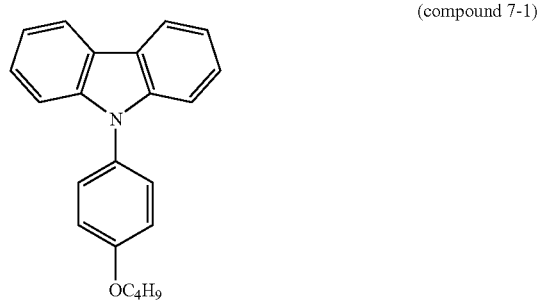

Synthesis of Compound 7-2

Under an inert gas atmosphere, into a reaction vessel was added 130.0 g (412 mmol) of compound 7-1 and 2.5 L of N,N-dimethylformamide, and at 4° C., 143.8 g (808 mmol) of H-bromo-succinimide was added, then, the mixture was stirred at room temperature overnight. Then, 2 kg of ice was added to the reaction solution and the mixture was stirred, then, the deposited solid was filtrated and washed with n-hexane, and dried wider reduced pressure. Then, silica gel column chromatography was performed, then, re-crystallization was performed from toluene and n-hexane, to obtain 159.2 g of the intended compound 7-2 (yield: 81%).

GC-MS(EI): 473

$^1$H-NMR 1.02 (t, 3H), 1.55 (m, 2H), 1.84 (m, 2H), 4.06 (t, 2H), 7.09 (2H, d), 7.17 (d, 2H), 7.36 (d, 2H), 7.50 (d, 2H), 8.18 (s, 2H)

(compound 7-2)

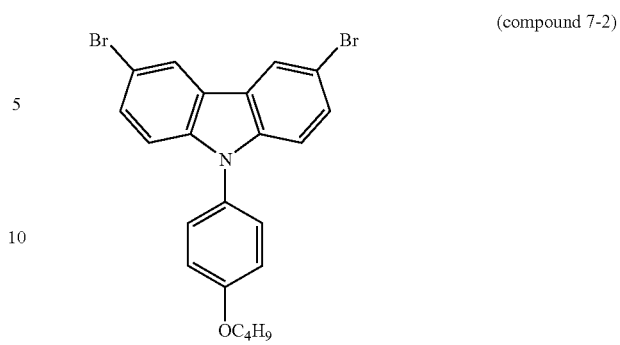

Synthesis of Compound 7-3

Under an inert gas atmosphere, into a reaction vessel was added 60.0 g (127 mmol) of compound 7-2, 19.3 g (76 mmol) of pinacoldiborane, 37.3 g (380 mmol) of potassium acetate, 600 mL of dehydrated 1,4-dioxane and 3.1 g (3.8 mmol) of dichloro[1,1'-bis(diphenylphosphino)ferrocene]palladium and the mixture was stirred at 50° C. for 4 hours. The mixture was cooled down to room temperature, then, filtrated through a filtering apparatus on which Celite had been spread, and concentrated to dryness. Then, the mixture was dissolved in toluene, water was added to this and the mixture was stirred, and the aqueous layer was removed from the organic layer, and this series of operations were repeated twice, and the organic layer was dehydrated over anhydrous magnesium sulfate, and anhydrous magnesium sulfate was removed, then, the organic layer was concentrated to dryness. Then, the mixture was purified by silica gel column chromatography to obtain 11.7 g of the intended compound 7-3 (yield: 184).

LC-MS (APPI/posi): 519 [M$^+$]

$^1$H-NMR: 1.02 (t, 3H), 1.40 (s, 12H), 1.55 (m, 2H), 1.84 (m, 2H) 4.06 (t, 2H), 7.09 (d, 2H), 7.16 (d, 1H), 7.28 (d, 1H), 7.30 (d, 2H), 7.46 (dd, 1H), 7.86 (d, 1H), 8.28 (d, 1H)' 8.59 (s, 1H)

(compound 7-3)

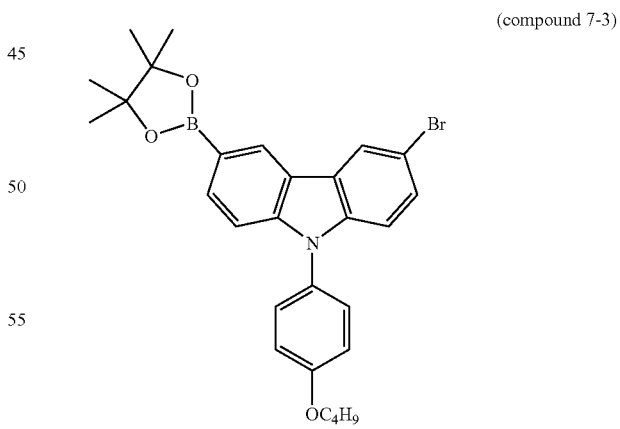

Example 7

Synthesis of Block Copolymer 4

Into a 100 mL two-necked flask was charged 0.250 g (0.43 mmol) of the above-described compound 5, and an atmosphere in the flask was purged with an argon gas. Then, 1.90 mg (0.009 mmol) of 4-t-butylbromobenzene and 8.9 mL of toluene were charged and bubbling with Ar was performed, then, the mixture was stirred at 45° C. for 5 minutes. Then, 0.59 mg (0.0006 mmol) of tris(dibenzylideneacetone)dipalladium and 1.80 mg (0.0051 mmol) of tris(2-methoxyphenyl) phosphine, and 1.0 mL of toluene were added and the mixture was stirred at 45° C. for 10 minutes, and 1.9 mL of a 33 wt % cesium carbonate aqueous solution was added. Then, the mixture was stirred at 114° C. for 30 minutes, and disappearance of compound 5 was confirmed by high performance liquid chromatography, and it was confirmed that the molecular weight of the polymer compound at peak top of SEC was $8.6 \times 10^4$ at this stage. Then, 0.307 g (0.58 mmol) of the above-described compound 3 and 2 mL of toluene were added, and 0.78 mg (0.0009 mmol) of tris(dibenzylideneacetone)dipalladium. 2.41 mg (0.0068 mmol) of tris(2-methoxyphenyl) phosphine, 1.0 mL of toluene and 2.6 mL of a 33 wt % cesium carbonate aqueous solution were added and the mixture was stirred at 114° C. for 7 hours. Then, 0.73 mg (0.0008 mmol) of tris(dibenzylideneacetone)dipalladium, 2.24 mg (0.0064 mmol) of tris(2-methoxyphenyl)phosphine and 1.0 mL of toluene were added and the mixture was stirred at 114° C. for 7 hours and 30 minutes. Then, 0.86 mg (0.0009 mmol) of tris(dibenzylideneacetone)dipalladium, 2.70 mg (0.0077 mmol) of tris(2-methoxyphenyl)phosphine and 1.0 mL of toluene were added and the mixture was stirred at 114° C. for 7 hours, and disappearance of compound 3 was confirmed by high performance liquid chromatography, and it was confirmed that the molecular weight of the polymer compound at peak to of SEC was $9.9 \times 10^4$ at this stage, confirming an increase in molecular weight by copolymerization. Then, 0.062 g (0.28 mmol) of 4-(4,4,5,5-tetramethyl-1,3,2-dioxaborolane-2-yl)toluene and 2 mL of toluene were added and, 0.32 mg (0.0003 mmol) of tris(dibenzylideneacetone)dipalladium, 0.97 mg (0.003 mmol) of tris(2-methoxyphenyl) phosphine, 1.0 mL of toluene and 1.1 mL of a 33 wt % cesium carbonate aqueous solution, were added and the mixture was stirred at 114° C. for 4 hours. After cooling down to room temperature, the aqueous layer of the reaction solution was removed from the organic layer, and the organic layer was dropped into 90 mL of methanol to obtain a precipitate which was then filtrated and dried, to obtain yellow solid. The above-described yellow solid was dissolved in 30 mL of toluene, and the solution was subjected to column chromatography with silica gel and active alumina, and the eluate was concentrated. The concentrated liquid was dropped into methanol, and the deposited precipitate was filtrated and dried, to obtain 0.25 g of solid. 0.21 g of the solid was dissolved in tetrahydrofuran, and the solution was dropped into acetone to obtain a precipitate which was then filtrated and dried, and this series of operations were repeated 3 times, to obtain 0.17 g of the intended block copolymer 4. The polystyrene-reduced number average molecular weight and weight average molecular weight were $Mn=7.7 \times 10^4$ and $Mw=1.3 \times 10^5$, respectively. The elemental analysis results of the block copolymer showed that the molar ratio of the following divalent group 3 to the above-described divalent group 2 was 55:45. Therefore, block copolymer 4 was composed of two blocks; one containing the divalent group 3 as a constituent unit and one containing the divalent group 2 as a constituent unit, and the chemical formula weights of the divalent group 3 and the divalent group 2 are 388.6 and 327.4, respectively, thus, the block containing the divalent group 3 aa a constituent unit had a number average polymerization degree of 109 and the block containing the divalent group 2 as a constituent unit had a number average polymerization degree of 106.

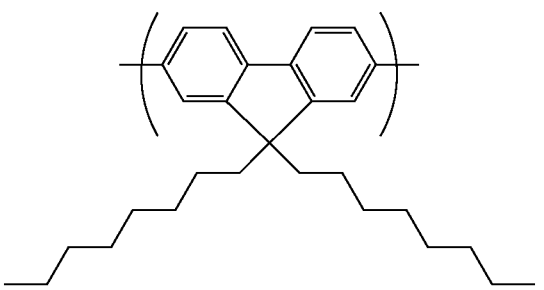

(divalent group 3)

<NMR Measurement of Block Copolymer 4>

Block copolymer 4 obtained above was used to prepare a tetrahydrofuran-$d_8$ solution, and $^1H$ detection $^1H$-$^{13}C$ two dimensional correlation spectrum (HMQC spectrum) and NOE correlation spectrum (NOESY spectrum) were measured at 30° C. As the NMR apparatus. Avance 600 type nuclear magnetic resonance apparatus manufactured by Bruker was used.

In measurement of HMQC spectrum, protons represented by $H_{A1}$ and $H_{B1}$ in the formula (X1) were present at positions of 7.75 ppm and 7.80 ppm, respectively, and carbon 13's represented by $C_{A1}$ and $C_{B1}$ in the formula (X1) we present at positions of 126.5 ppm and 121.6 ppm, respectively, and a proton-carbon 13 correlation peak was observed for a pair of proton and carbon represented by $H_{A1}$ and $C_{A1}$, $H_{B1}$ and $C_{B1}$.

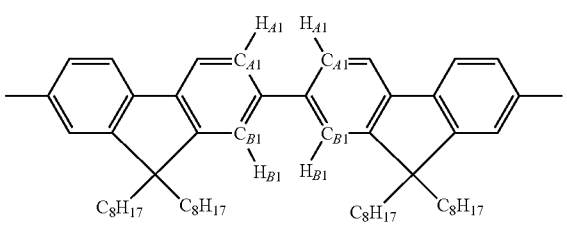

(X1)

On the HMQC spectrum, protons represented by $H_{C1}$ and $H_{D1}$, in the formula (X2) were present at positions of 7.44 ppm and 7.02 ppm, respectively, and chemical shifts of carbon 13's represented by $C_{C1}$ and $C_{D1}$ in the formula (X2) were present at positions of 127.1 ppm and 120.1 ppm, respectively, and a proton-carbon 13 correlation peak was observed for a pair of proton and carbon represented by $H_{C1}$ and $C_{C1}$, $H_{D1}$ and $C_{D1}$.

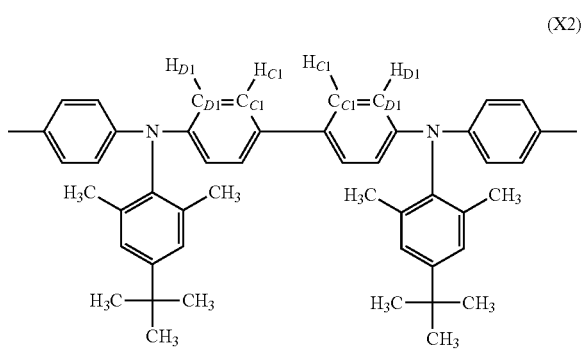

(X2)

On the other hand, on the HMQC Spectrum, protons represented by $H_{A2}$ and $H_{B2}$ in the formula (X3) were present at positions of 7.64 ppm and 7.69 ppm, respectively, and carbon 13's represented by $C_{A2}$ and $C_{B2}$ in the formula (X3) were present at positions of 125.5 ppm and 121.4 ppm, respectively, and a proton-carbon 13 correlation peak was observed for a pair of proton and carbon represented by $H_{A2}$ and $C_{A2}$, $H_{B2}$ and $C_{B2}$.

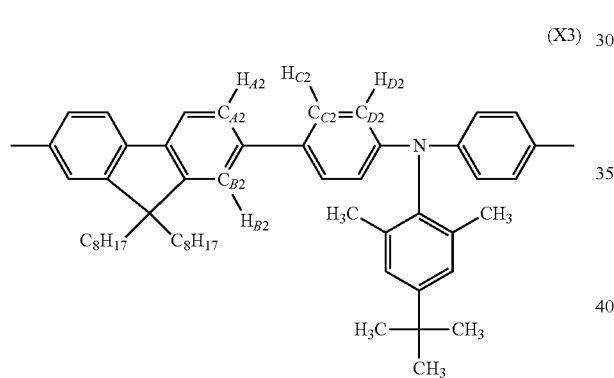

(X3)

On the HMQC spectrum, protons represented by $H_{C2}$ and $H_{D2}$ in the formula (X3) were present at positions of 7.59 ppm and 7.08 ppm, respectively, and chemical shifts of carbon 13's represented by $C_{C2}$ and $C_{D2}$ in the formula (X3) were present at positions of 127.9 ppm and 121.5 ppm, respectively, and a proton-carbon 12 correlation peak was observed for a pair of proton and carbon represented by $H_{C2}$ and $C_{C2}$, $H_{D2}$ and $C_{D2}$.

Further, in the HORSY measurement carried out, NOE peaks were observed at emersion positions of cross peaks between protons represented by $H_{B2}$ and $H_{C2}$ in the formula (X3), that is, at (F1 axis, F2 axis)=(7.69 ppm, 7.59 ppm) and (F1 axis. F2 axis) (7.59 ppm, 7.69 ppm). This shows that distance between protons represented by $H_{B2}$ and $H_{C2}$ in the Formula (X3) is smaller, and clearly shows that attributions of $H_{B2}$ and $H_{C2}$ in the formula (X3) are correct.

When summarized, it was confirmed from these findings that block copolymer 4 contained a block of the formula (X1) and a block of the formula (X2), and further, a connecting unit represented by the formula (X3) was present.

Example 8

Fabrication of Polymer Light Emitting Device by Block Copolymer 4

Preparation of Solution

Block copolymer 4 obtained above was dissolved in xylene to prepare a xylene solution having a polymer concentration of 1.6 wt %.

Manufacturing of EL Device

An EL device was fabricated in the same manner as in Example 6 excepting that a xylene solution of block copolymer 4 obtained above was used instead of the xylene solution of block copolymer 2. The revolution in spin coating was 3000 rpm, and the thickness after film formation was about 79 nm.

Performance of EL Device

By applying voltage on the resulting device, EL light emission showing a peak at 430 nm was obtained from this device. When EL light emission color at a luminance of 100 cd/m² is indicated by C.I.E. chromatic coordinate value, x=0.162 and y=0.066. The EL light emission intensity was approximately in proportion to the current density. The driving voltage at 100 cd/m² was 6.0 V. This device showed the light emission when the voltage is 4.3 V or above, and the maximum light emission efficiency was 0.30 cd/A.

Example 9

Synthesis of Block Copolymer 5

Into a 100 mL two-necked flask was charged 0.250 g (0.43 mmol) of the above-described compound 5, and an atmosphere in the flask was purged with an argon gas. Then, 1.90 mg (0.009 mmol) of 4-t-butylbromobenzene and 8.9 mL of toluene were charged and the mixture was stirred at 45° C. for 5 minutes. Then, 0.58 mg (0.0006 mmol) of tris(dibenzylideneacetone)dipalladium and 1.83 mg (0.0052 mmol) of tris(2-methoxyphenyl)phosphine, and 1.0 mL of toluene were added, and the mixture was stirred at 45° C. for 10 minutes, and 1.9 mL of a 33 wt. % cesium carbonate aqueous solution was added. Then, the mixture was stirred at 114° C. for 30 minutes, and disappearance of compound 5 was confirmed by high performance liquid chromatography, and it was confirmed that the molecular weight of the polymer compound at peak top of SEC was $7.6 \times 10^4$ at this stage. Then, 0.279 g (0.58 mmol) of the above-described compound 6-3 and 2 mL of toluene were added, and 0.79 mg (0.0009 mmol) of tris (dibenzylideneacetone)dipalladium, 2.37 mg (0.0067 mmol) of tris(2-methoxyphenyl)phosphine, 1.0 mL of toluene and 2.6 mL of a 33 wt % cesium carbonate aqueous solution were added and the mixture was stirred at 114° C. for 3 hours. Then, 0.83 mg (0.0009 mmol) of tris(dibenzylideneacetone) dipalladium, 2.75 mg (0.0078 mmol) of tris(2-methoxyphenyl)phosphine and 1.0 mL of toluene were added and the mixture was stirred at 114° C. for 7 hours and 30 minutes. Then, 0.81 mg (0.0009 mmol) of tris(dibenzylideneacetone) dipalladium, 2.32 mg (0.0066 mmol) of tris(2-methoxyphenyl)phosphine and 1.0 mL of toluene were added and the mixture was stirred at 114° C. for 9 hours. Then, 0.78 mg (0.0009 mmol) of tris(dibenzylideneacetone)dipalladium. 2.31 mg (0.0066 mmol) of tris(2-methoxyphenyl)phosphine and 1.0 mL of toluene were added and the mixture was stirred at 114° C. for 17 hours. Disappearance of compound 6-3 was confirmed by high performance liquid chromatography, and it was confirmed that the molecular weight of the polymer compound at peak top of SEC was $8.9 \times 10^4$ at this stage, confirming an increase in molecular weight by copolymerization. Then, 0.057 g (0.26 mmol) of 4-(4,4,5,5-tetramethyl-1,3,2-dioxaborolane-2-yl)toluene and 2 ml, of toluene were added and, 0.37 mg (0.0004 mmol) of tris(dibenzylideneacetone)dipalladium, 0.99 mg (0.003 mmol) of tris(2-methoxyphenyl)phosphine, 1.0 mL of toluene and 1.1 mL of a 33 wt % cesium carbonate aqueous solution were added and the mixture was stirred at 114° C. for 2 hours and 30 minutes. After cooling down to room temperature, the aqueous layer of the reaction solution was removed from the organic layer, and the organic layer was dropped into 120 mL of methanol to obtain a precipitate which was then filtrated and dried, to obtain yellow solid. The above-described yellow solid was dissolved in 27 mL of toluene, and the solution was subjected to column chromatography with silica gel and active alumina, and the eluate was concentrated. The concentrated liquid was dropped into methanol, and the deposited precipitate was filtrated and dried, to obtain 0.16 g of solid. 0.13 g of the solid was dissolved in toluene, and the solution was dropped into methanol to obtain a precipitate which was then filtrated and dried, and this series of operations were repeated twice, to obtain 0.12 g of the intended block copolymer 5. The polystyrene-reduced number average molecular weight and weight average molecular weight were Mn=$5.3 \times 10^4$ and Mw=$1.1 \times 10^5$, respectively. The elemental analysis results of the block copolymer showed that the molar ratio of the above-described divalent group 3 to the following divalent group 4 was 64:36. Therefore, block copolymer 5 was composed of two blocks: one containing the divalent group 3 as a constituent unit and one containing the divalent group 4 as a constituent unit, and the chemical formula weights of the divalent group 3 and the divalent group 4 are 388.6 and 273-3, respectively, thus, the block containing the divalent group 3 as a constituent unit had a number average polymerization degree of 87 and the block containing the divalent group 4 as a constituent unit had a number average polymerization degree of 70.

(divalent group 4)

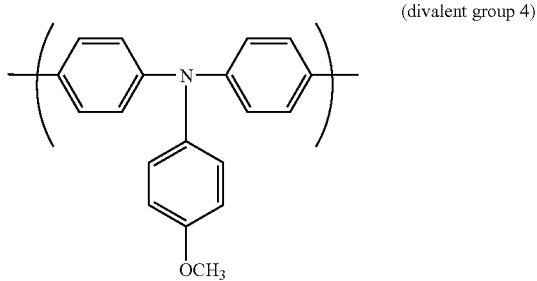

<NMR Measurement of Block Copolymer 5>

Block copolymer 5 was used to prepare a tetrahydrofuran-$d_8$ solution, and $^1$H detection $^1$H—$^{13}$C two dimensional correlation spectrum (HMQC spectrum) and NOE correlation spectrum (NOISY spectrum) were measured at 30° C. As the NMR apparatus, Avance boa type nuclear magnetic resonance apparatus manufactured by Bruker was used.

In measurement of HMQC spectrum, protons represented by $H_{A1}$ and and $H_{B1}$ in the formula (Y1) were present at positions of 7.75 ppm and 7.80 ppm, respectively, and carbon 13's represented by $C_{A1}$ and $C_{B1}$ in the formula (Y1) were present at positions of 126.5 ppm and 1216 ppm, respectively, and a proton-carbon 13 correlation peak was observed for a pair of proton and carbon represented by $H_{A1}$ and $C_{A1}$, $H_{B1}$ and $C_{B1}$.

(Y1)

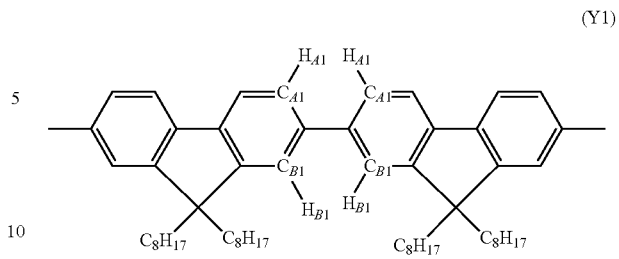

On the HMQC spectrum, protons represented by $H_{C1}$ and $H_{D1}$ in the formula (Y2) were present at positions of 7.47 ppm and 7.08 ppm, respectively, and chemical shifts of carbon 13 represented by $C_{C1}$ and $C_{D1}$ in the formula (Y2) were present at positions of 127.3 ppm and 123.2 ppm, respectively, and proton-carbon 13 correlation peaks were observed for a pair of proton and carbon represented by $H_{C1}$ and $C_{C1}$, $B_{D1}$ and $C_{D1}$.

(Y2)

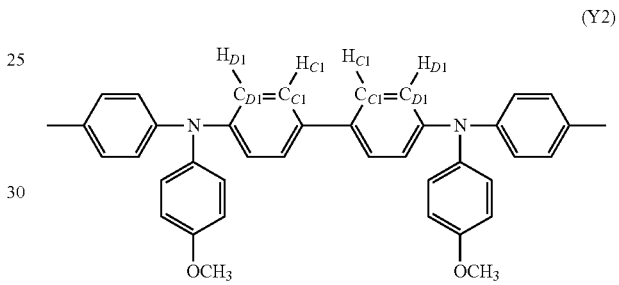

On the other hand, on the HMQC spectrum, protons represented by $H_{A2}$ and $H_{B2}$ in the formula (Y3) were present at positions of 7.63 ppm and 7.68 ppm, respectively, and carbon 13's represented by $C_{A2}$ and $C_{B2}$ in the formula (Y3) were present at positions of 125.9 ppm and 121.2 ppm, respectively, and proton-carbon 13 correlation peaks were observed for a pair of proton and carbon represented by $H_{A2}$ and $C_{A2}$, $H_{B2}$ and $C_{B2}$.

(Y3)

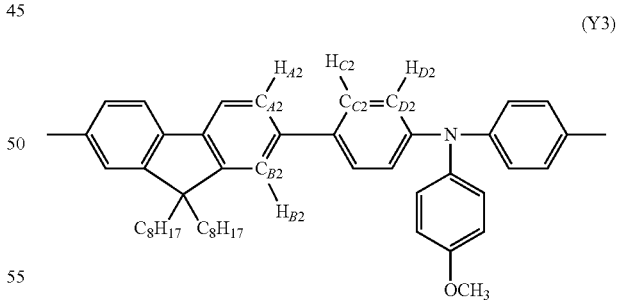

On the HMQC spectrum, protons represented by $H_{C2}$ and $H_{D2}$ in the formula (Y3) were present at positions of 7.61 ppm and 7.14 ppm, respectively, and chemical shifts of carbon 13 represented by $C_{C2}$ and $C_{D2}$ in the formula (Y3) were present at positions of 127-9 ppm and 124.8 ppm, respectively, and proton-carbon 13 correlation peaks were observed for a pair of proton and carbon represented by $H_{C2}$ and $C_{C2}$, $H_{D2}$ and $C_{D2}$.

Further, in the NOESY measurement carried out, NOE peaks were observed at emersion positions of cross peaks between protons represented by $H_{B2}$ and $H_{C2}$ in the formula (Y3), they are, at (Ti axis. F2 axis)=(7.68 ppm, 7.61 ppm) and (F1 axis, F2 axis) (7.61 ppm, 7.68 ppm). This shows that distance between protons represented by $H_{B2}$ and $H_{C2}$ in the formula (Y3) is smaller, and clearly shows that attributions of $H_{B2}$ and $H_{C2}$ in the formula (Y3) are correct.

When summarized, it was confirmed from these findings that block copolymer 5 contained a block of the formula (Y1) and a block of the formula (Y2), and further, a connecting unit represented by the formula (Y3) was present.

Example 10

Fabrication of Polymer Light Emitting Device by Block Copolymer 5

Preparation of Solution

Block copolymer 5 obtained above was dissolved in chloroform to prepare a chloroform solution having a polymer concentration of 0.5 wt %.

Manufacturing of EL Device

An EL device was fabricated in the same manner as in Example 6 excepting that a chloroform solution of block copolymer 5 obtained above was used instead of the xylene solution of block copolymer 2. The revolution in spin coating was 3600 rpm, and the thickness after film formation was about 90 nm.

Performance of EL Device

By applying voltage on the resulting device, EL light emission showing a peak at 445 nm was obtained from this device. When EL light emission color at a luminance of 100 cd/m$^2$ is indicated by C.I.E. chromatic coordinate value, x=0.101 and y=0.134. The EL light emission intensity was approximately in proportion to the current density. The driving voltage at 100 cd/m$^2$ was 8.0 V. This device showed the light emission when the voltage is 5.7 V or above, and the maximum light emission efficiency was 0.14 cd/A.

Example 11

Synthesis of Block Copolymer 6

Into a 200 mL three-necked flask was charged 0.600 g (1.02 mmol) of the above-described compound 5, and an atmosphere in the flask was purged with an argon gas. Then, 4.53 mg (0.021 mmol) of 4-t-butylbromobenzene and 22.0 mL of toluene were charged and the mixture was stirred at 45° C. for 5 minutes. Then, 1.46 mg (0.0016 mmol) of tris(dibenzylideneacetone)dipalladium and 4.44 mg (0.013 mmol) of tris(2-methoxyphenyl)phosphine, and 2.0 mL of toluene were added and the mixture was stirred at 45° C. for 10 minutes, and 4.7 mL of a 33 wt % cesium carbonate aqueous solution was added. Then, the mixture was stirred at 114° C. for 30 minutes, and disappearance of compound 5 was confirmed by high performance liquid chromatography, and it was confirmed that the molecular weight of the polymer compound at peak top of SEC was 6.9×10$^4$ at this stage. Then, 0.718 g (1.38 mmol) of compound 7-3 and 5 mL of toluene were added, and 1.54 mg (0.0020 mmol) of tris(dibenzylideneacetone)dipalladium, 5.61 mg (0.016 mmol) of tris(2-methoxyphenyl)phosphine, 2.0 mL of toluene and 6.5 mL of a 33 wt % cesium carbonate aqueous solution were added and the mixture was stirred at 114° C. for 3 hours. Then, 1.94 mg (0.0021 mmol) of tris(dibenzylideneacetone)dipalladium, 6.00 mg (0.017 mmol) of tris(2-methoxyphenyl)phosphine and 2.0 mL of toluene were added. Then, the mixture was stirred at 114° C. for 19 hours and 30 minutes, and disappearance of compound 7-3 was confirmed by high performance liquid chromatography, and it was confirmed that the molecular weight of the polymer compound at peak top of SEC was 8.4×10$^4$ at this stage, confirming an increase in molecular weight by copolymerization. Then, 0.138 g (0.63 mmol) of 4-(4,4,5,5-tetramethyl-1,3,2-dioxaborolane-2-yl)toluene and 4.8 mL of toluene were added and, 0.80 mg (0.0009 mmol) of tris(dibenzylideneacetone)dipalladium, 2457 mg (0.0073 mmol) of tris(2-methoxyphenyl)phosphine, 1.0 mL of toluene and 3.0 mL of a 33 wt % cesium carbonate aqueous solution were added and the mixture was stirred at 114° C. for 1 hour and 30 minutes. After cooling down to room temperature, the aqueous layer of the reaction solution was removed from the organic layer, and the organic layer was dropped into 194 mL of methanol to obtain a precipitate which was then filtrated and dried, to obtain yellow solid. 81 mL of toluene was added to the above-described yellow solid, and the solution was subjected to column chromatography with silica gel and active alumina, and the eluate was concentrated. The concentrated liquid was dropped into methanol, and the deposited precipitate was filtrated and dried, to obtain 0.52 g of solid. 0.52 g of the solid was dissolved in tetrahydrofuran and insoluble part was removed by filtration, and the filtrate was concentrated to dryness. This was dissolved in toluene and the solution was dropped into methanol to obtain a precipitate which was then filtrated and dried. This was dissolved in tetrahydrofuran and the solution was dropped into acetone to obtain a precipitate which was then filtrated and dried, and this series of operations were repeated three times, further, the solid was dissolved LA toluene and the solution was dropped into methanol to obtain a precipitate which was then filtrated and dried, to obtain 0.17 g of the intended block copolymer 6. The polystyrene-reduced number average molecular weight and weight average molecular weight were Mn=7.3×10$^4$ and Mw=1.2×10$^5$, respectively. The elemental analysis results of the block copolymer showed that the molar ratio of the above-described divalent group 3 to the divalent group 5 was 92:8. Therefore, block copolymer 6 was composed of two blocks: one containing the divalent group 3 as a constituent unit and one containing the divalent group 5 as a constituent unit, and the chemical formula weights of, the divalent group 3 and the divalent group 5 are 388.6 and 313.4, respectively, thus, the block containing the divalent group 3 as a constituent unit had a number average polymerization degree of 173 and the block containing the divalent group 5 as a constituent unit had a number average polymerization degree of 19.

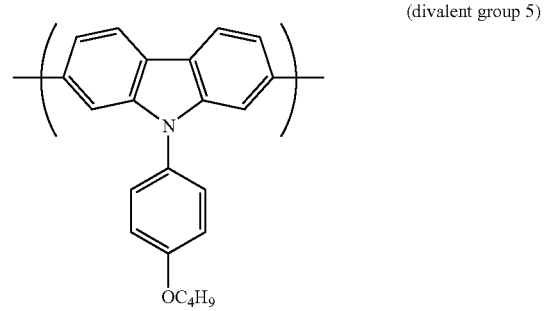

(divalent group 5)

Example 12

Fabrication of Polymer Light Emitting Device by Block Copolymer 6

Preparation of Solution

Block copolymer 6 obtained above was dissolved in xylene to prepare a xylene solution having a polymer concentration of 1.6 wt %.

Manufacturing of EL Device

An EL device was fabricated in the same manner as in Example 6 excepting that a xylene solution of block copolymer 6 obtained above was used instead of the xylene solution of block copolymer 2. The revolution in spin coating was 3000 rpm, and the thickness after film formation was about 78 nm.

Performance of EL Device

By applying voltage on the resulting device, EL light emission showing a peak at 430 nm was obtained from this device. When EL light emission color at a luminance of 100 cd/m$^2$ is indicated by C.I.E. chromatic coordinate value, x=0.170 and y=0.108. The EL light emission intensity was approximately in proportion to the current density. The driving voltage at 100 cd/m$^2$ was 6.4 V. This device showed initiation of light emission 0.5 from 4.9 V, and the maximum light emission efficiency was 1.02 cd/A.

Example 13

Synthesis of Block Copolymer 7

Into a 200 mL three-necked flask was charged 0.650 g (1.01 mmol) of the above-described compound 1, and an atmosphere in the flask was purged with an argon gas. Then, 4.52 mg (0.021 mmol) of 4-t-butylbromobenzene and 21.5 mL of toluene were charged and the mixture was stirred at 45° C. for 5 minutes. Then, 1.43 mg (0.0016 mmol) of tris(dibenzylideneacetone)dipalladium and 4.40 mg (0.013 mmol) of tris(2-methoxyphenyl)phosphine, and 2.0 mL of toluene were added and the mixture was stirred at 45° C. for 10 minutes, and 4.6 mL of a 33 wt % cesium carbonate aqueous solution was added. Then, the mixture was stirred at 114° C. for 2 hours, and disappearance of compound 1 was confirmed by high performance liquid chromatography, and it was confirmed that the molecular weight of the polymer compound at peak top of SEC was 6.6×10$^4$ at this stage, confirming an increase in molecular weight by copolymerization. Then, 0.799 g (1.36 mmol) of the above-described compound 5 and 4.7 mL of toluene were added, and 1.95 mg (0.0021 mmol) of tris(dibenzylideneacetone)dipalladium, 6.15 mg (0.018 mmol) of tris(2-methoxyphenyl)phosphine, 2.0 mL of toluene and 6.2 mL of a 33 wt % cesium carbonate aqueous solution were added. When, the mixture was stirred at 114° C. for 1 hour and 40 minutes, and disappearance of compound 5 was confirmed by high performance liquid chromatography, and it was confirmed that the molecular weight of the polymer compound at peak top of SEC was 9.1×10$^4$ at this stage. Then, 0.726 g (1.36 mmol) of the above-described compound 3 and 4.7 mL of toluene were added, and 1.84 mg (0.0020 mmol) of tris(dibenzylideneacetone)dipalladium, 5.58 mg (0.016 mmol) of tris(2-methoxyphenyl)phosphine, 2.0 mL of toluene and 6.2 mL of a 33 wt % cesium carbonate aqueous solution were added. Then, the mixture was stirred at 114° C. for 19 hours and 50 minutes, and disappearance of compound 3 was confirmed by high performance liquid chromatography, and it was confirmed that the molecular weight of the polymer compound at peak top of SEC was 1.0×10$^5$ at this stage, confirming an increase in molecular weight by copolymerization. Then, 0.133 g (0.61 mmol) of 4-(4,4,5,5-tetramethyl-1,3,2-dioxaborolane-2-yl)toluene and 4.7 mL of toluene were added and, 0.88 mg (0.001 mmol) of tris(dibenzylideneacetone)dipalladium, 2.78 mg (0.0079 mmol) of tris(2-methoxyphenyl)phosphine, 1.0 mL of toluene and 2.8 mL of a 33 wt % cesium carbonate aqueous solution were added and the mixture was stirred at 114° C. for 2 hours. After cooling down to room temperature, the aqueous layer of the reaction solution was removed from the organic layer, and the organic layer was dropped into 300 mL of methanol to obtain a precipitate which was then filtrated and dried, to obtain yellow solid. The above-described yellow solid was dissolved in 133 mL of toluene, and the solution was subjected to column chromatography with silica gel and active alumina, and the eluate was concentrated. The concentrated liquid was dropped into methanol, and the deposited precipitate was filtrated and dried, to obtain 1.13 g of solid. 1.13 g of the solid was dissolved in tetrahydrofuran and the solution was dropped into acetone to obtain a precipitate which was then filtrated and dried, and this series of operations were repeated three times, further, the solid wad dissolved in toluene and the solution was dropped into methanol to obtain a precipitate which was than filtrated and dried, to obtain 0.97 g of the intended block copolymer 7. The polystyrene-reduced number average molecular weight and weight average molecular weight were Mn=6.0×10$^4$ and Mw=1.5×10$^5$, respectively. The following NMR measurement results of the block copolymer showed that the molar ratio of the above-described divalent group 1, the above-described divalent group 3 and the above-described divalent group 2 was 27:41:32. Therefore, block copolymer 7 was composed of three blocks: one containing the divalent group 1 as a constituent unit, one containing the divalent group 3 as a constituent unit and one containing the divalent group 2 as a constituent unit, and the chemical formula weights of the divalent group 1, the divalent group 3 and the divalent group 2 are 438.7, 388.6 and 327.4, respectively, thus, the block containing the divalent group 1 as a constituent unit had a number average polymerisation degree of 49, the block containing the divalent group 3 as a constituent unit had a number average polymerization degree of 84 and the block containing the divalent group 2 as a constituent unit had a number average polymerization degree of 78.

<NMR Measurement of Block Copolymer 7>

A polymer was used to prepare a ca. 1% deuterated tetrahydrofuran solution and the solution was subjected to NMR measurement using Avance 600 nuclear magnetic resonance apparatus manufactured by Bruker at 30° C.

$^1$R-NMR of block copolymer 7 was measured to find that chemical shifts of peaks of protons represented by H$_{(1)}$ and H$_{(2)}$ in the formula (ZW1) showing the divalent group 1 on the $^1$H-NMR spectrum were 9.10 ppm and 8.67 ppm, respectively.

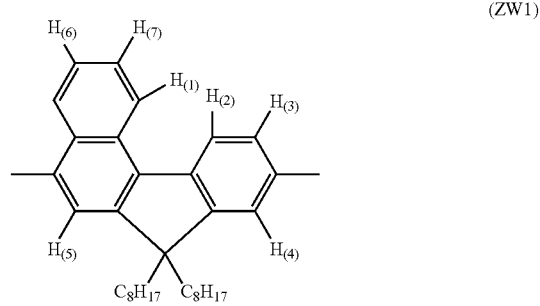

(ZW1)

Chemical shifts of peaks of protons represented by H$_{(8)}$, H$_{(9)}$ and H$_{(10)}$ in the formula (ZW2) showing the divalent group Z on the $^1$H-NMR spectrum were 7.45 ppm, 7.23 ppm and 7.04 ppm, respectively.

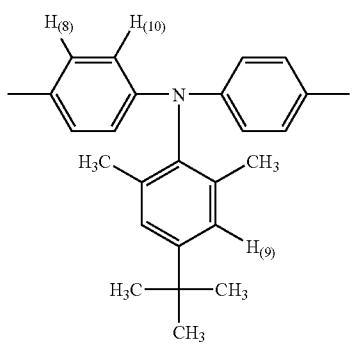

(ZW2)

Integral intensities of peaks of $H_{(1)}$, $H_{(2)}$, $H_{(8)}$, $H_{(9)}$ and $H_{(10)}$ on the $^1$H-NMR spectrum were measured, and results standardized in view of the number of equivalent protons contained in one divalent group are shown in Table 1.

TABLE 1

| Divalent group | $^1$H peak | Number of equivalent protons | Integral intensity | Standardized integral intensity | | |
|---|---|---|---|---|---|---|
| | | | | Calculation formula | Numerical value | Average |
| divalent group 1 | $H_{(1)}$ | 1 ... (a1) | 957.5 ... (b1) | b1/a1 | 957.5 | 959.7 ... (YY1) |
| | $H_{(2)}$ | 1 ... (a2) | 962.0 ... (b2) | b2/a2 | 962.0 | |
| divalent group 2 | $H_{(8)}$ | 4 ... (a8) | 4594.5 ... (b8) | b8/a8 | 1148.6 | 1168.6 ... (YY2) |
| | $H_{(9)}$ | 2 ... (a9) | 2422.0 ... (b9) | b9/a9 | 1211.0 | |
| | $H_{(10)}$ | 4 ... (a10) | 4585.2 ... (b10) | b10/a10 | 1146.3 | |

Peaks of protons represented by $H_{(11)}$, $H_{(12)}$ and $H_{(13)}$ in the formula (ZW3) showing divalent group 3 on the $^1$H-NMR spectrum were observed in a range of from 7.53 ppm to 8.09 ppm. Further, in this range, peaks of protons represented by $H_{(3)}$, $H_{(4)}$, $H_{(5)}$, $H_{(6)}$ and $H_{(7)}$. In the formula (ZW1) were also observed.

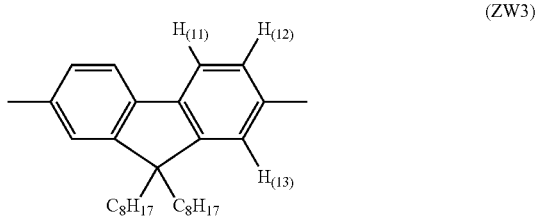

(ZW3)

The integral intensity of protons $H_{(3)}$, $H_{(4)}$, $H_{(5)}$, $H_{(6)}$ and $H_{(7)}$ was calculated to be 4798.7 ... (b3_7) by multiplying the above-described (YY1) by 5 which is the number of protons of $H_{(3)}$, $H_{(4)}$, $H_{(5)}$, $H_{(6)}$ and $H_{(7)}$. Therefore, the integral intensity of protons $H_{(11)}$, $H_{(12)}$ and $H_{(13)}$ was calculated to be 8858.5 ... (b11_13) by subtracting the value (b3_7) from 13657.2 which is the actual measurement value of the integral intensity from 7.53 ppm to 8.09 ppm on the $^1$H-NMR spectrum. Further, the standardized integral intensity (YY3) of protons $H_{(11)}$, $H_{(12)}$ and $H_{(13)}$ was calculated to be 1476.4_ (YY3) by dividing the value (b11_13) by 6 which is the number of protons of $H_{(11)}$, $H_{(12)}$ and $H_{(13)}$.

Based on the above-described facts, the molar ratio of three divalent groups constituting block copolymer 7 was found to be (divalent group 1):(divalent group 2):(divalent group 3)–formula (ZW1):formula (ZW2):formula (ZW3)=959.7: 1165.6:1476.4=27:32:41, using standardized integral intensities YY1, YY2. YY3.

Example 14

Fabrication of Polymer Light Emitting Device by Block Copolymer 7

Preparation of Solution
Block copolymer 7 obtained above was dissolved in xylene to prepare a xylene solution having a polymer concentration of 1.5 wt %.

Manufacturing of EL Device
An EL device was fabricated in the same manner as in Example 6 excepting that a xylene solution of block copolymer 7 obtained above was used instead of the xylene solution of block copolymer 2. The revolution in spin coating was 3000 rpm, and the thickness after film formation was about 77 nm.

Performance of EL Device
By applying voltage on the resulting device, EL light emission showing a peak at 450 nm was obtained from this device. When EL light emission color at a luminance of 100 cd/m$^2$ is indicated by C.I.E. chromatic coordinate value, x=0.151 and y=0.105. The EL light emission intensity was approximately in proportion to the current density. The driving voltage at 100 cd/m$^2$ was 5.4 V. This device showed the light emission when the voltage is 4.1 V or above, and the maximum light emission efficiency was 1.33 cd/A.

Example 15

Synthesis of Block Copolymer 8

Into a reaction vessel was charged 0.650 g (1.01 mmol) of the above-described compound 1, and an atmosphere in the flask loam purged with an argon gas. Then, 4.51 mg (0.021 mmol) of 4-t-butylbromobenzene and 21.5 mL of toluene were charged and the mixture was stirred at 45° C. for 5 minutes. Then, 1.34 mg (0.0015 G mmol) of tris(dibenzylideneacetone)dipalladium and 4.14 mg (0.012 mmol) of tris(2-methoxyphenyl)phosphine, and 2.0 mL of toluene were added and the mixture was stirred at 45° C. for 10 minutes, and 4.6 mL of a 33 wt % cesium carbonate aqueous solution was added. Then, the mixture was stirred at 114° C. for 2 hours, and disappearance of compound 1 was confirmed by high performance liquid chromatography, and it was confirmed that the molecular weight of the polymer compound at peak top of SEC was $6.2 \times 10^4$ at this stage. Then, 0.799 g (1.36 mmol) of the above-described compound 5 and 4.7 mL of toluene ware added, and 1.93 mg (0.0021 mmol) of tris (dibenzylideneacetone)dipalladium, 5.84 mg (0.017 mmol) of tris(2-methoxyphenyl)phosphine, 2.0 mL of toluene and 6.2 mL of a 33 wt % cesium carbonate aqueous solution were added. Then, the mixture was stirred at 114° C. for 1 hour, and disappearance of compound 5 was confirmed by high performance liquid chromatography, and it was confirmed that the molecular weight of the polymer compound at peak top of SEC was $1.0 \times 10^4$ at this stage. Then, 0.727 g (1.36 mmol) of the above-described compound 3 and 4.7 mL of toluene were added, and 1.99 mg (0.0022 mmol) of tris(dibenzylideneacetone)dipalladium, 6.07 mg (0.017 mmol) of tris(2-methoxyphenyl)phosphine, 2.0 mL of toluene and 6.2 mL of a 33 wt % cesium carbonate aqueous solution were added.

Then, the mixture was stirred at 114° C. for 9 hours, and disappearance of compound 2 was confirmed by high performance liquid chromatography, and it was confirmed that the molecular weight of the polymer compound at peak top of SEC was $1.1 \times 10^3$ at this stage, confirming an increase in molecular weight by copolymerization. Then, 0.709 g (1.36 mmol) of the above-described compound 7-3 and 4.7 mL of toluene were added, and 1.81 mg (0.0020 mmol) of tris (dibenzylideneacetone)dipalladium, 5.49 mg (0.016 mmol) of tris(2-methoxyphenyl)phosphine, 2.0 mL of toluene and 6.2 mL of a 33 wt % cesium carbonate aqueous solution were added, and the mixture was stirred at 114° C. for 7 hours. Then, 1.90 mg (0.0021 mmol) of tris(dibenzylideneacetone) dipalladium, 5.83 mg (0.017 mmol) of tris(2-methoxyphenyl)phosphine and 2.0 mL of toluene were added. Then, the mixture was stirred at 114% for 15 hours, and disappearance of compound 7-3 was confirmed by high performance liquid chromatography, and it was confirmed that the molecular weight of the polymer compound at peak top of SEC was $1.2 \times 10^5$ at this stage, confirming an increase in molecular weight by copolymerization. Then, 0.134 g (0.61 mmol) of 4-(4,4,5,5-tetramethyl-1,3,2-dioxaborolane-2-yl)toluene and 4.7 mL of toluene were added and, 0.78 mg (0.0009 mmol) of tris(dibenzylideneacetone)dipalladium, 2.35 mg (0.0067 mmol) of tris(2-methoxyphenyl)phosphine, 1.0 mL of toluene and 2.7 mL of a 33 wt % cesium carbonate aqueous solution were added and the mixture was stirred at 114° C. for 2 hours. After cooling down to room temperature, the aqueous layer of the reaction solution was removed from the organic layer, and the organic layer was dropped into 385 mL of methanol to obtain a precipitate which was then filtrated and dried, to obtain yellow solid. The above-described yellow solid was dissolved in tetrahydrofuran, and insoluble part was removed by filtration, the filtrate was concentrated and the solution was dropped into acetone to obtain a precipitate which was then filtrated and dried. This was dissolved in 119 mL of toluene, and the solution was subjected to column chromatography with silica gel and active alumina, and concentrated. The concentrated liquid was dropped into methanol, and the deposited precipitate was filtrated and dried, to obtain 1.03 g of solid. 1.03 g of the solid was dissolved in tetrahydrofuran and the solution was dropped into acetone to obtain a precipitate which was then filtrated and dried, and this series of operations were repeated twice, further, the solid was dissolved in toluene and the solution was dropped into methanol to obtain a precipitate which was then filtrated and dried, to obtain 0.89 g of the intended block copolymer 8. The polystyrene-reduced number average molecular weight and weight average molecular weight were $Mn=9.4 \times 10^4$ and $Mw=1.8 \times 10^5$, respectively. The results of the following NMR measurement showed that the molar ratio of the above-described divalent group 1, the above-described divalent group 3, the above-described divalent group 2 and the above-described divalent group 5 was 26:36:31:6. Therefore, block copolymer 8 was composed of four blocks: one containing the divalent group 1 as a constituent unit, one containing the divalent group 3 as a constituent unit, one containing the divalent group 2 as a constituent unit and one containing the divalent group 5 as a constituent unit, and the chemical formula weights of the divalent group 1, the divalent group 3, the divalent group 2 and the divalent group 5 are 438.7, 388.6, 327.4 and 313.4, respectively, thus, the block containing the divalent group 1 as a constituent unit had a number average polymerization degree of 56. the block containing the divalent group 3 as a constituent unit had a number average polymerization degree of 87, the block containing the divalent group 2 as a constituent unit had a number average polymerization degree of 89 and the block containing the divalent group 5 as a constituent unit had a number average polymerization degree of 15.

<NMR Measurement of Block Copolymer 8>

Block copolymer 8 was used to prepare a ca. 1% deuterated tetrahydrofuran solution and the solution was subjected to NMR measurement using Avance 600 nuclear magnetic resonance apparatus manufactured by Bruker at 30° C.

$^1$H-NMR of block Copolymer 8 was measured to find that chemical shift of a peak of proton represented by $H_{(14)}$ in the formula (Z5) showing the divalent group 1 on the $^1$H-NMR spectrum was 9.10 ppm.

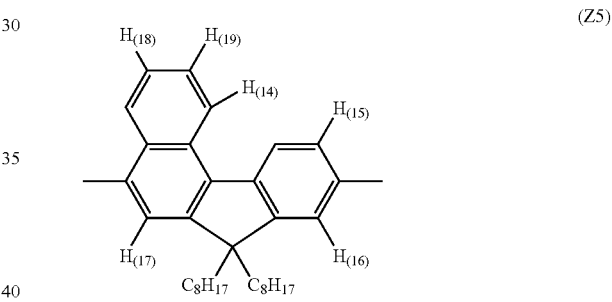

(Z5)

Chemical shifts of peaks of protons represented by $H_{(20)}$ and $H_{(21)}$ in the formula (Z6) showing the divalent group 2 on the $^1$H-NMR spectrum were 2.08 ppm and 1.30 ppm, respectively.

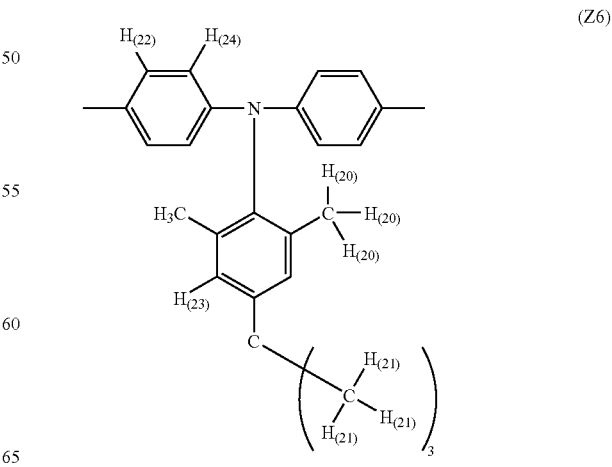

(Z6)

Chemical shift of a peak of proton represented by $H_{(25)}$ in the formula (Z7) showing the divalent group 5 on the $^1$H-NMR spectrum was 4.03 ppm.

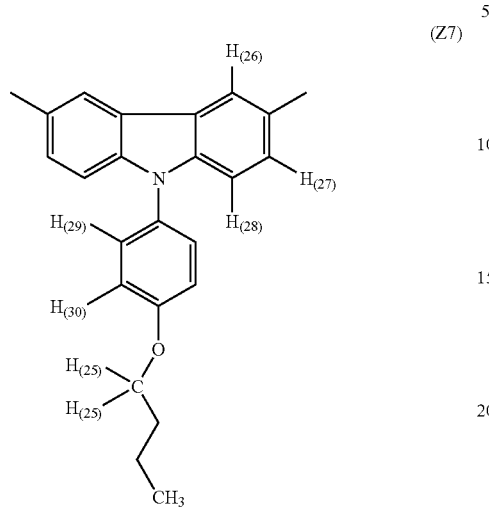

(Z7)

Integral intensities of peaks of $H_{(14)}$, $H_{(20)}$, $H_{(21)}$ and $H_{(25)}$ on the $^1$H-NMR spectrum were measured, and results standardized in view of the number or equivalent protons contained in one divalent group are shown in Table 2.

protons represented by $H_{(22)}$, $H_{(23)}$ and $H_{(24)}$ in the formula (Z6) and peaks of protons represented by $H_{(26)}$, $H_{(27)}$, $H_{(28)}$, $H_{(29)}$ and $H_{(30)}$ in the formula (Z7) were observed.

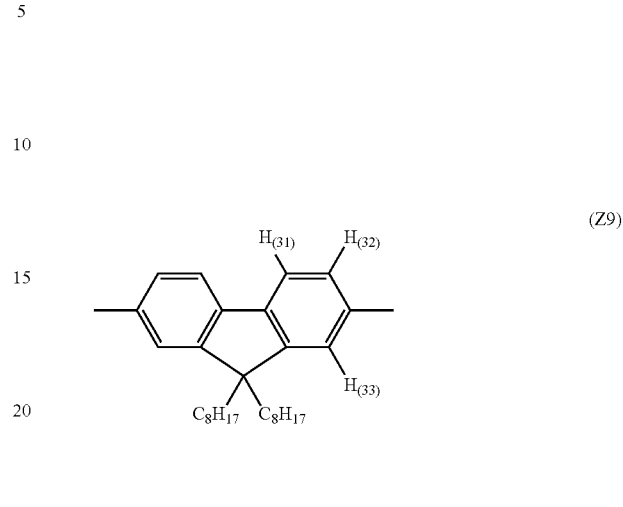

(Z9)

Integral intensities of protons $H_{(15)}$, $H_{(16)}$, $H_{(17)}$, $H_{(18)}$ and $H_{(19)}$, integral intensities of protons $H_{(22)}$, $H_{(23)}$ and $H_{(24)}$ and

TABLE 2

| Divalent group | $^1$H peak | Number of equivalent protons | Integral intensity | Standardized integral intensity | | |
|---|---|---|---|---|---|---|
| | | | | Calculation formula | Numerical value | Average |
| divalent group 1 | $H_{(14)}$ | 1 . . . (a14) | 1016.5 . . . (b14) | b14/a14 | 1016.5 | 1016.5 . . . (Y4) |
| divalent group 2 | $H_{(20)}$ | 6 . . . (a20) | 7338.9 . . . (b20) | b20/a20 | 1223.1 | 1200.5 . . . (Y5) |
| | $H_{(21)}$ | 9 . . . (a21) | 10600.5 . . . (b21) | b21/a21 | 1177.8 | |
| divalent group 5 | $H_{(25)}$ | 2 . . . (a25) | 489.4 . . . (b25) | b25/a25 | 244.7 | 244.7 . . . (Y6) |

Peaks of protons represented by $H_{(31)}$, $H_{(32)}$ and $H_{(33)}$ in the formula (Z9) showing divalent group 3 on the $^1$H-NMR spectrum were observed in a range of from 6.80 ppm to 8.07 ppm. Further, in this range, peaks of protons represented by $H_{(15)}$, $H_{(16)}$, $H_{(17)}$, $H_{(18)}$ and $H_{(19)}$ in the formula (Z5), peaks of integral intensities of protons $H_{(26)}$, $H_{(27)}$, $H_{(28)}$, $H_{(29)}$ and $H_{(30)}$, observed in a range of from 6.80 ppm to 8.07 ppm on the $^1$H-NMR spectrum, were calculated using the above-described Y4, Y5 and Y6, respectively, and the results thereof are shown in Table 3.

TABLE 3

| Divalent group | $^1$H peak | Number of proton | Standardized integral intensity | Integral intensity | |
|---|---|---|---|---|---|
| | | | | Calculation formula | Numerical value |
| divalent group 1 | $H_{(15)}$, $H_{(16)}$, $H_{(17)}$, $H_{(18)}$, $H_{(19)}$ | 5 . . . (a15_19) | 1016.5 . . . (Y4) | Y4 × a15_19 | 5082.6 . . . (b15_19) |
| divalent group 2 | $H_{(22)}$, $H_{(23)}$, $H_{(24)}$ | 10 . . . (a22_24) | 1200.5 . . . (Y5) | Y5 × a22_24 | 12004.9 . . . (b22_24) |
| divalent group 5 | $H_{(26)}$, $H_{(27)}$, $H_{(28)}$, $H_{(29)}$, $H_{(30)}$ | 8 . . . (a26_30) | 244.7 . . . (Y6) | Y6 × a26_30 | 1957.6 . . . (b26_30) |

The integral intensity of protons $H_{(31)}$, $H_{(32)}$ and $H_{(33)}$ was calculated to be 8442.7 . . . (b31__33) by subtracting the value (b15__19), (b22__24) and (b26__30) from 27487.6 which is the actual measurement value of the integral intensity from 6.80 ppm to 5.07 ppm on the 44-NMR, spectrum. Further, the standardized integral intensity (Y7) of protons $H_{(31)}$, $H_{(32)}$ and $H_{(33)}$ was calculated to be 1407.1 . . . (Y7) by dividing the value (b31__33) by 6 which is the number of protons of $H_{(31)}$, $H_{(32)}$ and $H_{(33)}$.

Based on the above-described facts, the molar ratio of four divalent groups constituting block copolymer 8 was found to be (divalent group 1):(divalent group 2):(divalent group 5): (divalent group 3)=formula (Z5):formula (Z6):formula (Z7): formula (Z9)=1016.5:1200.5 244.7:1407.1=26; 31:606, using standardized integral intensities Y4, Y5, Y6 and Y7.

INDUSTRIAL APPLICABILITY

The block copolymer of the present invention is useful as light emitting materials and charge transporting materials, and excellent in device performance. Wherefore, a polymer LED containing the block copolymer of the present invention can be used for curved or flat light sources for illumination or backlight of liquid crystal displays, and for segment type displays, dot matrix flat panel displays and the like. Further, it cart be used also as a polymer electrolyte film for fuel batteries, a photoelectric conversion material in solar batteries, and the like.

The invention claimed is:

1. A block copolymer consisting essentially of two or more of blocks of the following formula (1):

(1)

wherein in the formula (1), Ar represents a conjugative divalent group and represents the same divalent group in an identical block, and m represents a number of 1 or more showing the number average polymerization degree of Ar present in one block, at least two of a plurality of m's present in the copolymer represent a number of 5 or more, Ar's in adjacent two blocks in the copolymer are mutually different, and the copolymer has two Ar's when composed of 2 blocks of the formula (1), has two or more Ar's when composed of 3 blocks of the formula (1) and has four or more Ar's when composed of 4 or more blocks of the formula (1), and wherein Ar's in different blocks all represent different divalent groups.

2. The block copolymer according to claim 1, wherein the conjugative divalent group is a group of the following formula (2):

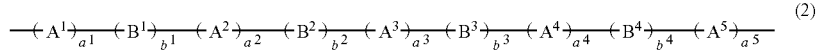
(2)

wherein in the formula (2), $A^1$, $A^2$, $A^3$, $A^4$ and $A^5$ represent each independently an optionally substituted arylene group or divalent heterocyclic group, $B^1$, $B^2$, $B^3$ and $B^4$ represent each independently —$BR^1$—, —$NR^2$—, —$SiR^3R^4$—, —$PR^5$—, —$CR^6$=N— or an optionally substituted vinylene group, R', $R^2$, $R^3$, $R^4$, $R^5$ and $R^6$ represent each independently a hydrogen atom or substituent, $a^1$, $a^2$, $a^3$, $a^4$ and $a^5$ represent each independently an integer of 0 to 3, satisfying $1 \leq a^1+a^2+a^3+a^4+a^5 \leq 15$, $b^1$, $b^2$, $b^3$ and $b^4$ represent each independently 0 or 1.

3. The block copolymer according to claim 1, wherein the group of the formula (2) is a group selected from the group consisting of the following formulae (C-1), (C-11), (C-15), (D-9), (D-10-1), (D-11), (D-13), (D-16), (D-17), (G-1), (G-2), (G-3) and (G-4):

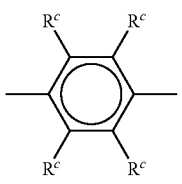
(C-1)

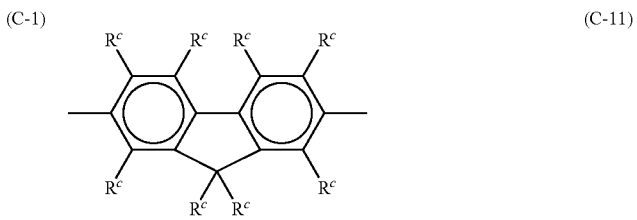
(C-11)

-continued
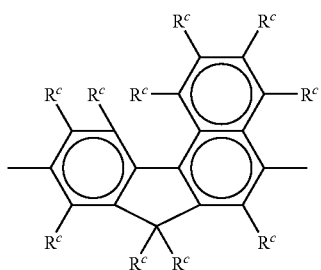 (C-15)
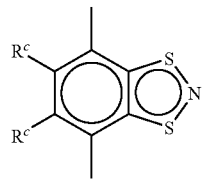 (D-9)
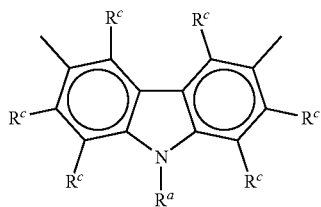 (D-10-1)
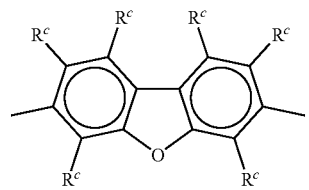 (D-11)
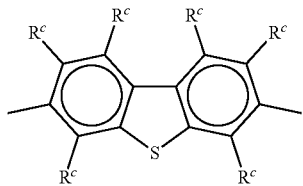 (D-13)
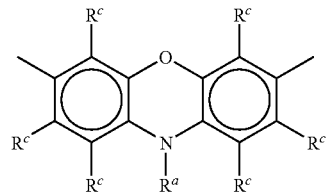 (D-16)
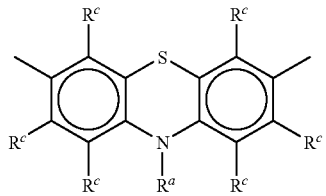 (D-17)
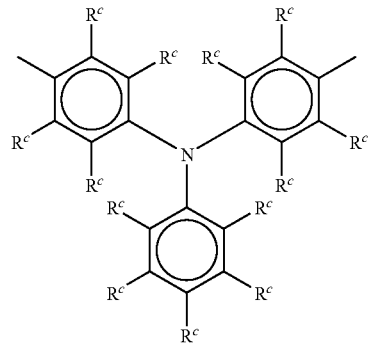 (G-1)
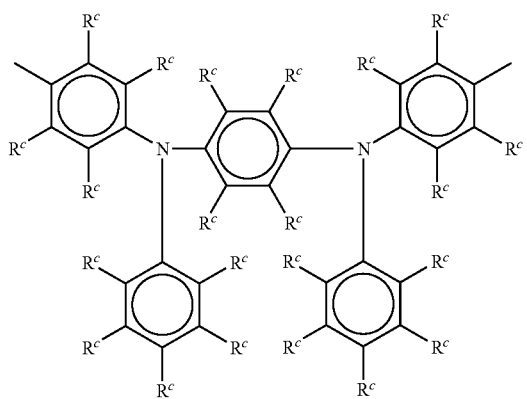 (G-2)

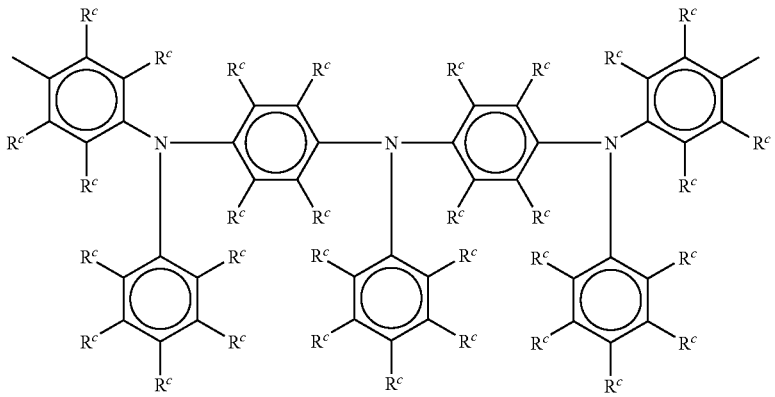

(G-3)

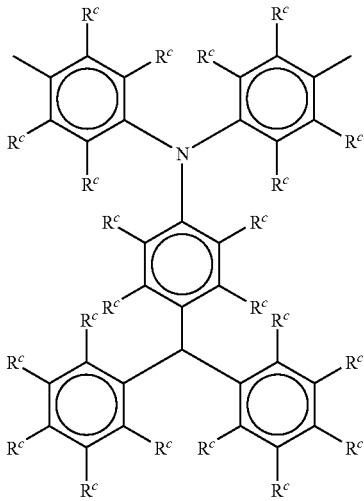

(G-4)

wherein in the formulae (C-1), (C-11), (C-15), (D-9), (D-10⁻¹), (D-11), (D-13), (D-16), (D-17), (G-1), (G-2), (G-3) and (G-4), $R^a$ and $R^C$ represent each independently a hydrogen atom or substituent, and a plurality of $R^C$'s may be the same or different.

4. The block copolymer according to claim 1, wherein at least two of a plurality of m's represent a number of 5 to $1 \times 10^4$.

5. The block copolymer according to claim 1, comprising 2 to 100 blocks of the formula (1).

6. The block copolymer according to claim 1, represented by the following formula (5):

single bond giving a cyclic structure including mutual connection of two ends $m^1$, $m^2$, $m^3$, $m^4$, $m^5$, $m^6$, $m^7$, $m^8$, $m^9$ and $m^{10}$ of the block copolymer, represent each independently a number of 0 or more showing the number average polymerization degree of $Ar^1$, $Ar^2$, $Ar^3$, $Ar^4$, $Ar^5$, $Ar^6$, $Ar^7$, $Ar^8$, $Ar^9$ and $Ar^{10}$, respectively, and at least two of $m^1$, $m^2$, $m^3$, $m^4$, $m^5$, $m^6$, $m^7$, $m^8$, $m^9$ and $m^{10}$ represent a number of 5 or more, in the case of $m^1=5$ and $m^2=5$ and $m^3=m^4=m^5=m^6=m^7=m^8=m^9=m^{10}=0$, $Ar^1$ and $Ar^2$ represent mutually different divalent groups, when $m^1$, $m^2$ and $m^3$ represent a number of 1 or more and at least two of $m^1$, $m^2$ and $m^3$ are numbers of 5 or more and

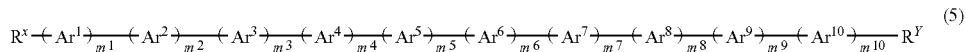

(5)

wherein in the formula (5), $Ar^1$, $Ar^2$, $Ar^3$, $Ar^4$, $Ar^5$, $Ar^6$, $Ar^7$, $Ar^8$, $Ar^9$ and $Ar^{10}$ represent each independently a conjugative divalent group and represent the same divalent group in an identical block, and these divalent groups in adjacent two blocks are mutually different, $R^X$ and $R^Y$ represent each independently an end group, alternatively, $R^X$ and $R^Y$ form one $m^4=m^5=m^6=m^7=m^8=m^9=m^{10}=0$, then, $Ar^1$ and $Ar^2$ represent mutually different divalent groups, $Ar^2$ and $Ar^3$ represent mutually different divalent groups and $Ar^1$ and $Ar^3$ may be mutually the same or different, when at least four of $m^1$, $m^2$ and $m^3$, $m^4$, $m^5$, $m^6$, $m^7$, $m^8$, $m^9$ and $m^{10}$ represent a number of 1 or and at least two of them represent a number of 5 or more, then, $Ar^1, Ar^2, Ar^3, Ar^4, Ar^5, Ar^6, Ar^7, Ar^8, Ar^9$ and $Ar^{10}$ represent four or more kinds of divalent groups.

7. The block copolymer according to claim 1, represented by the following formula (5-A):

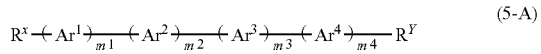
(5-A)

wherein in the formula (5-A), $Ar^1, Ar^2, Ar^3$ and $Ar^4$ represent each independently a conjugative divalent group and represent mutually different divalent groups, $R^X$ and $R^Y$ represent each independently an end group, alternatively $R^X$ and $R^Y$ form one single bond giving a cyclic structure including mutual connection of two ends of the block copolymer, $m^1$, $m^2$, $m^3$ and $m^4$ represent each independently a number of 1 or more showing the number average polymerization degree of $Ar^1, Ar^2, Ar^3$ and $Ar^4$, respectively, and at least two of $m^1$, $m^2$, $m^3$ and $m^4$ represent a number of 5 or more.

8. The block copolymer according to claim 7, wherein $Ar^1$ and $Ar^2$ represent each independently a divalent group of the formula (C-11) or (C-15) and $Ar^3$ and $Ar^4$ represent each independently a divalent group of the formula (D-10-1), (D-16), (G-1), (G-2), (G-3) or (G-4).

9. The block copolymer according to claim 1, represented by the following formula (6):

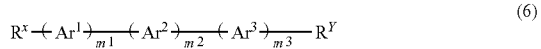
(6)

wherein in the formula (6), $Ar^1$, $Ar^2$ and $Ar^3$ represent each independently a conjugative divalent group, $Ar^1$ and $Ar^2$ are mutually different, $Ar^2$ and $Ar^3$ are mutually different and $Ar^1$ and $Ar^3$ may be mutually the same or different, $R^X$ and $R^Y$ represent each independently an end group, alternatively, $R^X$ and $R^Y$ form one single bond giving a cyclic structure including mutual connection of two ends of the block copolymer, $m^1$, $m^2$ and $m^3$ represent each independently a number of 1 or more showing the number average polymerization degree of $Ar^1$, $Ar^2$ and $Ar^3$, respectively, and at least two of $m^1$, $m^2$ and $m^3$ represent a number of 5 or more.

10. The block copolymer according to claim 9, wherein $Ar^1$ represents a divalent group of the formula (C-11) or (C-15) and $Ar^3$ represents a divalent group of the formula (D-10-1), (D-16), (G-1), (G-2), (G-3) or (G-4).

11. The block copolymer according to claim 1, represented by the following formula (7):

(7)

wherein in the formula (7), $Ar^1$ and $Ar^2$ represent each independently a conjugative divalent group, $Ar^1$ and $Ar^2$ are mutually different, and $R^X$ and $R^Y$ represent each independently an end group, alternatively, $R^X$ and $R^Y$ form one single bond giving a cyclic structure including mutual connection of two ends of the block copolymer, $m^1$ and $m^2$ represent each independently a number of 5 or more showing the number average polymerization degree of $Ar^1$ and $Ar^2$, respectively.

12. The block copolymer according to claim 11, wherein $Ar^1$ represents a divalent group of the formula (C-11) or (C-15) and $Ar^2$ represents a divalent group of the formula (D-10-1), (D-16), (G-1), (G-2), (G-3) or (G-4).

13. The block copolymer according to claim 1, obtained by condensation-polymerization of two or more kinds of monomers of the following general formula (b):

(b)

wherein in the formula (b), Ar represents the same divalent group as that represented by Ar in the formula (1), $X^1$ represents a halogen atom, sulphonate group of the formula (c) or methoxy group, $M^1$ represents a borate group, boric group, group of the formula (d), group of the formula (e) or group of the formula (f)

(c)

wherein in the formula (c), $R^P$ represents an optionally substituted alkyl group or aryl group,

(d)

(e)

wherein in the formulae (d) and (e), $X_A$ represents a halogen atom selected from the group consisting of a chlorine atom, bromine atom and iodine atom,

(f)

and wherein in the formula (f), $R^Q$, $R^R$ and $R^S$ represent each independently an alkyl group or aryl group.

14. The block copolymer according to claim 13, obtained by condensation-polymerization of two or more of monomers of the formula (b) in which $X^1$ represents a halogen atom or sulphonate group of the formula (c) and $M^1$ represents a borate group or boric group, in the coexistence of a palladium complex and a ligand.

15. The block copolymer according to claim 14, wherein the palladium complex is [tris(dibenzylideneacetone)]dipalladium or palladium acetate.

16. The block copolymer according to claim 14, wherein the ligand is tris(2-methylphenyl)phosphine or tris(2-methoxyphenyl)phosphine.

17. The block copolymer according to claim 1, wherein the polystyrene-reduced number average molecular weight is $1 \times 10^3$ to $1 \times 10^7$.

18. A polymer composition comprising at least one material selected from the group consisting of hole transporting materials, electron transporting materials and light emitting materials, and a block copolymer consisting essentially of two or more of blocks of the following formula (1):

(1)

wherein in the formula (1), Ar represents a conjugative divalent group and represents the same divalent group in an identical block, and m represents a number of 1 or more showing the number average polymerization degree of Ar present in one block, at least two of a plurality of m's present in the copolymer represent a number of 5 or more, Ar's in adjacent two blocks in the copolymer are mutually different, and the copolymer has two Ar's when composed of 2 blocks of the formula (1), has two or more Ar's when composed of 3 blocks of the formula (1) and has four or more Ar's when composed of 4 or more blocks of the formula (1).

19. A solution comprising a block copolymer consisting essentially of two or more of blocks of the following formula (1):

 (1)

wherein in the formula (1), Ar represents a conjugative divalent group and represents the same divalent group in an identical block, and m represents a number of 1 or more showing the number average polymerization degree of Ar present in one block, at least two of a plurality of m's present in the copolymer represent a number of 5 or more, Ar's in adjacent two blocks in the copolymer are mutually different, and the copolymer has two Ar's when composed of 2 blocks of the formula (1), has two or more Ar's when composed of 3 blocks of the formula (1) and has four or more Ar's when composed of 4 or more blocks of the formula (1).

20. A solution comprising a polymer composition comprising at least one material selected from the group consisting of hole transporting materials, electron transporting materials and light emitting materials, and a block copolymer consisting essentially of two or more of blocks of the following formula (1):

 (1)

wherein in the formula (1), Ar represents a conjugative divalent group and represents the same divalent group in an identical block, and m represents a number of 1 or more showing the number average polymerization degree of Ar present in one block, at least two of a plurality of m's present in the copolymer represent a number of 5 or more, Ar's in adjacent two blocks in the copolymer are mutually different, and the copolymer has two Ar's when composed of 2 blocks of the formula (1), has two or more Ar's when composed of 3 blocks of the formula (1) and has four or more Ar's when composed of 4 or more blocks of the formula (1).

21. The solution according to claim 19, comprising two or more organic solvents.

22. The solution according to claim 19, having a viscosity of 1 to 20 mPa·s at 25° C.

23. A light emitting thin film consisting essentially of a block copolymer comprising two or more of blocks of the following formula (1):

 (1)

wherein in the formula (1), Ar represents a conjugative divalent group and represents the same divalent group in an identical block, and m represents a number of 1 or more showing the number average polymerization degree of Ar present in one block, at least two of a plurality of m's present in the copolymer represent a number of 5 or more, Ar's in adjacent two blocks in the copolymer are mutually different, and the copolymer has two Ar's when composed of 2 blocks of the formula (1), has two or more Ar's when composed of 3 blocks of the formula (1) and has four or more Ar's when composed of 4 or more blocks of the formula (1).

24. The light emitting thin film according to claim 23, wherein the fluorescence quantum yield is 50% or more.

25. An electric conductive film comprising a block copolymer consisting essentially of two or more of blocks of the following formula (1):

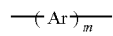 (1)

wherein in the formula (1), Ar represents a conjugative divalent group and represents the same divalent group in an identical block, and m represents a number of 1 or more showing the number average polymerization degree of Ar present in one block, at least two of a plurality of m's present in the copolymer represent a number of 5 or more, Ar's in adjacent two blocks in the copolymer are mutually different, and the copolymer has two Ar's when composed of 2 blocks of the formula (1), has two or more Ar's when composed of 3 blocks of the formula (1) and has four or more Ar's when composed of 4 or more blocks of the formula (1).

26. An organic semiconductor thin film consisting essentially of a block copolymer comprising two or more of blocks of the following formula (1):

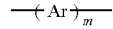 (1)

wherein in the formula (1), Ar represents a conjugative divalent group and represents the same divalent group in an identical block, and m represents a number of 1 or more showing the number average polymerization degree of Ar present in one block, at least two of a plurality of m's present in the copolymer represent a number of 5 or more, Ar's in adjacent two blocks in the copolymer are mutually different, and the copolymer has two Ar's when composed of 2 blocks of the formula (1), has two or more Ar's when composed of 3 blocks of the formula (1) and has four or more Ar's when composed of 4 or more blocks of the formula (1).

27. An organic transistor having an organic semiconductor thin film consisting essentially of a block copolymer comprising two or more of blocks of the following formula (1):

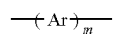 (1)

wherein in the formula (1), Ar represents a conjugative divalent group and represents the same divalent group in an identical block, and m represents a number of 1 or more showing the number average polymerization degree of Ar present in one block, at least two of a plurality of m's present in the copolymer represent a number of 5 or more, Ar's in adjacent two blocks in the copolymer are mutually different, and the copolymer has two Ar's when composed of 2 blocks of the formula (1), has two or more Ar's when composed of 3 blocks of the formula (1) and has four or more Ar's when composed of 4 or more blocks of the formula (1).

28. A method of forming a thin film comprising a block copolymer consisting essentially of two or more of blocks of the following formula (1):

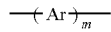 (1)

wherein in the formula (1), Ar represents a conjugative divalent group and represents the same divalent group in an identical block, and m represents a number of 1 or more showing the number average polymerization degree of Ar present in one block, at least two of a plurality of m's present in the copolymer represent a number of 5 or more, Ar's in adjacent two blocks in the copolymer are mutually different, and the copolymer has two Ar's when composed of 2 blocks of the formula (1), has two or more Ar's when composed of 3 blocks of the formula (1) and has four or more Ar's when composed of 4 or more blocks of the formula (1), using an inkjet method.

29. A polymer light emitting device having an organic layer between electrodes composed of an anode and a cathode wherein the organic layer comprises a block copolymer consisting essentially of two or more of blocks of the following formula (1):

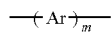 (1)

wherein in the formula (1), Ar represents a conjugative divalent group and represents the same divalent group in an identical block, and m represents a number of 1 or more showing the number average polymerization degree of Ar present in one block, at least two of a plurality of m's present in the copolymer represent a number of 5 or more, Ar's in adjacent two blocks in the copolymer are mutually different, and the copolymer has two Ar's when composed of 2 blocks of the formula (1), has two or more Ar's when composed of 3 blocks of the formula (1) and has four or more Ar's when composed of 4 or more blocks of the formula (1).

30. The polymer light emitting device according to claim 29, wherein said organic layer is a light emitting layer.

31. The polymer light emitting device according to claim 30, wherein said light emitting layer further comprises a hole transporting material, electron transporting material or light emitting material.

32. The polymer light emitting device according to claim 29 having a light emitting layer and a charge transporting layer between electrodes composed of an anode and a cathode wherein the charge transporting layer comprises the block copolymer.

33. The polymer light emitting device according to claim 29 having a light emitting layer and a charge transporting layer between electrodes composed of an anode and a cathode and having a charge injection layer between the charge transporting layer and the electrode wherein the charge injection layer comprises the block copolymer.

34. A sheet light source comprising a polymer light emitting device having an organic layer between electrodes composed of an anode and a cathode wherein the organic layer comprises a block copolymer consisting essentially of two or more of blocks of the following formula (1):

 (1)

wherein in the formula (1), Ar represents a conjugative divalent group and represents the same divalent group in an identical block, and m represents a number of 1 or more showing the number average polymerization degree of Ar present in one block, at least two of a plurality of m's present in the copolymer represent a number of 5 or more, Ar's in adjacent two blocks in the copolymer are mutually different, and the copolymer has two Ar's when composed of 2 blocks of the formula (1), has two or more Ar's when composed of 3 blocks of the formula (1) and has four or more Ar's when composed of 4 or more blocks of the formula (1).

35. A segment display comprising a polymer light emitting device having an organic layer between electrodes composed of an anode and a cathode wherein the organic layer comprises a block copolymer consisting essentially of two or more of blocks of the following formula (1):

 (1)

wherein in the formula (1), Ar represents a conjugative divalent group and represents the same divalent group in an identical block, and m represents a number of 1 or more showing the number average polymerization degree of Ar present in one block, at least two of a plurality of m's present in the copolymer represent a number of 5 or more, Ar's in adjacent two blocks in the copolymer are mutually different, and the copolymer has two Ar's when composed of 2 blocks of the formula (1), has two or more Ar's when composed of 3 blocks of the formula (1) and has four or more Ar's when composed of 4 or more blocks of the formula (1).

36. A dot matrix display comprising a polymer light emitting device having an organic layer between electrodes composed of an anode and a cathode wherein the organic layer comprises a block copolymer consisting esstially of two or more of blocks of the following formula (1):

 (1)

wherein in the formula (1), Ar represents a conjugative divalent group and represents the same divalent group in an identical block, and m represents a number of 1 or more showing the number average polymerization degree of Ar present in one block, at least two of a plurality of m's present in the copolymer represent a number of 5 or more, Ar's in adjacent two blocks in the copolymer are mutually different, and the copolymer has two Ar's when composed of 2 blocks of the formula (1), has two or more Ar's when composed of 3 blocks of the formula (1) and has four or more Ar's when composed of 4 or more blocks of the formula (1).

37. A liquid crystal display comprising a polymer light emitting device having an organic layer between electrodes composed of an anode and a cathode wherein the organic layer comprises a block copolymer consisting essentially of two or more of blocks of the following formula (1):

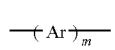
(1)

wherein in the formula (1), Ar represents a conjugative divalent group and represents the same divalent group in an identical block, and m represents a number of 1 or more showing the number average polymerization degree of Ar present in one block, at least two of a plurality of m's present in the copolymer represent a number of 5 or more, Ar's in adjacent two blocks in the copolymer are mutually different, and the copolymer has two Ar's when composed of 2 blocks of the formula (1), has two or more Ar's when composed of 3 blocks of the formula (1) and has four or more Ar's when composed of 4 or more blocks of the formula (1) as back light.

* * * * *